(12) United States Patent
Hill

(10) Patent No.: US 7,646,490 B2
(45) Date of Patent: Jan. 12, 2010

(54) APPARATUS AND METHOD FOR IN SITU AND EX SITU MEASUREMENT OF SPATIAL IMPULSE RESPONSE OF AN OPTICAL SYSTEM USING PHASE SHIFTING POINT-DIFFRACTION INTERFEROMETRY

(75) Inventor: Henry A. Hill, Tucson, AZ (US)

(73) Assignee: Zetetic Institute, Tucson, AZ (US)

( * ) Notice: Subject to any disclaimer, the term of this patent is extended or adjusted under 35 U.S.C. 154(b) by 341 days.

(21) Appl. No.: 11/881,141

(22) Filed: Jul. 25, 2007

(65) Prior Publication Data

US 2008/0030742 A1    Feb. 7, 2008

Related U.S. Application Data

(60) Provisional application No. 60/820,286, filed on Jul. 25, 2006.

(51) Int. Cl.
*G01B 9/02* (2006.01)
*G01B 11/02* (2006.01)

(52) U.S. Cl. .................................................. 356/511

(58) Field of Classification Search ............ 356/521, 356/511, 512, 489, 495
See application file for complete search history.

(56) References Cited

U.S. PATENT DOCUMENTS 5,155,554 A * 10/1992 Schnable et al. ............ 356/495
5,757,493 A * 5/1998 VanKerkhove ............... 356/511
6,614,516 B2 * 9/2003 Epstein et al. ............... 356/124
6,801,310 B2 * 10/2004 Kewitsch et al. ............ 356/328
2007/0052975 A1 * 3/2007 Schreiber et al. ............ 356/614

* cited by examiner

*Primary Examiner*—Patrick J Connolly
(74) *Attorney, Agent, or Firm*—Wilmer Cutler Pickering Hale & Dorr LLP.

(57) ABSTRACT

A test object including: an arrangement of optical elements defining a first partially reflecting surface and a second partially reflecting surface, at least one of the first and second partially reflecting surfaces being curved, wherein the first partially reflecting surface is arranged to receive a substantially collimated input beam and produce therefrom a first transmitted beam that passes on to the second partially reflecting surface, wherein the second partially reflecting surface is arranged to receive the first transmitted beam from the first partially reflecting surface and produce a collimated second transmitted beam and a first reflected beam therefrom, wherein the first partially reflecting surface is arranged to receive the first reflected beam and produce a second reflected beam therefrom, and wherein the first and second reflecting surfaces are configured to cause the second reflecting beam to converge onto a spot on a back surface to produce a diverging beam traveling in the same direction as the collimated output beam.

27 Claims, 24 Drawing Sheets

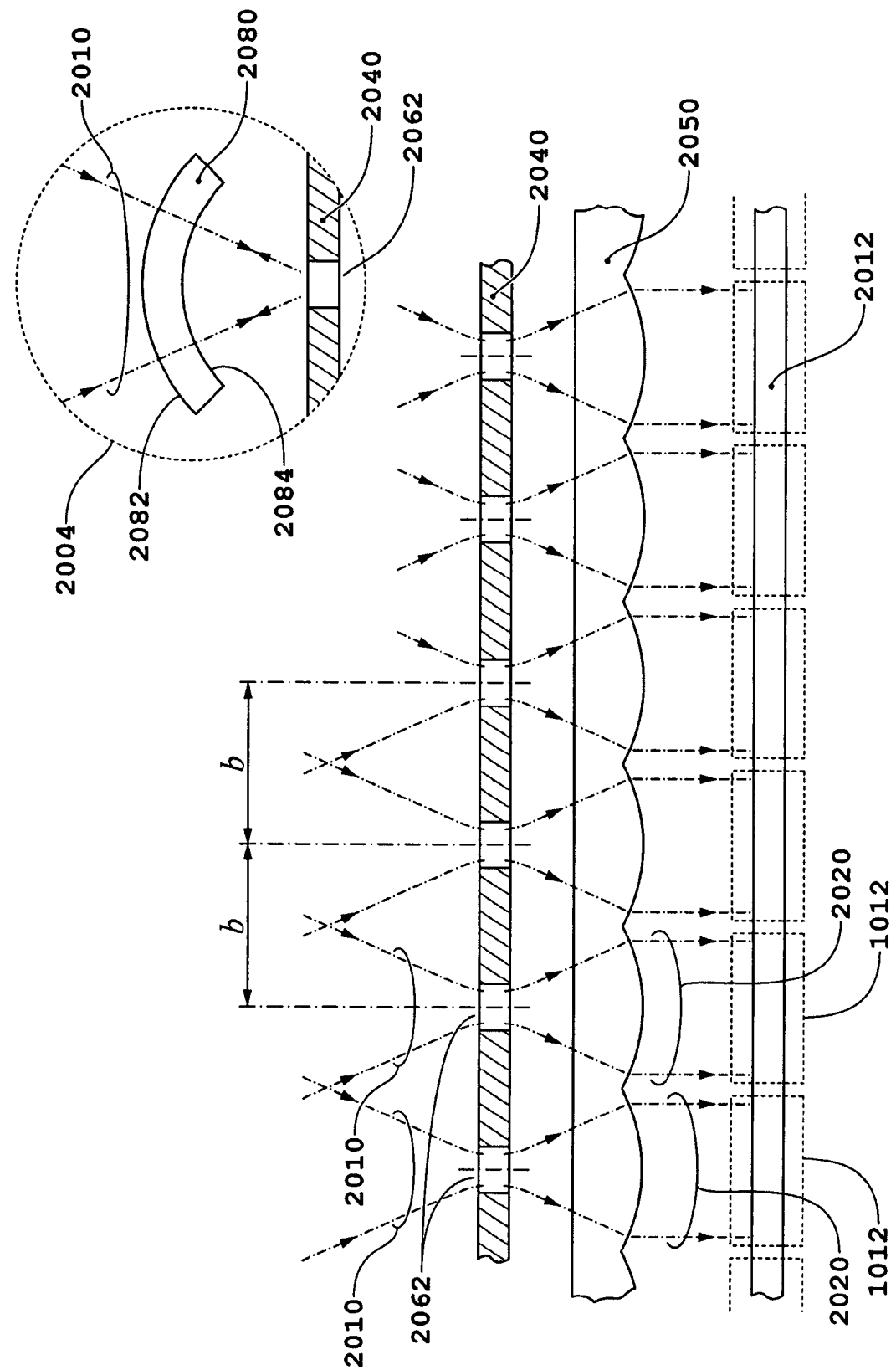

APPARATUS AND METHOD FOR IN SITU AND EX SITU MEASUREMENT OF SPATIAL IMPULSE RESPONSE OF AN OPTICAL SYSTEM USING PHASE SHIFTING POINT-DIFFRACTION INTERFEROMETRY

This application claims the benefit of U.S. Provisional Application No. 60/820,286, filed Jul. 25, 2006, incorporated herein by reference.

TECHNICAL FIELD

The invention relates generally to point-diffraction interferometry and using point-diffraction interferometry to measure properties of an optical system.

BACKGROUND OF THE INVENTION

An optical system comprising one or more optical elements such as a projection lens system having a large number of lens elements, i.e. a PO, is used in optical photolithographic projection systems which are known as wafer steppers or as wafer step-and-scanners. Such projection systems are used, for example, for manufacturing integrated circuits, or ICs. In a photolithographic projection system, a mask pattern present in the mask is imaged a large number of times, each time on a different area (IC area) of the substrate by means of a PO with a projection beam having a wavelength of, for example, 365 nm in the UV range or 248 nm in the deep UV range.

One technique for measuring aberrations of an optical system is point-diffraction interferometry (PDI). The PDI is presented and described in articles by R. N. Smartt and J. Strong entitled "Point Diffraction Interferometer" *J. Opt. Soc. Amer.* 62, p 737 (1972) and by R. N. Smartt and W. H. Steel entitled "Theory And Application Of Point-Diffraction Interferometers," *Japan J. Applied Physics* 14, p 351 (1975) as an interferometer belonging to a class of interferometers that measures the variations of phase across a wavefront, is a common-path interferometer, and has the usual advantages of that class. The fringes are very stable against vibration and a white-light source can be used. Although not required for its coherence, a laser is a very useful source for the PDI since it overcomes the rather large loss of light therein. In such interferometers a coherent reference wave, usually a spherical or plane wave, is made to interfere with the wave being examined. The interference shows the variations of phase difference across the wavefronts as variations of the fringe position. The PDI produces its reference wave by diffraction of some of the light at a point discontinuity placed in the path of the beam that is being measured.

The wave being examined by a PDI is brought to a focus to produce an image, usually with aberrations, of a point source from which it came. An absorbing film placed in the focal plane has in it a diffracting point which can be either a small pinhole or a small opaque disk. The wave is transmitted through the film with reduced amplitude and, in addition, some light is diffracted by the diffracting point into a spherical wave. The usual adjustments of an interferometer are possible. A tilt can be produced between the wavefronts, in order to introduce straight fringes, by displacing the diffracting point laterally from the center of the image. A longitudinal displacement out of the focal plane introduces circular fringes.

The PDI is closely related to the phase-contrast test of Zernike in which a small diffraction disk introduces a $\pi/2$ phase shift between the corresponding diffracted and non-diffracted beams [see Section 8.5.1 entitled "Zernike Test and Its Relation to the Smartt Interferometer" in *Optical Shop Testing*, $2^{nd}$ Edition, D. Malacara, Ed., Wiley (1992)]. The test is used with no tilt and the $\pi/2$ phase shift increases the sensitivity to small phase variations by moving the position of zero phase away from the interference maximum. The Zernike phase-contrast test detects changes in an interferogram relative to an interferogram of an aberration free optical system.

The principle of the PDI has been applied to other forms of interferometers to obtain PDIs that are not common path interferometers such as described in U.S. Pat. No. 5,076,695 entitled "Interferometer" by Y. Ichihara and in U.S. Pat. No. 5,548,403 entitled "Phase Shifting Diffraction Interferometer" by G. E. Sommargren. Phase shifting (PS) is introduced in the PDI to create a phase-shifting point-diffraction interferometer (PS/PDI) such as described by Sommargren, supra, to enable the measurement of the interference signal component of the resulting interferograms.

In prior art PDI and PS/PDI, the primary measured quantity is related to the pupil or frequency response function of the optical system and the spatial impulse response or transmission function is not obtained or determined. As a consequence, measurements of the pupil function are made on a surface comprising an image of the pupil function which is displaced from an image plane of the optical system being measured. This feature of the prior art PDI and PS/PDI represents a disadvantage in applications where it is not practical to introduce the diffracting point and subsequent detection system of a PDI or PS/PDI in the image plane of the optical system.

Another disadvantage of PDI and PS/PDI as practiced in prior art is a weak signal because of the high absorption in the mask in order to obtain high fringe visibility.

Other methods used in prior art for detecting effects of certain aberrations of an optical system are based on an intra-field error map for the optical system as described in U.S. Pat. No. 6,906,780 entitled "Method And Apparatus For Self-Referenced Dynamic Step And Scan Intra-Field Lens Distortion" by A. Smith or based on the measurement of relative displacements of images of artifacts formed by an imaging system such as described in U.S. Pat. No. 6,963,390 B1 entitled "In-Situ Interferometer Arrangement" by A. H. Smith and R. O. Hunter, Jr.

A yet another method used in the prior art for detecting aberrations of an optical system comprises the steps of:

arranging a test object in the object plane of the optical system;

providing a resist layer in the image plane of the optical system;

imaging the test object by means of the optical system and an imaging beam;

developing the resist layer; and detecting ex situ the developed image by means of a scanning detection device having a resolution which may be comparable to or considerably larger than that of the optical system.

When the resolution of the scanning detection device is considerably larger than that of the optical system, the detection device allows observation of details which are considerably smaller than the details generated by the optical system.

The method of the prior art described above is known for example from EP 0 849 638 A2 by K. Kaise, T. Tsukakoshi, and T. Hayashi and U.S. Pat. No. 6,331,368 B2 by P. Dirksen and C. A. H. Juffermans relating to methods for measuring the in situ aberrations of the optical system in lithographic projection apparatuses.

Another method for the measurement of properties of a PO is described by P. Dirksen, J. J. M. Braat, A. J. E. M. Janssen, Ad Leeuwestein, T. Matsuyama, and T. Noda in a paper SPIE, 6254-34, San Jose, Feb. 22, 2006. The paper which is entitled "Aerial image based lens metrology for wafer steppers" discusses an alternative lens metrology method that is based on an aerial image measurement and compares the alternative lens metrology method to a method based on phase measurement interferometers.

The aim of a photolithographic projection system is to integrate an ever-increasing number of electronic components in an IC. To realize this, it is desirable to increase the surface area of an IC and to decrease the size of the components. For the optical system, this means that both the image field and the resolution must be increased so that increasingly smaller details, or line widths, can be imaged in a well-defined way in an increasingly larger image field. This requires an optical system which must comply with very stringent quality requirements. Despite the great care with which such an optical system has been designed and the great extent of accuracy with which the system is manufactured, such a system may still exhibit aberrations such as spherical aberration, coma, and astigmatism and flare which are not admissible for the envisaged application. In practice, a lithographic optical system is thus not an ideal, diffraction-limited system but an aberration and background-limited system.

The aberrations are dependent on the positions in the image field and are an important source of variations of the imaged line widths occurring across the image field. When novel techniques are used to enhance the resolving power or the resolution of a lithographic optical system, such as the use of phase-shifting masks as described in, for example, U.S. Pat. No. 5,217,831 or when applying an off-axis illumination as described in, for example, U.S. Pat. No. 5,367,404, the influence of the aberrations on the imaged line widths is still an important source of variation.

Moreover, the aberrations of the optical system are not constant with respect to time in modern lithographic. To minimize low-order aberrations, such as distortion, curvature of the field, astigmatism, coma, and spherical aberration, these systems comprise one or more movable lens elements. The wavelength of the projection beam or the height of the mask table may be adjustable for the same purpose. When these adjusting facilities are used, other aberrations may be introduced. Moreover, since the intensity of the projection beam must be as large as possible, a lithographic optical system is subject to aging over extended time periods so that the extent of the aberrations may change with respect to time.

The performance of the optical system has also been shown to be dependent on the amount of energy absorbed during the exposure of wafers and as a result varies over time periods as short as of the order of the time to expose a wafer. Such heating effects are described, for example, in the article entitled "Fine Tune Lens Heating Induced Focus Drift with Different Process and Illumination Settings" by Y. Cui, *Optical Lithography XIV*, C. J. Progler, Editor, Proceedings of SPIE Vol. 4346 (2001) and the article entitled "Correcting Lens Heating Induced Focus Error", *ASM Lithography-Application Bulletin* 4022-502-95041, p 2 (1996).

It has also been proposed to use for the projection beam a beam of extreme UV (EUV) radiation, i.e. radiation at a wavelength in the range of several nm to several tens of nm. The resolution of the optical system can thereby be enhanced considerably without increasing the numerical aperture (NA) of the system. Since no suitable lens material is available for EUV radiation, a mirror projection system instead of a lens projection system must then be used. A lithographic mirror optical system is described in, for example, EP 0 779 528 by D. M. Williamson. For reasons analogous to those for the lens projection system, there is a need for an accurate and reliable method of measuring in situ aberrations for this EUV mirror optical system as well.

The speed or throughput of a method used to measure in situ aberrations may also limit the utility of the method. Low throughputs are generally associated with methods based on the ex situ measurement of developed images of a test mask formed in the resist layer. Also low throughput is associated with ex situ measurements when the developed image is scanned with a scanning detection device, e.g. a SEM such as described in an article entitled "Application Of The Aberration Ring Test (ARTEMIS™) To Determine Lens Quality And Predict Its Lithographic Performance" by M. Moers, H. van der Laan, M. Zellenrath, Wim de Boeij, N. Beaudry, K. D. Cummings, A. van Zwol, A. Becht, and R. Willekers in *Optical Microlithography XIV*, C. J. Progler, Ed., Proceedings of SPIE Vol. 4346 (2001),p 1379 and in cited U.S. Pat. No. 6,331,368 B2.

In cited EP 0 849 638, it is proposed to detect ex situ the developed image with optical means to address the laborious work otherwise required by technology that uses a complicated microscope such as a SEM. To this end, a test mask having one or more patterns of strips which are alternately radiation-transmissive and radiation-obstructive, i.e. an amplitude structure, is used. The comatic aberration of a projection system can be detected with such a pattern. The detection is based on measuring the widths of the light or dark strips in the image formed and/or measuring the asymmetry between the strips at the ends of the image of the patterns.

In prior art wherein measurements are made of developed images, it must be recognized that the development of "latent images" in resist is a highly nonlinear process which can limit the utility of a method based on ex situ measurement of in situ aberrations. In particular, the nonlinear process converts three-dimensional topographic information contained in a latent image in undeveloped resist into two-dimensional shapes in developed resist in the plane of the wafer.

It is evident from the considerations above that there is an increasing need for a reliable and accurate method with a high throughput for in situ and ex-situ measurement of in situ spatial impulse response function, changes in optic axis location, and image plane location of the imaging system over short and long time periods.

SUMMARY OF THE INVENTION

Various embodiments of the present invention generate in situ and ex situ measurements of spatial impulse response functions for one or more isoplanatic regions of an optical system. The measurements of the spatial impulse response functions are based on the adaptation of PS/PDI to making measurements of interference signals in an image plane of the optical system. The spatial impulse response function is the response of the optical system between conjugate object and image surfaces with a delta function source. Certain embodiments of the present invention include in situ and ex situ measurement of changes in optic axis location of the optical system in addition to measurement of a conjugate image plane location.

In contrast to prior art PS/PDI techniques, certain embodiments of the present invention use a diffraction point placed in the object plane of an optical system under test in conjunction with a homodyne detection method to generate in situ topographic interference signals that are related to the spatial impulse response functions of one or more isoplanatic regions, changes in optic axis location, and conjugate image plane location of the optical system. The function of the optical system in those embodiments is that of reference and/or measurement beam paths of an interferometer with either a detector such as a photon detector, e.g., a CCD, or exposure induced changes in properties of a recording medium, e.g. a photoresist, photorefractive medium or a photographic medium, serving as the detector. Measurement beams are generated by a test object comprising the diffraction point. The test object may also serve as a beam-splitter to generate both a reference and measurement beams in the interferometer. The source of the beam for the interferometer may be the same source used by a corresponding lithographic projection system in writing to wafers, e.g., an optical beam, an e-beam or an ion beam, or a different source compatible with operation of the optical system where appropriate test objects can be generated.

Continuing with the description of those various embodiments, reference and measurement beams are generated such that the complex amplitude of the reference beam at the image plane of the optical system is not sensitive to the aberrations and displacements of the optic axis of the optical system while the complex amplitude of the image of a test object subsequently formed from the measurement beam by the optical system is sensitive to the aberrations, image plane location, and displacements of the optic axis of the optical system. The topographic interference signal is generated by a detector either as an electrical interference signal or in one or more properties of a recording medium as a result of exposure induced changes in the recording medium that is substantially linear over a useful domain of the amplitude of the components of the spatial impulse response function including the effects of conjugate image plane location and displacements of the optic axis of the optical system.

Conjugated quadratures of the effects of the in situ spatial impulse response function, a conjugate image plane location, and changes in optic axis location are obtained from in situ or ex situ measurement of the topographic interference signal. The changes in properties produced by exposure induced changes in a recording medium corresponding to the topographic interference signal are measured either in situ or ex situ by an interferometric technique or ex situ by techniques such as an AFM or an SEM.

Certain embodiments of the present invention exhibit enhanced sensitivity with respect to measurement of spatial impulse response function, conjugate image plane location, and changes in optic axis location with elimination of effects of cross terms generated in the detection process such as in the recording medium between effects of aberrations, conjugate image plane location, and displacements of the optic axis. The enhancement is a consequence of the use of an interferometric technique in the generation of the topographic interference signal.

The topographic interference signal in a recording medium is generated by exposure induced changes of chemical composition through induced chemical reactions with corresponding changes in refractive index, density and/or thickness of photoresist (resist) or photographic medium with or without post exposure treatment and by exposure induced changes in charge distributions in photorefractive media which in turn alters the refractive index by virtue of the (Pockels) electro-optic effect, i.e. the photorefractive effect. The topographic interference signals recorded in a recording medium are measured using interferometric metrology systems and interferometric imaging metrology systems operating in the IR to VUV and EUV and the use of measured properties of the fields reflected/scattered by the patterns may be augmented with results of inversion analyses.

Also certain of the embodiments of the present invention relating to effects of spatial impulse response function, conjugate image plane location, and changes in optic axis location have enhanced sensitivity by the use of an anti-reflecting (AR) overcoat layer so as to make it possible to interferometrically detect changes in exposure induced changes in recording media operating in a dark field mode. In certain other of the embodiments of the present invention, fluorescent screens or arrays of fluorescent spots are used in the detection of beams, e.g., UV, VUV, as EUV beams, such as described in U.S. Provisional Patent Application No. 60/506,715 (ZI-56) and U.S. patent application Ser. No. 11/231,544 (ZI-56) wherein both are to Henry A. Hill and entitled "Catoptric Imaging Systems Comprising Pellicle and/or Aperture-Array Beam-Splitters and Non-Adaptive and/or Adaptive Catoptric Surfaces." The contents of the provisional patent application and the patent application are herein incorporated in their entirety by reference.

Bleaching or changes of the imaginary part of the refractive index, changes in the real part of the refractive index, changes in the density, and changes in the thickness of a resist layer on exposure are well known phenomena which occur in many resists such as described in articles by A. Erdmann, C. Henderson, and C. G. Willson, *J. Appl. Phys.* 89, p 8163 (2001) entitled "Impact of exposure induced refractive index changes of photoresists on the photolithographic process," by H.-K. Oh, Y.-S. Sohn, M.-G. Sung, Y.-M. Lee, E.-M. Lee, S.-H. Byun,I. An, K.-S. Lee, and I.-H. Park, *Advances in Resist Technology and Processing XVI*, Proceedings of SPIE 3678, p 643 (1999) entitled "Refractive Index Change during Exposure for 193 nm Chemically Amplified Resist," and by A. Kewitsch and A. Yariv, *Appl. Phys. Lett.* 68,p 455 (1996). Erdmann, Henderson, and Willson report for example that the change on exposure of the real part of the refractive index in a series of diazonaphthoquinone-novolac (DNQ-novolac) resists can be both positive and negative and could take on values as large as 0.05. Similar changes of the imaginary part of the refractive index on exposure of resist are also reported. Changes in the density are noted for example in the cited article by Kewitsch and Yariv and changes in the thickness of resist on exposure are described for example in cited article by H.-K. Oh et al.

Exposure induced changes in photorefractive media exhibit photoconductive and electro-optic behavior, and have the ability to detect and store spatial distributions of optical intensity in the form of spatial patterns of altered refractive index. Photoinduced charges create a space-charge distribution that produces an internal electric field, which, in turn, alters the refractive index by virtue of the (Pockels) electro-optic effect. The material can be brought back to its original state (erased) by illumination with uniform light, or by heating. Important photorefractive materials include barium titanate ($BaTiO_3$), bismuth silicon oxide ($Bi_{12}SiO_{20}$), lithium niobate ($LiNbO_3$), potassium niobate ($KNbO_3$), gallium arsenide (GaAs), and strontium barium niobate (SBN) [see Chapter 39 entitled "Photorefractive Materials And Devices" by M. Cronin-Golomb and M. Klein in *Handbook Of Optics II*, Ed., M. Bass (McGraw-Hill 1995)].

Certain embodiments of the present invention are distinct from prior art PDI and PS/PDI in that the primary measured quantity of the prior art is related to the pupil or frequency response function of the optical system and the complex spatial impulse response function is not obtained or determined as a primary quantity as in those embodiments.

Certain embodiments of the present invention are also distinct from prior art in that the techniques of linear displacement interferometry are used in those embodiments to obtain information about relative locations in three dimensions of patterns wherein the patterns are generated by exposure induced changes in refractive index, density, and/or thickness of resist on a wafer with or without post exposure treatment for changes in the optical system optic axis and aberration metrologies. Certain embodiments of the present invention are further distinct from prior art by measuring other properties of the amplitudes and phases, i.e. differential properties of conjugated quadratures, of fields reflected/scattered or transmitted/scattered by the patterns generated by exposure induced changes in refractive index, density and/or thickness of a recording medium on a wafer with or without post exposure treatment and inverting the measured other properties to obtain information about properties of the patterns in the recording medium on a wafer. The prior art measures only changes in shape of patterns, intensities, and/or ellipsometric properties of fields reflected and/or scattered by patterns in processed wafers and accordingly obtains information about aberrations, image plane location, and optic axis location of a optical system from properties of the measured intensities and/or ellipsometric properties in processed wafers.

The conjugated quadratures and differential conjugated quadratures are measured in certain embodiments of the present invention using interferometric techniques. Differential conjugated quadratures may be measured as a function of scattering angle in one or two dimensions, as a function of wavelength, and as a function of the polarization state of the measurement beam. The information about the relative location of a pattern generated by exposure induced changes in a recording medium with or without post exposure treatment may be with reference to a second pattern on the same interface layer of a wafer, to a second pattern on a different interface layer of the wafer, to a relative reference frame established by a simultaneous measurement of an array of conjugated quadratures corresponding to an array of sites on the wafer, or to a reference frame of a lithography stage metrology system.

Certain embodiments of the present invention are also distinct from prior art in that the different types of information about the conjugated quadratures may be obtained as joint measurements.

Certain embodiments of the present invention are also distinct from prior art in that a pattern, i.e. a pattern generated by exposure induced changes in a recording medium with or without post exposure treatment, that is being imaged may contain a single element or an array of elements wherein the number of elements is two or more. Accordingly, the size of the patterns used in the metrology systems comprising those embodiments can have areas of reduced sizes with linear dimensions of the order of $\lambda$ or larger.

Certain embodiments of the present invention are also distinct from prior art in that the patterns under measurement are scanned for the presence of defects that could introduce an error in the measurement of changes of the location of the optic axis, conjugate image plane location, and aberrations.

Certain embodiments of the present invention are also distinct from prior art in that the interferometric metrologies may use bi- or quad-homodyne detection techniques or variants thereof to obtain joint measurements of arrays of conjugated quadratures or differential conjugated quadratures of fields reflected/or scattered or transmitted/scattered by patterns and/or defects of a wafer and the elements of arrays of the conjugated quadratures or differential conjugated quadratures are measured simultaneously leading to advantages of reduced sensitivity to vibrations and to a high throughput.

Certain embodiments of the present invention are also distinct from prior art in that a recording medium is used that has a sensitivity that is periodic in one or two dimensions.

In addition, information about the properties of a feature in a pattern or a defect with respect to the real and complex components n and k, respectively, of the refractive index may be obtained with certain embodiments of the present invention using different polarization states and/or wavelengths of measurement beams in the interferometric metrologies.

The procedures used in various embodiments of the present invention may require general knowledge of the feature geometry of patterns generated by exposure induced changes in a recording medium with or without post exposure treatment and for certain of the metrologies knowledge of feature geometry of different process surfaces of wafers located below the recording medium. However, the procedures generally do not require detailed knowledge of the properties of the fields reflected/scattered or transmitted/scattered by the features of a reference or standard patterned wafer, e.g. angular distributions of reflected/scattered measurement beams or phase shifts introduced by reflections/scatterings or transmissions/scatterings of measurement beams, wherein the reference or standard wafer is one that meets requirements with respect to presence of defects.

UV, VUV, and EUV measurement beams can be used effectively in certain embodiments of the present invention for the different metrologies for the technology nodes of hp65 nm, hp45 nm, hp32 nm, and hp22 nm nodes as set out in the International Technology Roadmap for Semiconductors (ITRS), 2003 Edition.

Certain embodiments of the present invention are distinct from the metrologies described in commonly owned U.S. Provisional Patent Applications No. 60/568,774 (ZI-60) entitled "Apparatus And Methods For Measurement of Critical Dimensions Of Features And Detection Of Defects In UV, VUV, And EUV lithography Masks," No. 60/569,807 (ZI-61) entitled "Apparatus And Methods For Measurement Of Critical Dimensions Of Features And Detection Of Defects In UV, VUV, And EUV Lithography Masks," No. 60/573,196 (ZI-62) entitled "Apparatus And Methods For Overlay, Alignment Mark, And Critical Dimension Metrologies Based on Optical Interferometry," and No. 60/571,967 (ZI-63) entitled "Apparatus And Methods For Measurement Of Critical Dimensions Of Features And Detection Of Defects In UV, VUV, And EUV lithography Masks" and U.S. patent applications Ser. No. 11/135,605 (ZI-62) entitled "Apparatus And Methods For Overlay, Alignment Mark, And Critical Dimension Metrologies Based on Optical Interferometry" and Ser. No. 11/124,603 (ZI-63) entitled "Apparatus And Methods For Measurement Of Critical Dimensions Of Features And Detection Of Defects In UV, VUV, And EUV lithography Masks" wherein measurements are made of locations and properties of patterns or portions of patterns in processed wafers and not of topographic interference signals. Each of the four cited provisional applications and the two utility applications are by Henry A. Hill and the contents thereof are herein incorporated in the entirety by reference.

Certain embodiments of the present invention are further distinct from the metrologies described in cited U.S. Provisional Patent Applications No. 60/568,774 (ZI-60), No. 60/569,807 (ZI-61), No. 60/573,196 (ZI-62), and No. 60/571,967 (ZI-63) and U.S. patent applications Ser. No. 11/135,605 (ZI-62) and Ser. No. 11/124,603 (ZI-63) in that in those embodiments, the spatial impulse response function, changes in the optic axis location, and the conjugate image plane location of the optical system and in addition the changes in the spatial impulse response function, optic axis location, and the conjugate image plane location of the PO can be measured within a short period of time, e.g., 0.1 seconds and 1 second, after exposure of a respective site on a wafer and during the exposure cycle of the wafer.

Certain embodiments of the present invention are in addition distinct from the metrologies described in cited U.S. Provisional Patent Applications No. 60/568,774 (ZI-60), No. 60/569,807 (ZI-61), No. 60/573,196 (ZI-62), and No. 60/571,967 (ZI-63) and U.S. patent applications Ser. No. 11/135,605 (ZI-62) and Ser. No. 11/124,603 (ZI-63) in that in those embodiments, imaging properties such as the location of optic axis of an e-beam or ion-beam lithography tool can be measured and also imaging properties such as the location of the optic axis of the e-beam or ion-beam lithography tool can be measured within a short period of time, e.g., 0.1 seconds and 1 second, after exposure of a respective site on a wafer and during the exposure cycle of the wafer, and temporal changes in overlay errors can be measured during the exposure of a wafer using appropriate test objects.

Certain embodiments of the present invention are also distinct from the metrologies described in commonly owned U.S. Provisional Patent Applications No. 60/602,999 (ZI-64) entitled "Subnanometer Overlay, Critical Dimension, And Lithography Tool Projection Optic Metrology Systems Based On Measurement Of Exposure Induced changes In Photoresist on Wafers," No. 60/618,483 (ZI-65) entitled "Subnanometer Overlay, Critical Dimension, And Lithography Tool Projection Optic Metrology Systems Based On Measurement Of Exposure Induced changes In Photoresist on Wafers" and No. 60/624,707 (ZI-68) entitled "Sub-Nanometer Overlay, Critical Dimension, And Lithography Tool Projection Optic Metrology Systems Based On Measurement Of Exposure Induced Changes In Photoresist On Wafers" and U.S. patent application Ser. No. 11/208,424 (ZI-68) entitled "Sub-Nanometer Overlay, Critical Dimension, And Lithography Tool Projection Optic Metrology Systems Based On Measurement Of Exposure Induced Changes In Photoresist On Wafers" for which each are by Henry A. Hill and the contents thereof are herein incorporated in their entirety by reference. Certain embodiments of the present invention are distinct with respect to U.S. 60/602,999 (ZI-64), U.S. 60/618,483 (ZI-65), U.S. 60/624,707 (ZI-68) and U.S. Ser. No. 11/208,424 (ZI-68) with reference to the practice of using an interferometric technique to generate a topographic interference signal.

In general, in one aspect, the invention features a test object including: an arrangement of optical elements defining a first partially reflecting surface and a second partially reflecting surface, at least one of the first and second partially reflecting surfaces being curved, wherein the first partially reflecting surface is arranged to receive a substantially collimated input beam and produce therefrom a first transmitted beam that passes on to the second partially reflecting surface, wherein the second partially reflecting surface is arranged to receive the first transmitted beam from the first partially reflecting surface and produce a collimated second transmitted beam and a first reflected beam therefrom, wherein the first partially reflecting surface is arranged to receive the first reflected beam and produce a second reflected beam therefrom, and wherein the first and second reflecting surfaces are configured to cause the second reflecting beam to converge onto a spot on a back surface to produce a diverging beam traveling in the same direction as the collimated output beam.

In general, in another aspect, the invention features an interferometer including: a source for generating a source beam; an optical system; an optical element including a test object located in an object plane of the optical system, the test object including a diffraction point for generating from the source beam a measurement beam that passes through the optical system, wherein the optical element also generates from the source beam a reference beam that is combined with the measurement beam to generate an interference pattern in an image plane of the optical system, wherein the test object includes: an arrangement of optical elements defining a first partially reflecting surface and a second partially reflecting surface, at least one of the first and second partially reflecting surfaces being curved, wherein the first partially reflecting surface is arranged to receive a substantially collimated input beam and produce therefrom a first transmitted beam that passes on to the second partially reflecting surface, wherein the second partially reflecting surface is arranged to receive the first transmitted beam from the first partially reflecting surface and produce a collimated second transmitted beam and a first reflected beam therefrom, wherein the first partially reflecting surface is arranged to receive the first reflected beam and produce a second reflected beam therefrom, and wherein the first and second reflecting surfaces are configured to cause the second reflecting beam to converge onto a pinhole aperture on a back surface of the arrangement of optical elements to produce a diverging beam traveling in the same direction as the collimated output beam.

Other embodiments include one or more of the following features. The arrangement of optical elements includes a first optical element and a second optical element, wherein the first optical element defines the first partially reflecting surface and the second optical element defines the second partially reflecting surface. The first and second optical elements are aligned along an optical axis. The back surface is a back surface of the second optical element. The back surface includes a coating that defines a pinhole aperture and the spot onto which the second reflecting beam converges is located at the pinhole aperture. The second optical element is a lens, one surface of which defines the back surface and another surface of which defines the second partially reflecting surface. The second partially reflecting surface is curved. The first optical element is a lens and the first partially reflecting surface is a curved surface. Alternatively, the first optical element is a plate and the first partially reflecting surface is flat. The test object further includes transducers controlling a separation between the first and second optical elements. The pinhole aperture generates the diverging beam from the second beam that converges onto the spot. The test object further includes a negative lens next to the first optical element, wherein the negative lens produces the substantially collimated beam during use.

In general, in another aspect the invention features a source assembly including: a plate defining an aperture formed in a high reflectivity surface region; a curved lens aligned with the aperture to form a resonant cavity on one side of the plate; a collimating lens on a side of the plate that is opposite from the curved lens, the collimating lens for generating a collimated beam from a diverging beam emanating from the resonant cavity through the aperture during use; and a test object arranged to receive during use the collimated beam from the collimating lens and generate therefrom a collimated reference beam and a diverging measurement beam.

Other embodiments include one or more of the following features. In the source assembly during use the aperture receives a non-collimated beam of a preselected wavelength and the aperture has dimensions that are less than the preselected wavelength. The plate defines an array of apertures formed in high reflectivity surface regions. The assembly further includes: an array of curved lenses, each one aligned with a corresponding different aperture of the aperture array to form a corresponding resonant cavity on one side of the plate; an array of collimating lenses on the side of the plate that is opposite from the array of curved lenses, each collimating lens of the array of collimating lenses aligned with a different corresponding aperture of the array of apertures and for generating a corresponding collimated beam from light emanating from the resonant cavity through the corresponding aperture; an array of test objects, each of which is aligned with a different corresponding one of the collimating lenses of the array of collimating lenses and is arranged to receive the collimated beam from the corresponding collimating lens and generate therefrom a collimated reference beam and a diverging measurement beam.

An advantage of various embodiments of the present invention is the direct measurement of the spatial impulse response function of an optical system.

Another advantage of various embodiments of the present invention is an increase in information about properties of a optical system with respect to changes in optic axis location, image plane location, and spatial impulse response function through the use of interferometric techniques to generate a topographic interference signal that is related to effects of the spatial impulse response function, changes in optic axis location, and image plane location.

Another advantage of various embodiments of the present invention is an increased signal-to-noise ratio for measured quantities through the use of interferometric techniques to measure the conjugated quadratures and the differential conjugated quadratures.

Another advantage of various embodiments of the present invention is the use in measuring properties of an optical system wherein the exposure beam is an electromagnetic-beam, e-beam, or an ion-beam using appropriate test objects.

Another advantage of various embodiments of the present invention is reduced systematic errors in measured changes in location of an optic axis, spatial impulse response function, and conjugate image plane location.

Another advantage of various embodiments of the present invention is reduced statistical errors in measured changes in location of an optic axis, spatial impulse response function, and conjugate image plane location.

Another advantage of various embodiments of the present invention is the joint measurement of the conjugated quadratures and the differential conjugated quadratures.

Another advantage of various embodiments of the present invention is joint measurement of arrays of conjugated quadratures and differential conjugated quadratures that are each measured jointly.

Another advantage of various embodiments of the present invention is a reduced sensitivity of the measurement of the changes in location of an optic axis, spatial impulse response function, and conjugate image plane location to vibrations.

Another advantage of various embodiments of the present invention is a high throughput in measurement of changes in location of an optic axis, aberrations, and conjugate image plane location in defect detection of an optical system.

Another advantage of various embodiments of the present invention is the use of normal incidence and non-normal incidence measurement beams.

Another advantage of various embodiments of the present invention is that IR, visible, UV, VUV, and EUV measurement beams are used.

Another advantage of various embodiments of the present invention is the option to use a small site size of test objects in measurement of changes in the optic axis location, conjugate image plane location, and spatial impulse response function of an optical system, i.e., the site size may have linear dimensions of the order of $\lambda$ or larger.

Another advantage of various embodiments of the present invention is that measured errors in changes in the optic axis location, conjugate image plane location, and spatial impulse response function of an optical system can be used in APC.

Another advantage of various embodiments of the present invention is that changes in optic axis location, conjugate image plane location, and aberrations of an optical system of an optical system can be measured during an exposure cycle of an in process wafer with a minimal impact on throughput of a lithographic tool.

Another advantage of various embodiments of the present invention is that sub-wavelength defects in or on a photosensitive surface or a recording medium coated wafer can be detected.

Another advantage of various embodiments of the present invention is that the metrology systems can operate in both reflection and transmission modes.

Another advantage of various embodiments of the present invention is that the properties of optical system metrology systems are of the non-contact type.

Another advantage of various embodiments of the present invention is that the measurements for properties of optical system can be made with a large working distance.

BRIEF DESCRIPTION OF THE DRAWINGS

FIG. 3g is a diagram of a cross section of an array of test objects for non-collimated input beam components.

DETAILED DESCRIPTION

Figure 1A:
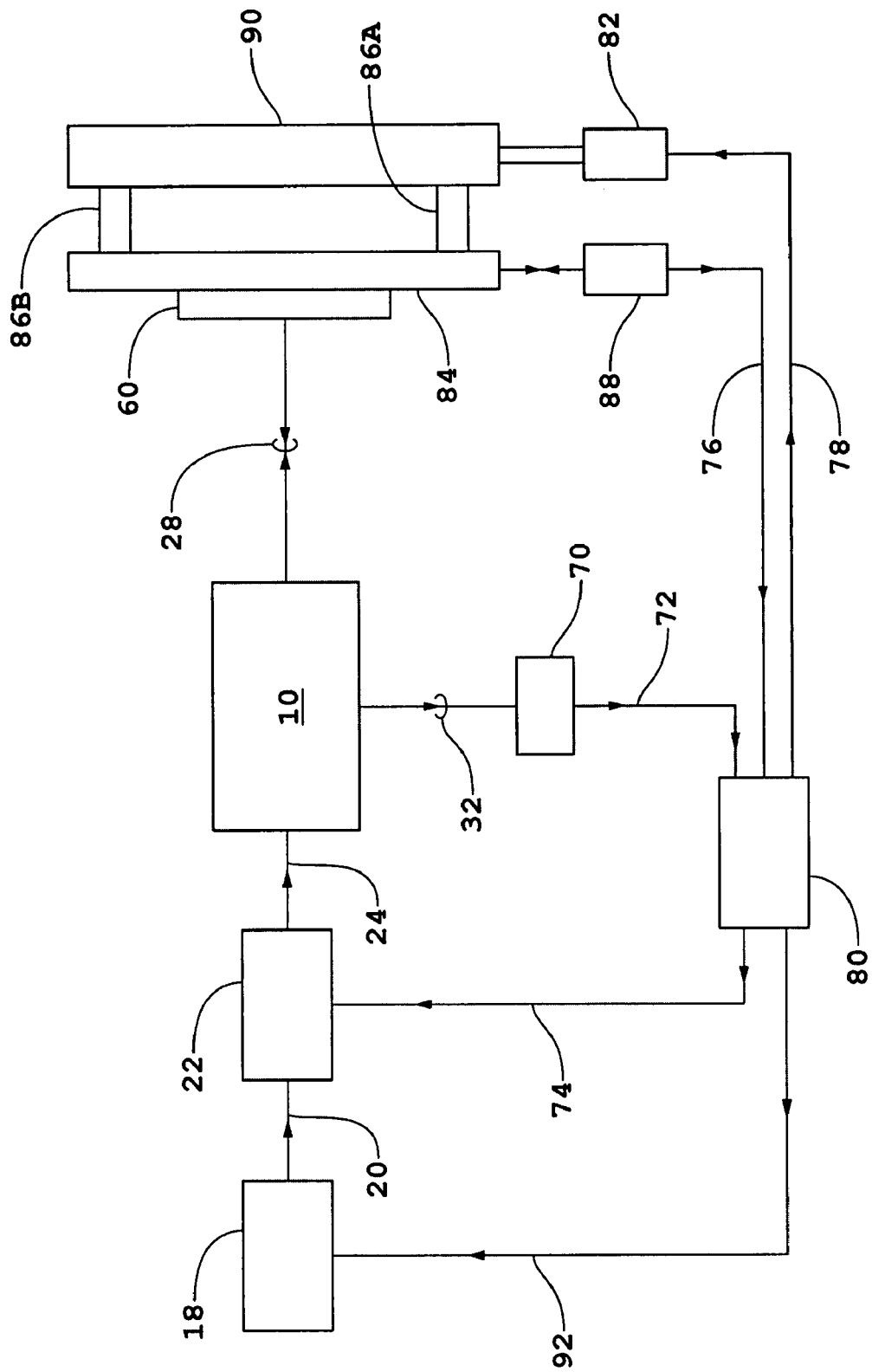
FIG. 1a is a diagram of an interferometric system.

The apparatus and methods used in embodiments of the present invention are described in terms of an optical beam of a lithographic projection optical system without departing from the scope and spirit of implementations of the present invention. The apparatus and methods of embodiments of the present invention use a PS/PDI or interferometric techniques with a homodyne detection method to generate a topographical interference signal that is related to the respective in situ spatial impulse response function, conjugate image plane location, and changes in optic axis location. The optical system is used in the apparatus and methods as the reference and/or measurement beam paths in an interferometer with a detector such as a photon detector or exposure induced changes in properties of a recording medium serving as the detector. The topographic interference signal is generated by imaging with the optical system an array of test objects comprising diffracting artifact/points onto a detector comprising a photosensitive surface of a photon detector or a recording medium layer to generate an array of images, e.g., undeveloped latent images, in a recording medium layer by exposure induced changes in properties of the recording medium layer. The test objects may serve in certain embodiments as beam-splitters in the generation of reference and measurement beams in the interferometer. The topographic interference signal is subsequently measured either as an electrical interference signal by the photon detector or by measuring certain of the changes in the properties of the recording medium with or without post exposure treatment.

In certain embodiments of the present invention, the test objects are constructed such that the optical beams that propagate from each of the test objects to the optical system to form images of the test objects may be represented by two corresponding beams. In the certain embodiments, one of the two corresponding beams has a wavefront structure such that the complex amplitude of the corresponding portion of the image produced by the optical system has a reduced sensitive to the spatial impulse response function, conjugate image plane location, and changes in optic axis location. The second of the two corresponding beams has a wavefront structure such that the complex amplitude of the corresponding portion of the image produced by the optical system is sensitive to the spatial impulse response function, conjugate image plane location, and changes in optic axis location.

The first corresponding beam wavefront structures of the optical beams propagating from each of the test objects are the same except for a set of relative phase shifts and the second corresponding beam wavefront structures of the optical beams propagating from each of the test objects are the same except for a different set of relative phase shifts. Corresponding first and second beams are used as the reference and measurement beams, respectively, generated by the test objects serving as a beam-splitter of an interferometer with the optical system functioning as reference and measurement beam paths of the interferometer. An example of the differences between corresponding phases of the set of relative phases and phases of the different set of relative phases are phases mod $\pi/2$. The result is a PS/PDI with the diffracting point located in the object space of the optical system.

In certain other of the test objects, the apparatus and method of a respective embodiment is configured such that the reference beam does not pass through certain portions of the optical system.

Test Objects for Measuring Spatial Impulse Response Functions, Conjugate Image Plane Location, and Changes in Optic Axis Location A test object may be constructed as an amplitude modulation mask, a phase shift mask, an attenuated phase shift mask, or a combination of two or more of these mask types. The effects of spatial impulse response functions, pupil functions, conjugate image plane location, and displacements of the optic axis are detected as a component or as components of the respective conjugated quadratures using a homodyne detection method. The measured effects of spatial impulse response function and conjugate image plane location may include effects of the exposure beam coherence $\sigma$ and the effects of aberrations of the condenser lens directing the exposure or imaging beam of a lithographic tool to the array of test objects.

The presence of defects may introduce errors in the subsequent measurements made for extracting the topographic interference signal wherein the defects may be for example in the form of either an error in the profile of an associated detector surface and/or an error in the form of a particle on the detector surface. Accordingly, measurements are made in certain embodiments of the present invention of a detector surface prior to either detection by a detector of a topographic interference signal or to exposure of the recording medium to the images of test objects so that either the surface is cleaned or effects of defects can be compensated in subsequent analysis of the topographic interferometric signal. Surfaces of the photon detector may be examined before use in generating a topographic interference signal.

The interferometric microscopy systems used to measure the topographic interferometric signals in a recording medium may comprise either an interferometric confocal or interferometric non-confocal microscopy system.

Embodiments of the interferometric systems of the present invention that generate topographic interference signals using a photon detector will first be described followed by descriptions of embodiments of the present invention that generate topographic interference signals in a recording medium wherein interferometric confocal microscopy systems and interferometric non-confocal microscopy systems of the present invention are used.

In embodiments of the interferometric metrology systems of the present invention that measure topographic interference signals in a recording medium, an imaging system may be used in the generation of measurement beams, in the imaging of a recording medium, and/or in the generation of reference beams. The imaging systems may be used in either a confocal configuration or a non-confocal configuration.

A description is first given for the general structure and fabrication of test objects followed by a general description of properties of the spatial impulse response function of an imaging system. The general description of the spatial impulse response function for an isoplanatic region will be followed by a description of procedures to obtain the spatial impulse response function from measured conjugated quadratures of topographic interference signals recorded either as an electrical interference signal or as exposure induced changes in a recording medium. These descriptions are followed by a description of procedures that may be used to obtain information about the location of a conjugate image plane location and changes in optic axis location from measured topographic interference signals.

Test Object Structure and Fabrication

Figure 3A:
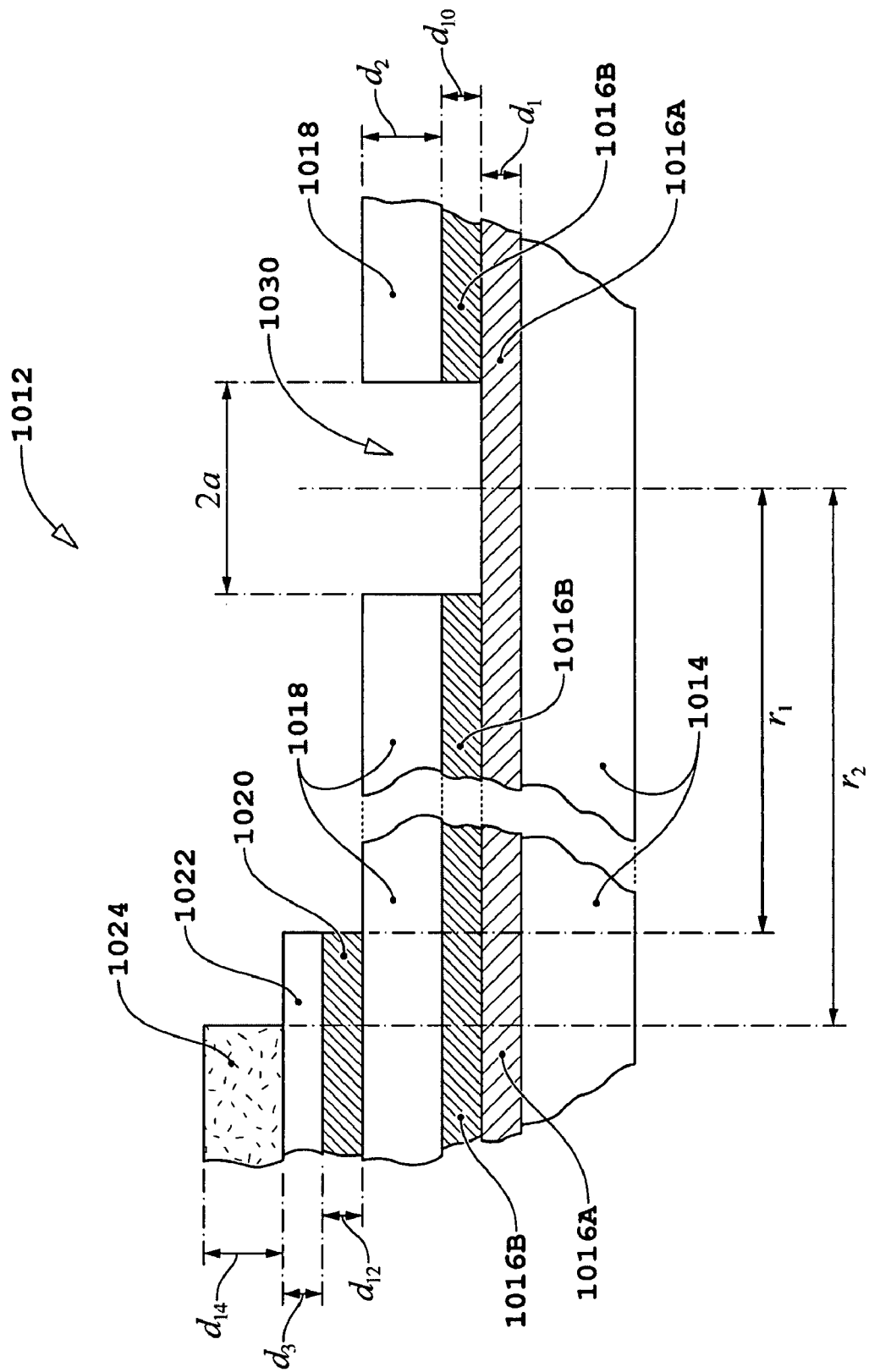
FIG. 3a is a diagram of a cross section of a test object.

A cross sectional view of a test object comprising a diffracting point for measuring spatial impulse response functions, conjugate image plane location, and changes in optic axis location is shown diagrammatically in FIG. 3a as element 1012. Test object 1012 shown in FIG. 3a serves as a beam-splitter and generates both the reference and measurement beams. The test object 2012 in FIG. 4h generates a measurement beam which has the same properties as the measurement beam generated by the test object 1012. A portion of beam 1420 is reflected by beam-splitter 2440 as reference beam 2430 (see FIG. 4h).

Test object 1012 shown in FIG. 3a comprises a transparent substrate 1014, absorbing layers 1016A, 1016B, and 1020, and non-absorbing phase shift layers 1018 and 1022. There is a third absorbing layer 1024 which defines the radial extent of test object 1012. The thicknesses phase shift layers 1018 and 1022 and absorbing layers 1016A, 1016B, 1020, and 1024 are $d_2$, $d_3$, $d_1$, $d_{10}$, $d_{12}$, and $d_{14}$, respectively. The refractive indices of substrate 1014 and phase shift layers 1018 and 1022 are $n_1$, $n_2$, and $n_3$, respectively. Test object 1012 shown herein in FIG. 3a is a variant of test object 1012 described in U.S. Provisional Patent Application No. 60/670,218 (ZI-66) entitled "In Situ And Ex Situ Measurement Of In Situ Lithographic Projection Optic Aberrations And Optic Axis Location" to Henry A. Hill of which the contents thereof are incorporated in their entirety by reference.

The amplitude of the beam transmitted by test object 1012 can be represented by the superposition of two beams using the principle of superposition of electromagnetic fields wherein one of the two beams corresponds to the beam that would be generated with aperture 1030 removed from test object 1012. For a plane wave incident on test object 1012, the first of the two beams will be a plane wave across the dimensions of the aperture indicated generally as element 1030. Aperture 1030 is a right circular cylinder with a cross section that may be for example a circle, square, or a slit (see FIGS. 3b and 3c). A dimension of aperture 1030 may be a subwavelength or larger than the wavelength of the beam in one or more directions depending upon the information that is being sought about the optical system. The second of the two beams will be a plane wave across the full aperture of test object 1012 except for the effects of apodizing at the edges of test object 1012. The amplitude of the first and second beams $A_1$ and $A_2$, respectively, across the dimensions of the aperture 1130 and across the full aperture of test object 1012 except for the effects of apodizing, respectively, at a surface near test object 1012 can be expressed as $$A_1 = \begin{cases} |A_0|[|T_1|^{1/2}e^{i\varphi_1} - |T_{10}|^{1/2}e^{i\varphi_2}], & 0 \leq r \leq a \\ 0, & r > a \end{cases} \quad (1)$$

$$A_2 = |A_0||T_{10}|^{1/2}e^{i\varphi_2}, \ 0 \leq r \leq r_1, \quad (2)$$

where $|A_0|$ is the magnitude of the amplitude of the plane wave incident on test object 1012; $\varphi_1$ is the phase shift generated by propagation a distance of $d_1$ through absorbing layer 1016A and $\varphi_2$ is the phase shift generated by propagation distances of $d_1$, $d_{10}$, and $d_2$ through absorbing layers 1016A, 1016B, and phase shift layer 1018, respectively; $T_1$ is the transmission coefficient of absorbing layer 1016A and $T_{10}$ is the transmission coefficient of absorbing layers 1016A, 1016B, and phase shift layer 1018.

Amplitude $A_1$ given by Eq. (1) of the first beam at a surface near test object 1012 may be written in terms of an amplitude $|A_0||\tilde{T}_1|^{1/2}$ and phase $\tilde{\varphi}_1$ as $$A_1 = |A_0|[|T_1|^{1/2}e^{i(\varphi_1-\varphi_2)/2} - |T_{10}|^{1/2}e^{-i(\varphi_1-\varphi_2)/2}] \quad (3)$$
$$e^{i(\varphi_1+\varphi_2)/2}, \ 0 \leq r \leq a,$$
$$= |A_0||\tilde{T}_1|^{1/2}e^{i\tilde{\varphi}_1}, \ 0 \leq r \leq a,$$

where $$\tilde{T}_1 = [T_1 + T_{10} - 2|T_1|^{1/2}|T_{10}|^{1/2}\cos(\varphi_1 - \varphi_2)], \quad (4)$$

$$\tilde{\varphi}_1 = \left(\frac{\varphi_1 + \varphi_2}{2}\right) + a\tan\left[\left(\frac{|T_1|^{1/2} + |T_{10}|^{1/2}}{|T_1|^{1/2} - |T_{10}|^{1/2}}\right)\tan\left(\frac{\varphi_1 - \varphi_2}{2}\right)\right]. \quad (5)$$

Phase difference $(\tilde{\varphi}_1-\varphi_2)$ is the relative phase of the first beam and the second beam which using Eq. (5) is expressed as $$\tilde{\varphi}_1 - \varphi_2 = \left(\frac{\varphi_1 - \varphi_2}{2}\right) + a\tan\left[\left(\frac{|T_1|^{1/2} + |T_{10}|^{1/2}}{|T_1|^{1/2} - |T_{10}|^{1/2}}\right)\tan\left(\frac{\varphi_1 - \varphi_2}{2}\right)\right]. \quad (6)$$

The first and second beams are subsequently used as the measurement and reference beams, respectively for the interferometer system comprising the optical system.

It will be evident to one skilled in the art that other constructions of the test object may be used in embodiments of the present invention without departing from the scope and spirit of implementations of embodiments of the present invention. In an example of an other construction, the magnitude of the amplitude of the transmission coefficient $|T_{10}|^{1/2}$ may be varied across the aperture that defines the second beam generated by test object 1012 in order to enhance the sensitivity of the topographic interference signal in regions where the spatial impulse response function of an optical system exhibits a relatively smaller value [see Eq. (9) and associated discussion].

Figure 3B:
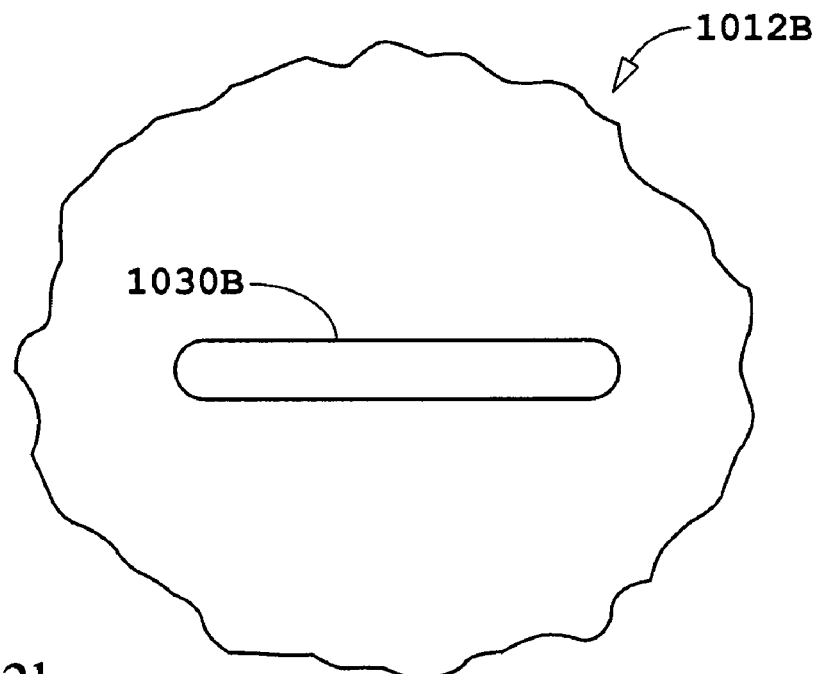
FIG. 3b is a diagram of a plan view of test object comprising an aperture in the form of a slit.
Figure 3C:
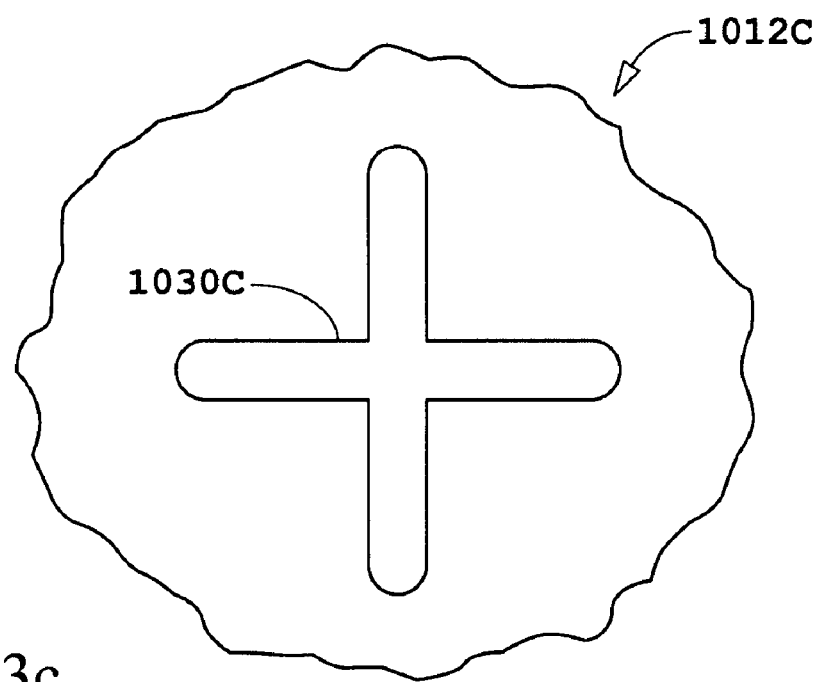
FIG. 3c is a diagram of a plan view of test object comprising an aperture in the form of two crossed slits.

Aperture 1030 is a right circular cylinder with a cross section that may be for example a circle, square, or a slit or portions thereof (see FIGS. 3b and 3c). FIG. 3b is a cross-section of a slit and FIG. 3c is a cross-section of a pair of slits oriented to form a cross.

Test object 1012 comprising an array of apertures will generate a topographic interference signal for a certain property of a spatial impulse response function of the optical system with an enhanced signal-to-noise ratio. However, the enhanced signal-to-noise ratio is achieved at the cost of losing information about the remaining properties of the spatial impulse response function of the optical system and at the cost of requiring a large number of different test objects to cover measurement of a corresponding set topographic interference signals comprising a large number properties or aberrations. A test object comprising an array of apertures can be used advantageously in an end use application when one or a small number of properties of an impulse response function of the optical system are monitored as a function of time or some system parameter.

Test Object Array: for Non-Collimated Input Beam Components

An array of apertures can also be used advantageously for an input beam comprising non-collimated beam components at the object plane of an imaging system under test such as shown diagrammatically in FIG. 3g. The collimated beam components are indicated as elements 2020 in FIG. 3g. For each collimated beam component, there is a corresponding aperture indicated as element number 2062 in array of apertures 2040, a microlens in microlens array 2050, and a test object 1012 in an array of test objects. Elements 2062 in the array of apertures 2040 formed in a plate are separated by a distance b (see FIG. 3g).

A microlens 2050 collimates the diverging beam from a corresponding aperture 2062. The description of a test object 1012 in FIG. 3g is the same as the corresponding portion of the description given for test object 1012 in FIG. 3a.

Enhancement of Transmission Through an Aperture

When the dimensions of an aperture such as 2062 in FIG. 3g are less than the wavelength of a non-collimated beam 2010, the respective transmission is reduced. The transmission may be sufficiently reduced such that it may be desirable to enhance the transmission. An embodiment comprising an enhancement of the transmission is shown diagrammatically in the blown up section 2004 in FIG. 3g. The system for enhancement comprises a resonant cavity such as described in commonly owned U.S. Pat. No. 6,847,029 (ZI-18) entitled "Multiple-Source Arrays with Optical Transmission Enhanced by Resonant Cavities" by Henry A. Hill. The contents of U.S. Pat. No. 6,847,029 (ZI-18) are herein incorporated in their entirety by reference.

The optical cavity in 2004 comprises lens 2080 and the adjacent surface of aperture array 2040. Lens 2080 may have a non-zero optical power with the respective focused spot in any case formed from a non-collimated beam 2010 located at an aperture 2062. The surface 2082 of lens 2080 is AR coated. The surface 2084 and the adjacent surface of aperture array 2040 each have a high reflectivity. The optical path length of the optical cavity is tuned such that one of the pass band frequencies of the optical cavity corresponds to the frequency of the corresponding non-collimated beam 2010. Reference is made to referenced U.S. Pat. No. 6,847,029 (ZI-18) for further discussion of the properties of the resonant cavity and its adaptation to enhancement of transmission through sub-wavelength apertures.

Test Object: Optical System for Collimated Input Beam

Figure 3D:
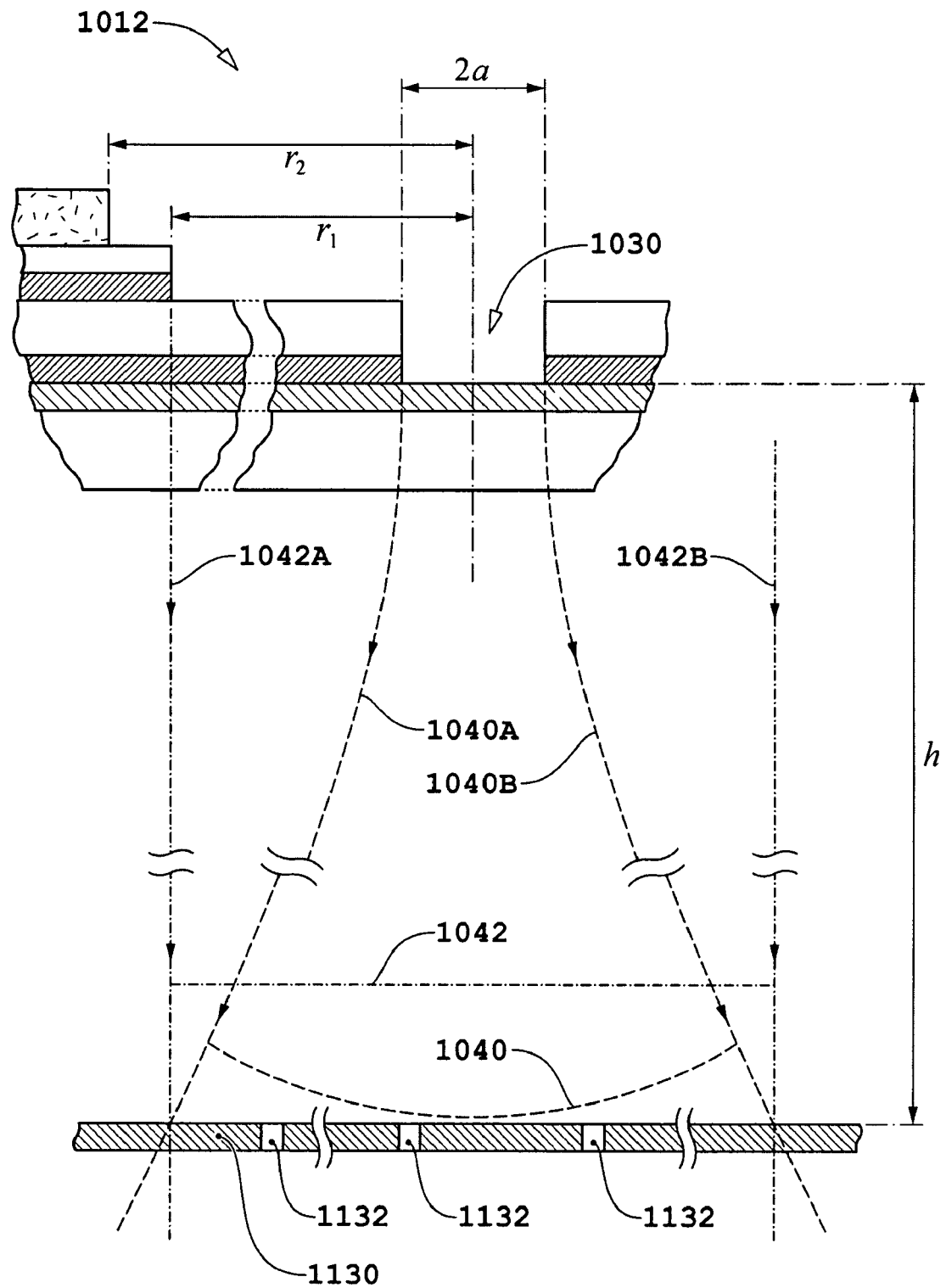
FIG. 3d is a diagram of paths of beams transmitted by a test object.
Figure 3E:
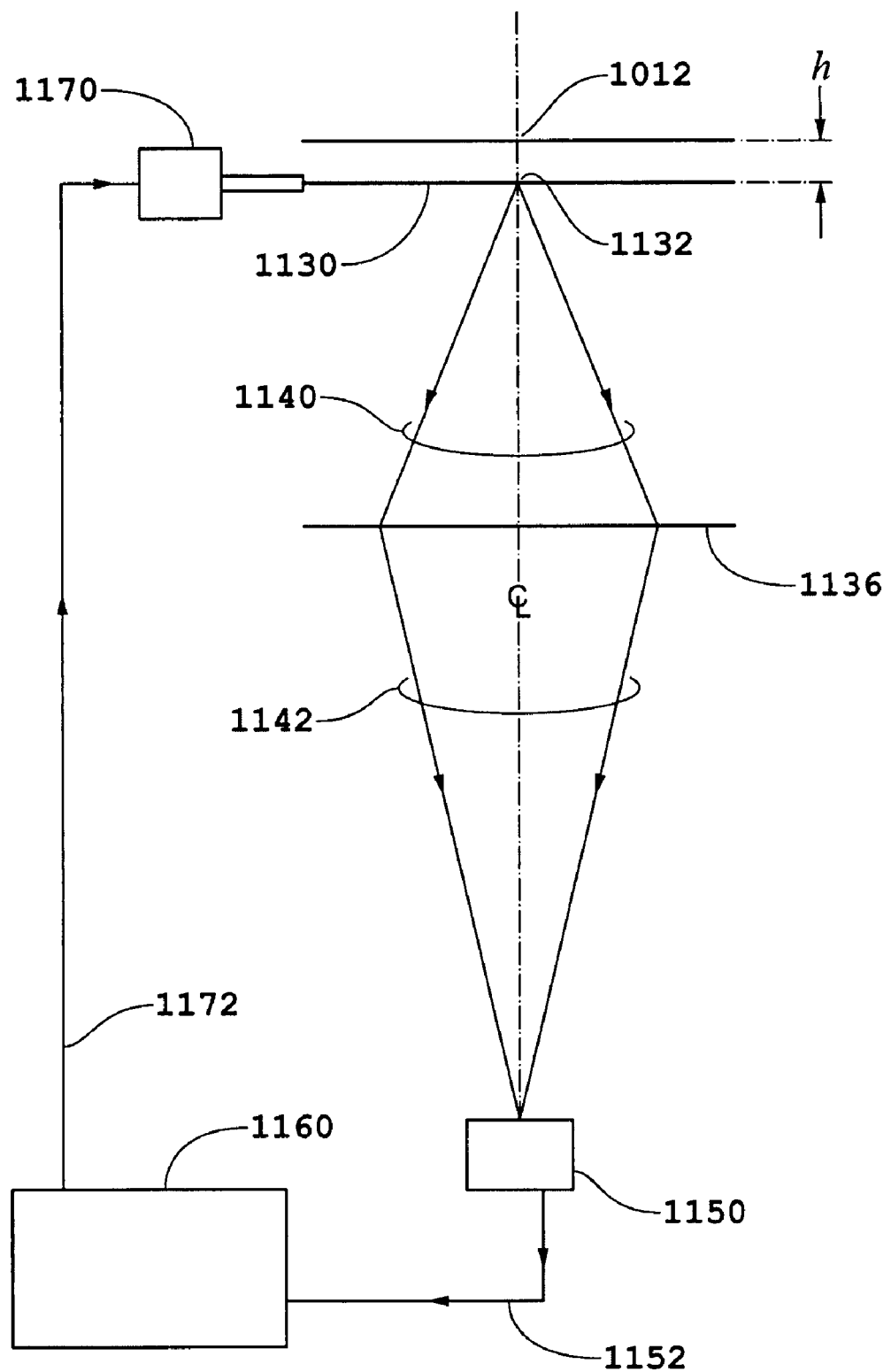
FIG. 3e is a diagram of apparatus for measuring properties of beams transmitted by a test object.
Figure 3F:
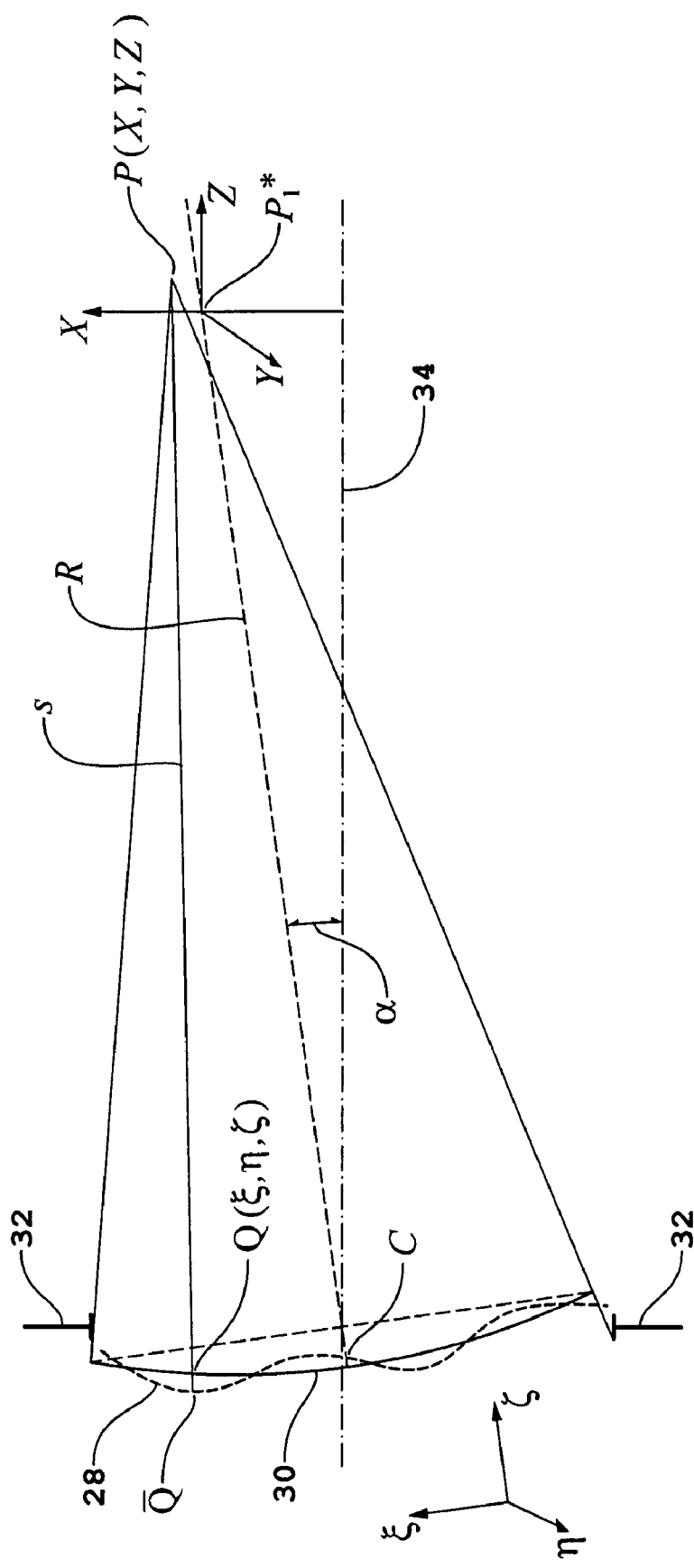
FIG. 3f is a diagram of an imaging system and a Gaussian reference spherical surface and coordinate systems.
Figure 3H:
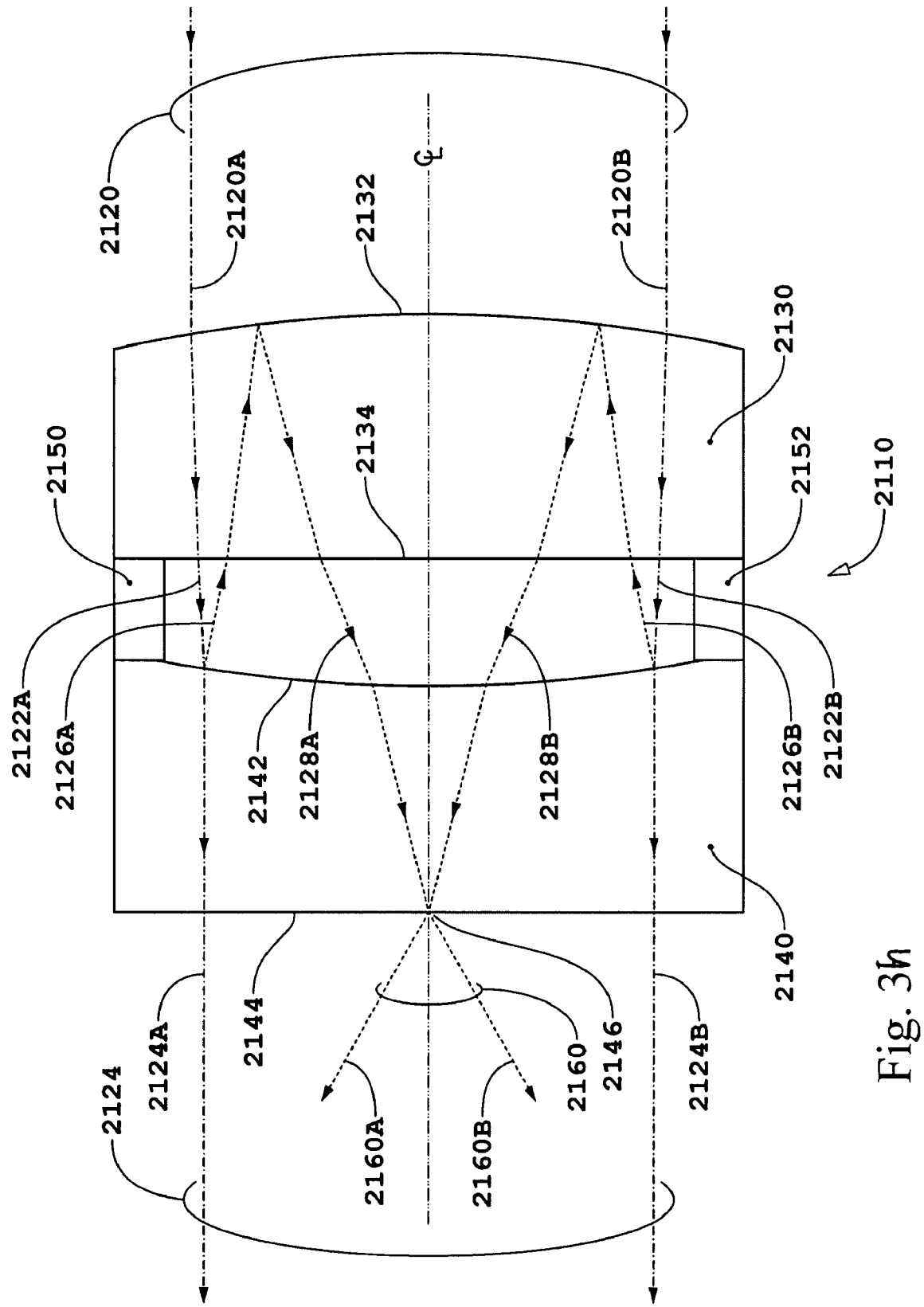
FIG. 3h is a diagram of a cross section of a test object for a collimated input beam.

A test object comprising lenses 2130 and 2140 is shown diagrammatically as numeral 2110 in FIG. 3h. The input beam to test object 2110 is a collimated beam 2120 comprising beam paths 2120A and 2120B. The output beam from test object 2110 comprises two beam components 2124 and 2160. Beam component 2124 comprising beam paths 2124A and 2124B is a collimated beam for use as a collimated reference beam of an interferometer. Beam component 2160 comprising beam paths 2160A and 2160B is a diverging beam for use as a diverging measurement beam in the interferometer.

Collimated reference beam 2124 is generated from collimated input beam 2120 with test object 2110 functioning as a Galilean afocal lens comprising positive and negative lenses 2130 and 2140, respectively. As a Galilean afocal lens, input beam 2120 is incident on lens 2130 and a portion thereof is transmitted as a converging reference beam comprising beam paths 2122A and 2122B. The converging reference beam is incident on lens 2140 and a portion thereof is transmitted as collimated reference beam 2124.

Diverging measurement beam 2160 is generated as a secondary beam from collimated beam 2120 by a double reflection in test object 2110. Input beam 2120 is incident on lens 2130 and a portion thereof is transmitted as a first converging beam comprising beam paths 2122A and 2122B. A portion of the first converging beam is reflected from lens surface 2142 to form a first reflected measurement beam comprising beam paths 2126A and 2126B and a second reflected measurement beam comprising beam paths 2128A and 2128B is formed after a reflection from lens surface 2132. The numerical aperture NA of the second reflected measurement beam is designed to approximately match the NA of the imaging system under test.

A portion of the second reflected measurement beam is transmitted by surface 2142 of lens 2140 to form a focused spot at pinhole 2146 on surface 2144. The size of the spot is determined in part by the wavelength of input beam 2120 and the NA of the first measurement beam. The amplitude of the second reflected measurement beam is controlled by the reflectivityies of surfaces 2132 and 2142 of lenses 2130 and 2140, respectively. Surface 2134 is AR coated and surface 2144 is coated with a partially reflecting coating. An example of the radial dependence of the partially reflecting coating is shown graphically in FIG. 3i. The radial coordinate in FIG. 3i is normalized by the radius a of an aperture in the partially reflecting coating on surface 2144.

A portion of the second reflected measurement beam is transmitted by aperture 2146 as a diverging measurement beam 2160. The NA of the diverging measurement beam 2160 is determined in part by the radius a of aperture 2146, the index of refraction of lens 2140, and the NA of the second reflected measurement beam. The NA of diverging measurement beam 2160 is designed to meet the illumination requirements of the imaging system under test.

The spacing between lenses 2130 and 2140 is controlled by transducers 2150 and 2152 (see FIG. 3h) which in turn are controlled by an electronic processor (not shown in FIG. 3h). The control of the spacing is used to modulate the relative phase and alter the ratio of amplitudes of collimated reference beam 2124 and diverging measurement beam 2160. The ratio of the amplitudes is changed by changing the diameter of the beam spot at aperture 2146. The maximum of the ratio of the amplitudes is determined in part by the NA of the diverging measurement beam, the radius a of the aperture, by the reflectivities of surfaces 2132 and 2142 of lens 2130, and the index of refraction of lens 2140 and designed to optimize the signal to noise ratios of information contained in subsequently measured topographic interference signals.

Figure 3I:
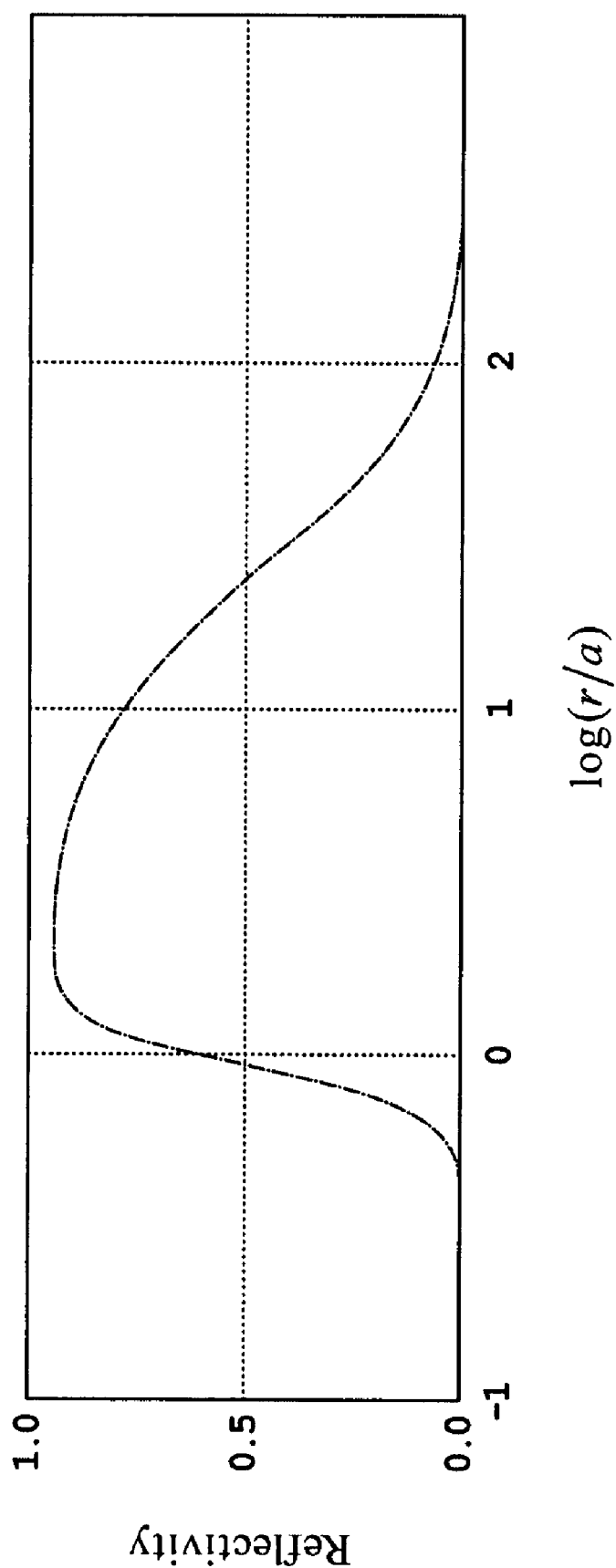
FIG. 3i is a graph of reflectivity on an optical surface of a test object.

The design of the reflectivity profile shown in FIG. 3i is based on several considerations. One consideration is the degree of spatial filtering that is to be achieved by the reflective coating.

Test Object: Optical System for Non-Collimated Input Beam

Figure 3J:
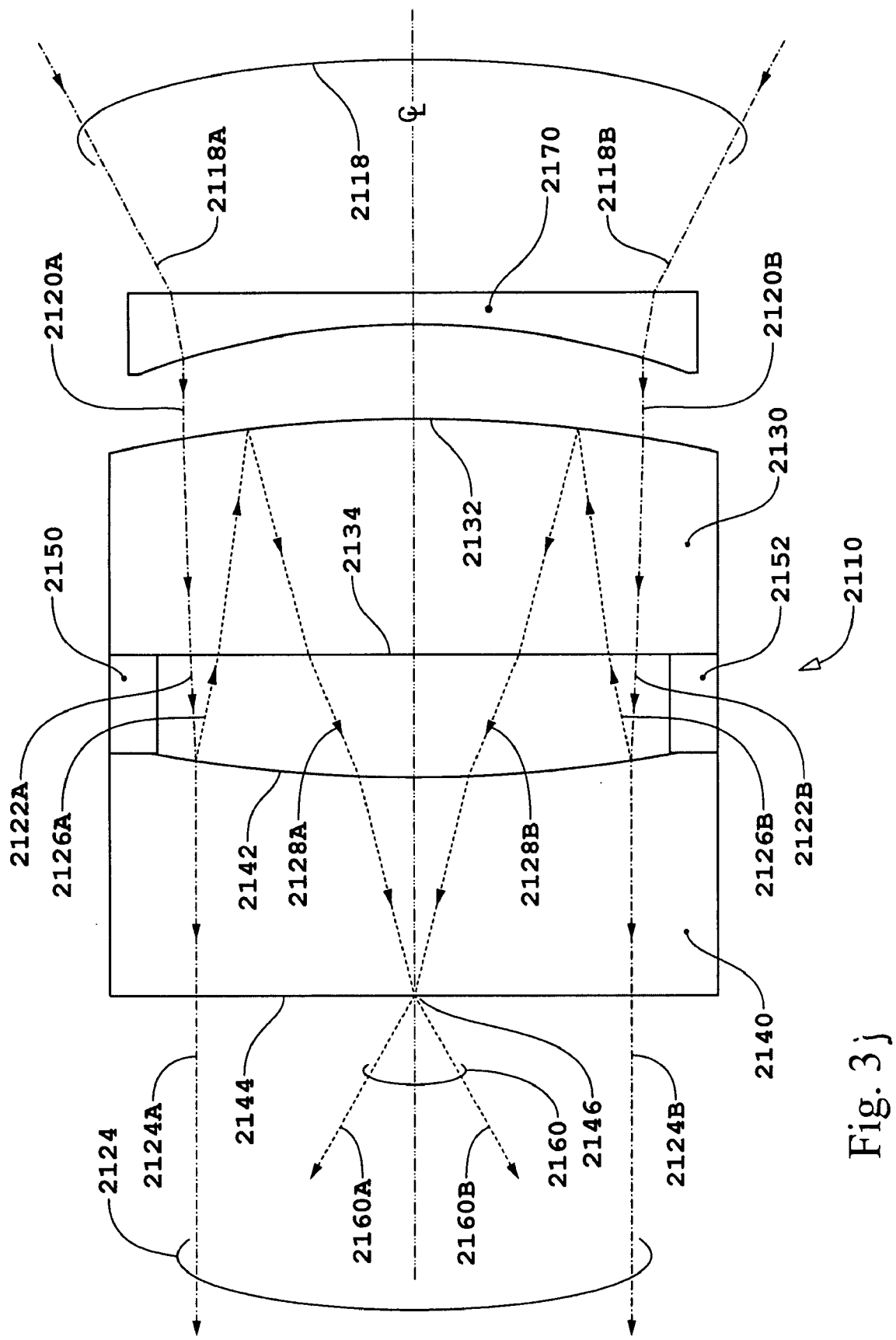
FIG. 3j is a diagram of a cross section of a test object for a non-collimated input beam.

A test object for a non-collimated input beam comprising test object 2110 shown in FIG. 3h and lens 2170 is shown diagrammatically in FIG. 3j. The input beam to the test object for a non-collimated input beam is a non-collimated beam 2118 comprising beam paths 2118A and 2118B. The output beam from the test object for a non-collimated input beam comprises beam components 2124 and 2160.

Non-collimated input beam 2118 is transmitted by negative lens 2170 as a collimated beam comprising beam paths 2120A and 2120B. The remaining description of the test object for a non-collimated input beam is the same as corresponding portions of the description given for test object 2110 shown in FIG. 3h.

Test Object: Another Optical System for Collimated Input Beam

Figure 3K:
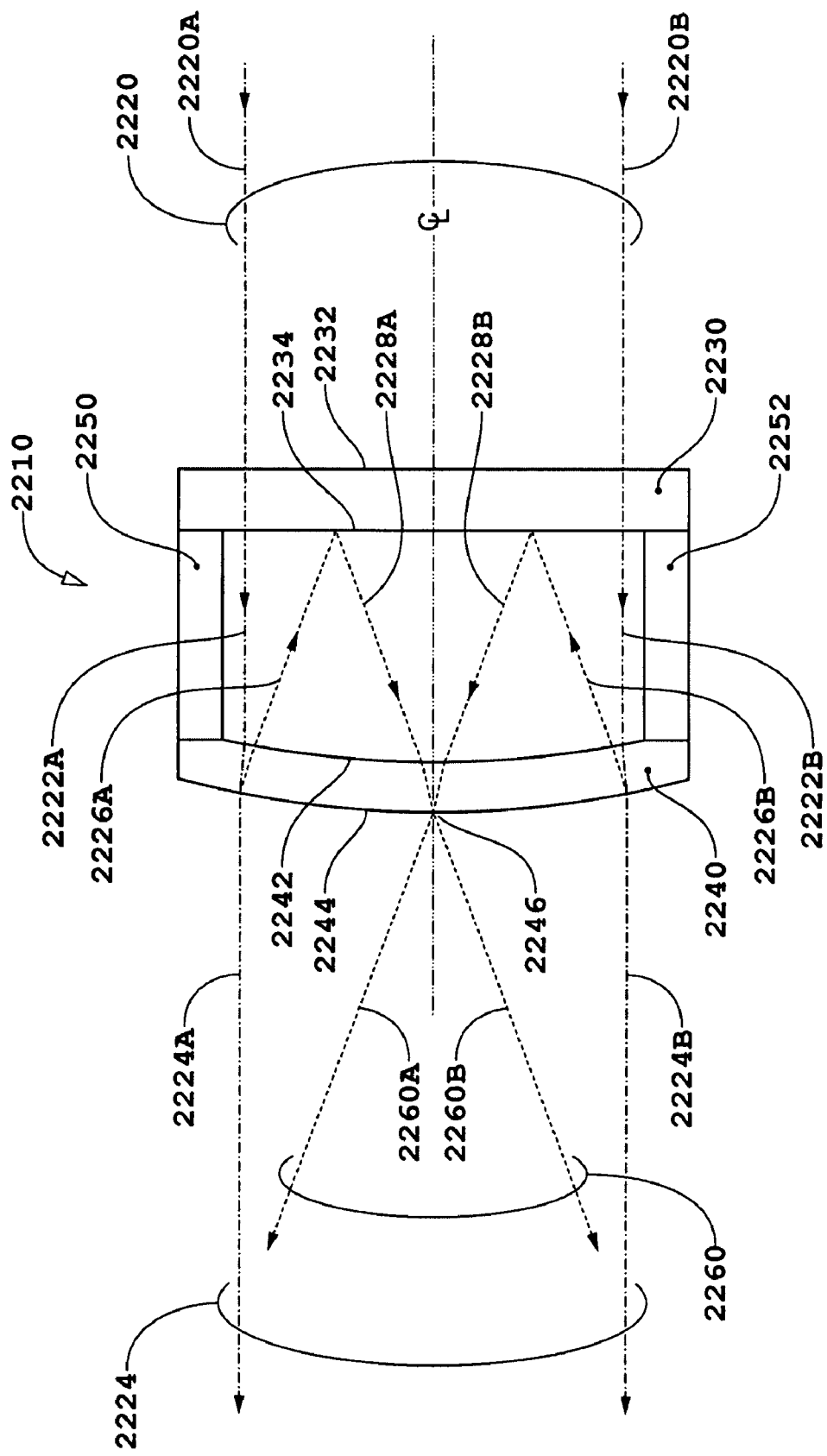
FIG. 3k is a diagram of a cross section of a test object for a collimated input beam.

A test object comprising lenses 2230 and 2240 is shown diagrammatically as numeral 2210 in FIG. 3k. The input beam to test object 2210 is collimated beam 2220 comprising beam paths 2220A and 2220B. The output beam from test object 2210 comprises two beam components 2224 and 2260. Beam component 2224 comprising beam paths 2224A and 2224B is a collimated beam for use as a collimated reference beam of an interferometer. Beam component 2260 comprising beam paths 2260A and 2260B is a diverging beam for use as a diverging measurement beam in the interferometer.

Collimated reference beam 2224 is generated from collimated input beam 2220 with test object 2210 functioning as a Galilean afocal lens comprising lenses 2230 and 2240, respectively. Lens 2230 may for example be a window.

Diverging measurement beam 2260 is generated as a secondary beam from collimated beam 2220 by reflections first from surface 2244 of lens 2240 and then from surface 2234 of lens 2230. The intermediate converging measurement beams comprise beam paths 2226A and 2226B and beam paths 2228A and 2228B. The NA of the converging measurement beam comprising beam paths 2228A and 2228B is designed to approximately match the NA of the imaging system under test.

The converging measurement beam comprising beam paths 2228A and 2228B is transmitted by surface 2242 of lens 2240 and focused to a spot at aperture 2246 on surface 2244. The size of the spot at aperture 2246 is determined in part by the wavelength of input beam 2220 and the NA of the converging measurement beam comprising beam paths 2228A and 2228B. The relative amplitude of the converging measurement beam comprising beam paths 2228A and 2228B is controlled by the reflectivities of surfaces 2244 and 2234 of lenses 2240 and 2230, respectively. Surfaces 2232 and 2242 are AR coated and surfaces 2234 and 2244 are coated with a partially reflecting coatings. An example of the radial dependence of the partially reflecting coating on surface 2244 is shown graphically in FIG. 3i.

A portion of converging measurement beam comprising beam paths 2228A and 2228B is transmitted by aperture 2246 as a diverging measurement beam 2260. The NA of the diverging measurement beam is determined in part by the radius a of aperture 2264, the index of refraction of lens 2240, and the NA of the converging measurement beam comprising beam paths 2228A and 2228B. The NA of the diverging measurement beam is designed to meet the illumination requirements of the imaging system under test.

The spacing between lenses 2230 and 2240 is controlled by transducers 2250 and 2252 (see FIG. 3k) which in turn is controlled by an electronic processor (not shown in FIG. 3n). The control of the spacing is used to modulate the relative phase and alter the ratio of amplitudes of the collimated reference beam 2224 and the diverging measurement beam 2260. The ratio of the amplitudes is changed by changing the diameter of the beam spot at aperture 2246. The maximum of the ratio of the amplitudes is determined in part by the NA of the diverging measurement beam, the radius a of the aperture, by the reflectivities of surfaces 2244 and 2234 of lenses 2240 and 2230, respectively, and the index of refraction of lens 2240 and designed to optimize the signal to noise ratios of information contained in subsequently measured topographic interference signals.

The design of the reflectivity profile shown in FIG. 3k is based on several considerations. One consideration is the degree of spatial filtering that is to be achieved by the reflective coating.

Figure 4A:
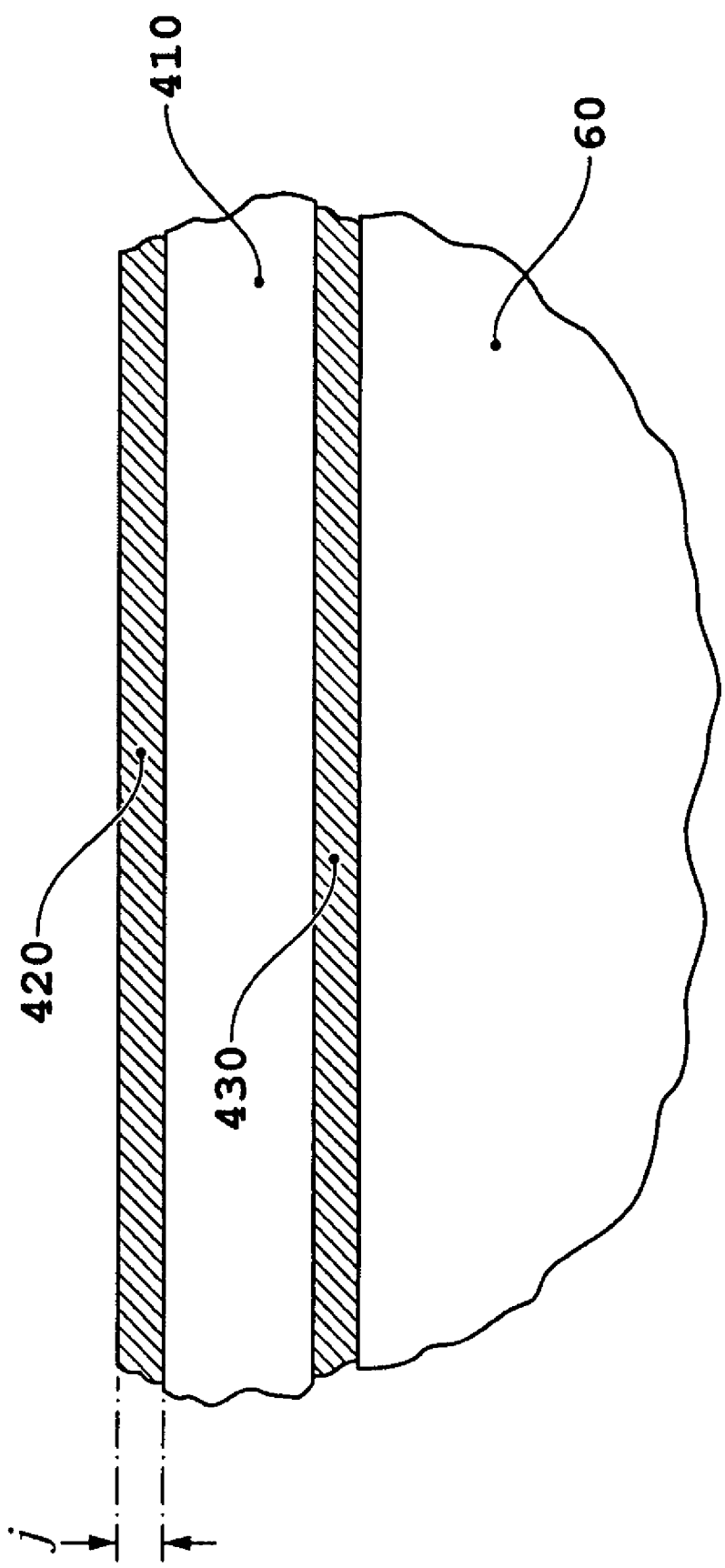
FIG. 4a is a diagram of a recording medium layer on a substrate with anti-reflecting layers.
Figure 4B:
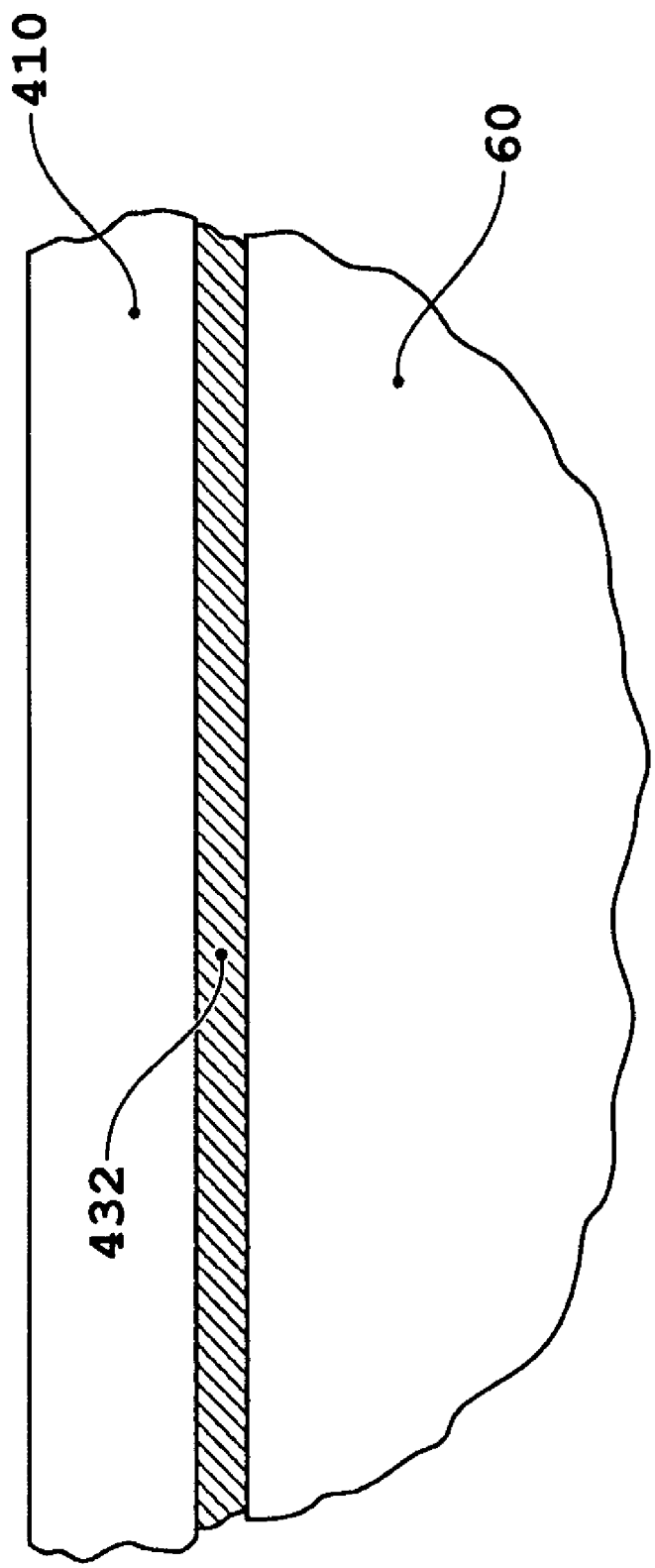
FIG. 4b is a diagram of a recording medium layer on a substrate with a reflecting layer at the interface of the recording medium layer and the substrate.
Figure 4C:
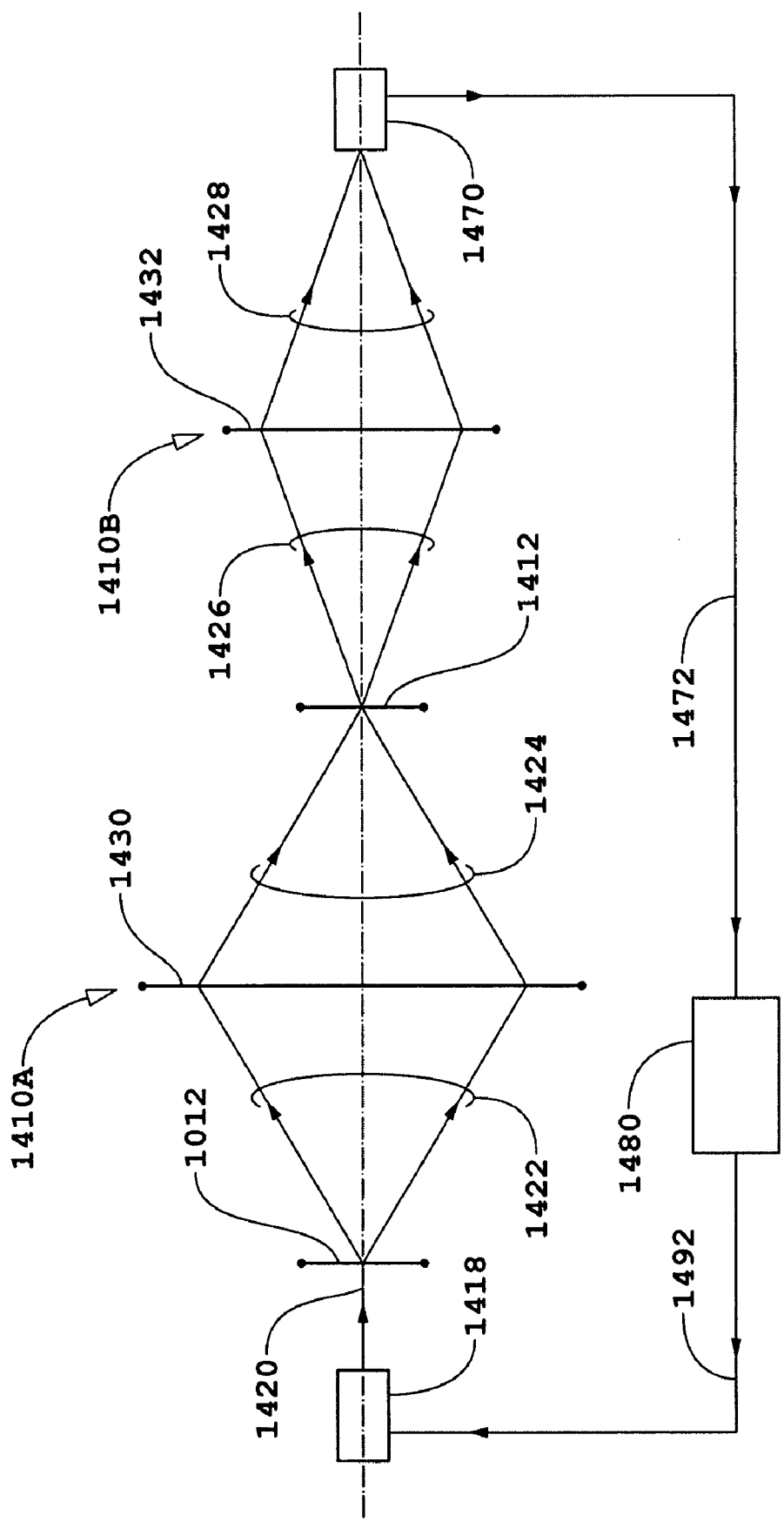
FIG. 4c is a diagram of a metrology system for measuring the topographic interference signal with a detector comprising a photon detector.

Topographic Interference Signal Generation and Detection: Electrical Interference Signal The topographic interference signal is detected by a detector, e.g., a photon detector such as a CCD, with a system such as shown in FIG. 4c or 4h. The system shown in FIG. 4c comprises source 1418, an optical system 1410A for which information about the respective spatial impulse response function is to be determined, and optical system 1410B which images image plane aperture array 1412 onto detector 1470. Test object 1012 comprises a test object such as test object 1012 of FIG. 3a. Source 1418 may be the same source used by optical system 1410A in an application, e.g., a lithography tool, or a different source such as source 18 in FIGS. 1a and 1b.

Source 1418 generates beam 1420 which is incident on test object 1012 to form beam 1422. Source 1418 is controlled by signal 1494 from electronic processor and controller 1480. Test object 1012 is the same as test object 1012 of FIG. 3a. Beam 1422 comprises the reference and measurement beams generated by test object 1012. Optical system 1410A is represented by a single lens 1430 in FIG. 4c which focuses beam 1422 as beam 1424 to a spot in a conjugate image plane at image plane aperture array 1412.

A portion of beam 1424 is either transmitted or converted to beam having a wavelength different from that of beam 1424 as beam 1426 by image plane aperture array 1412. Beam 1426 is incident on the second optical system 1410B and focused as beam 1428 to a spot on detector 1470. The apertures of image plane aperture array 1412 are imaged in a one-to-one mapping onto pixels of detector 1470. Beam 1428 is detected by detector 1470 to form electrical interference signal 1472. Signal 1472 is received by electronic processor and controller 1480. Image plane array 1412 is scanned across the image plane of optical system 1410A to obtain for a complete image in the plane of image plane array 1412 electrical interference signal 1472 corresponding to a topographic interference signal which is processed by electronic processor and controller 1480 for information about the spatial impulse response function of optical system 1410A. The processing is according to the homodyne detection method used in embodiments of the present invention such as described herein in subsection entitled "Topographic Interference Signal Generation and Detection: Exposure Induced Changes in a Recording Medium" and related subsections.

Figure 4D:
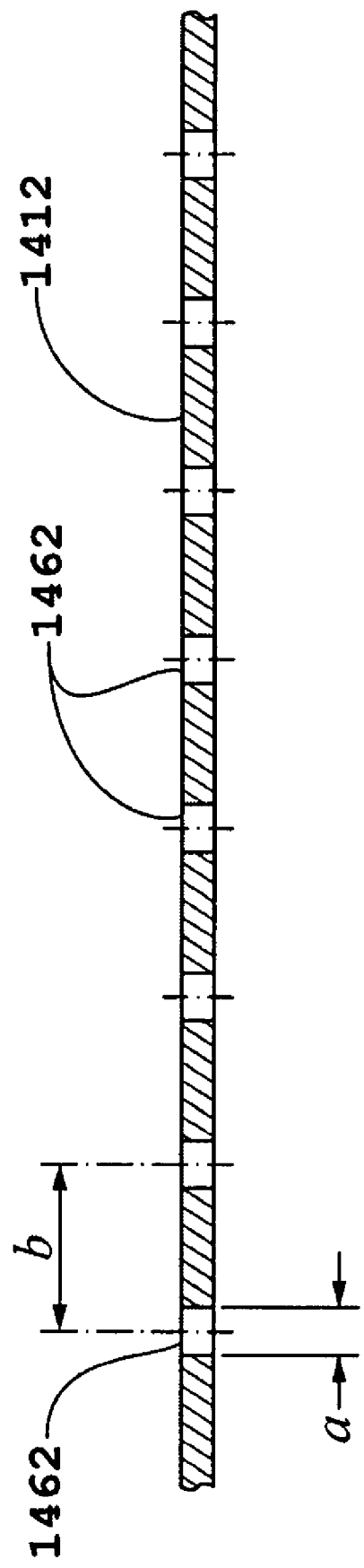
FIG. 4d is a schematic diagram of an array of apertures that may be filled with a fluorescent medium.

Image plane array 1412 is formed in certain embodiments as an array of subwavelength apertures such as shown in FIG. 4d and in certain other embodiments as an array of thin fluorescent spots. An example of a pattern of an array of thin fluorescent spots in one embodiment of the certain other embodiments is the pattern of apertures shown in FIG. 4d with apertures 1462 filed with a fluorescent medium, e.g., lumogen, to the form thin fluorescent spots. The size and spacing of the apertures are a and b, respectively. The size of the apertures a may be less than or approximately equal to the resolution of imaging system 1410A in certain end use applications or larger than the resolution in one or two dimensions in certain other end use applications such as described in U.S. Provisional Patent Application No. 60/485,507 (ZI-52) and U.S. patent application Ser. No. 10/886,010 (ZI-52) wherein both are entitled "Apparatus and Method for High Speed Scan for Detection and Measurement of Properties of Sub-Wavelength Defects and Artifacts in Semiconductor and Mask Metrology". The two applications are both by Henry A. Hill and the contents thereof are incorporated herein in their entirety by reference. The shape of the apertures may be circular or some other shape such as slits.

Image plane array 1412 comprising the array of sub-wavelength thin fluorescent spots also serves the function of a pinhole array beam-splitter in an interferometer wherein the description is the same as the corresponding description given in U.S. Provisional Patent Application No. 60/442,982 (ZI-45) and U.S. patent application Ser. No. 10/765,229 (ZI-45) wherein both are entitled "Interferometric Confocal Microscopy Incorporating Pinhole Array Beam-Splitter". The two applications are both by Henry A. Hill and the contents thereof are incorporated herein in their entirety by reference.

Figure 4E:
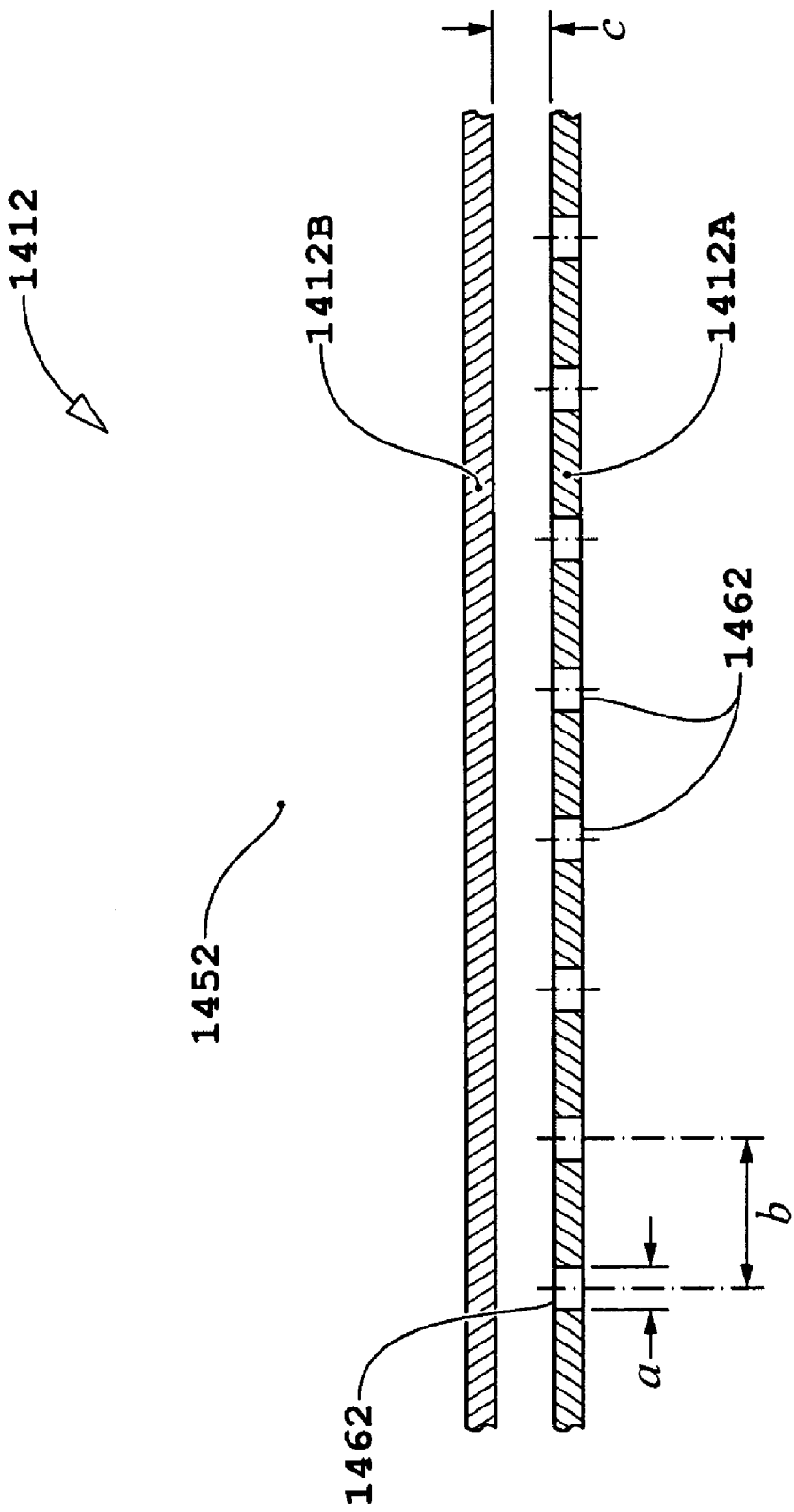
FIG. 4e is a schematic diagram of a thin fluorescent layer placed behind an array of pinholes.
Figure 4F:
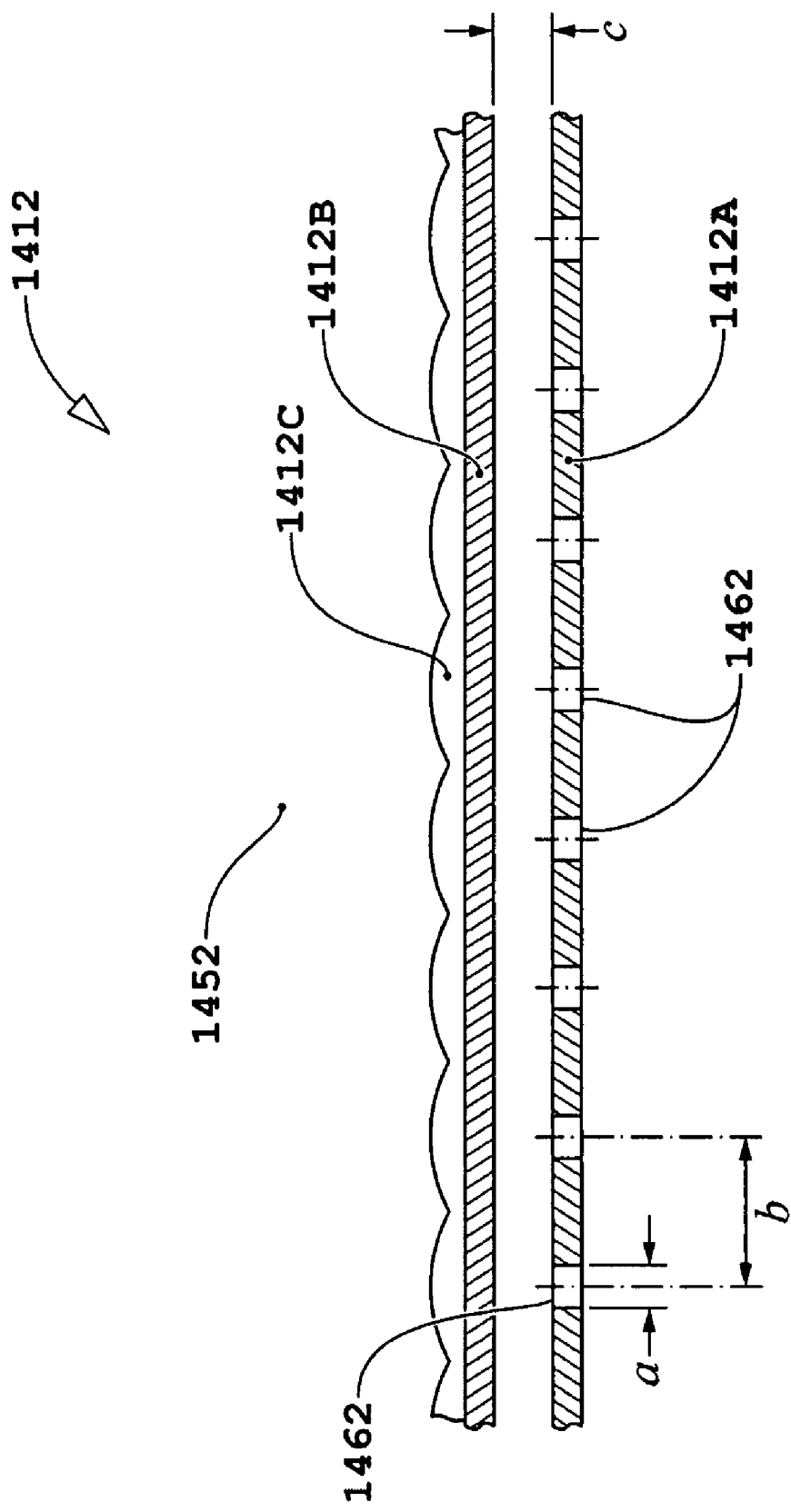
FIG. 4f is a schematic diagram of an array of microlenses placed behind a thin fluorescent layer and array of pinholes.

Image plane array 1412 of the one embodiment of the certain other embodiments is the simplest image plane array with respect to fabrication compared to the corresponding image plane array 1412 of other of the certain other embodiments and variants thereof of the present invention. A first variant of image plane array 1412 of the one embodiment is shown schematically in FIG. 4e. Image plane array 1412 is formed with thin fluorescent layer 1412B placed behind an array of pinholes 1412A. The efficiency for detecting beams transmitted by pinhole array 1412A can be increased by manufacturing pinhole array 1412A with a reflective backside. The size of the spacing c between pinhole array 1412A and thin fluorescent layer 1412B is selected to optimize the efficiency for detection of beams transmitted by pinhole array 1412A without significantly degrading the resolution beyond that required in an end use application. The description of the shape, size a, and spacing b of the pinholes in pinhole array 1412A is the same as the corresponding portion of the description of the shape, size a, and spacing b of the apertures in interface 1412 of the certain other embodiments of the present invention.

A second variant of image plane array 1412 of the one embodiment is shown schematically in FIG. 4c. Image plane array 1412 is formed by an array of microlenses 1412C placed behind the thin fluorescent layer 1412B and array of pinholes 1412A of the first variant of the one embodiment. The addition of the array of microlenses 1412C reduces the numerical aperture required for the second imaging system 1410B to obtain a given detection efficiency for beams transmitted by pinhole array 1412A or increases the detection efficiency for a given numerical aperture of the second imaging system 1410B.

The advantage of thin fluorescent spots of the certain other embodiments is that the fluorescent medium itself is used to define the boundary of a region to be used in generating an optical interference signal which is subsequently detected by detector 1470 with a reduced background contribution, i.e., only short wavelength light that is incident on the fluorescent spot can contribute to the generation of the optical interference signal. When an opaque screen with apertures is used to define the light to be subsequently detected, a portion of the light that is transmitted by the opaque region of the screen outside of the apertures will also be detected. This particular source of background contributions is not present when using thin fluorescent spots.

The manufacture of an array of thin fluorescent spots can be done using microlithography techniques. The description of the manufacturing of the array of thin fluorescent spots is the same as the corresponding portion of the subsequent description given in with respect to the third variant of the one embodiment of the certain other embodiments for the manufacture of thin fluorescent spots configured with a filled cone structure.

In a third variant of image plane array 1412 of the one embodiment of the certain other embodiments, image plane array 1412 is formed of an array of thin fluorescent spots wherein each spot comprises a filled cone structure to improve the detection efficiency over that of the certain other embodiments. An example of a cone structure fluorescent spot is shown schematically as element 1414A in Step 6 of FIG. 4g wherein element 1412A is an absorber, e.g., aluminum or platinum. The description of the size and spacing of the cone structures is the same as the corresponding portion of the description of the size a and spacing b of the apertures in image plane array 1412 of the one embodiment of the certain other embodiments of the present invention. The fluorescent spots in interface 1412 may also comprise filled vee groove structures to enhance detection efficiency depending on the distribution of the measurement beam spots being imaged on image plane array 1412.

Figure 4G:
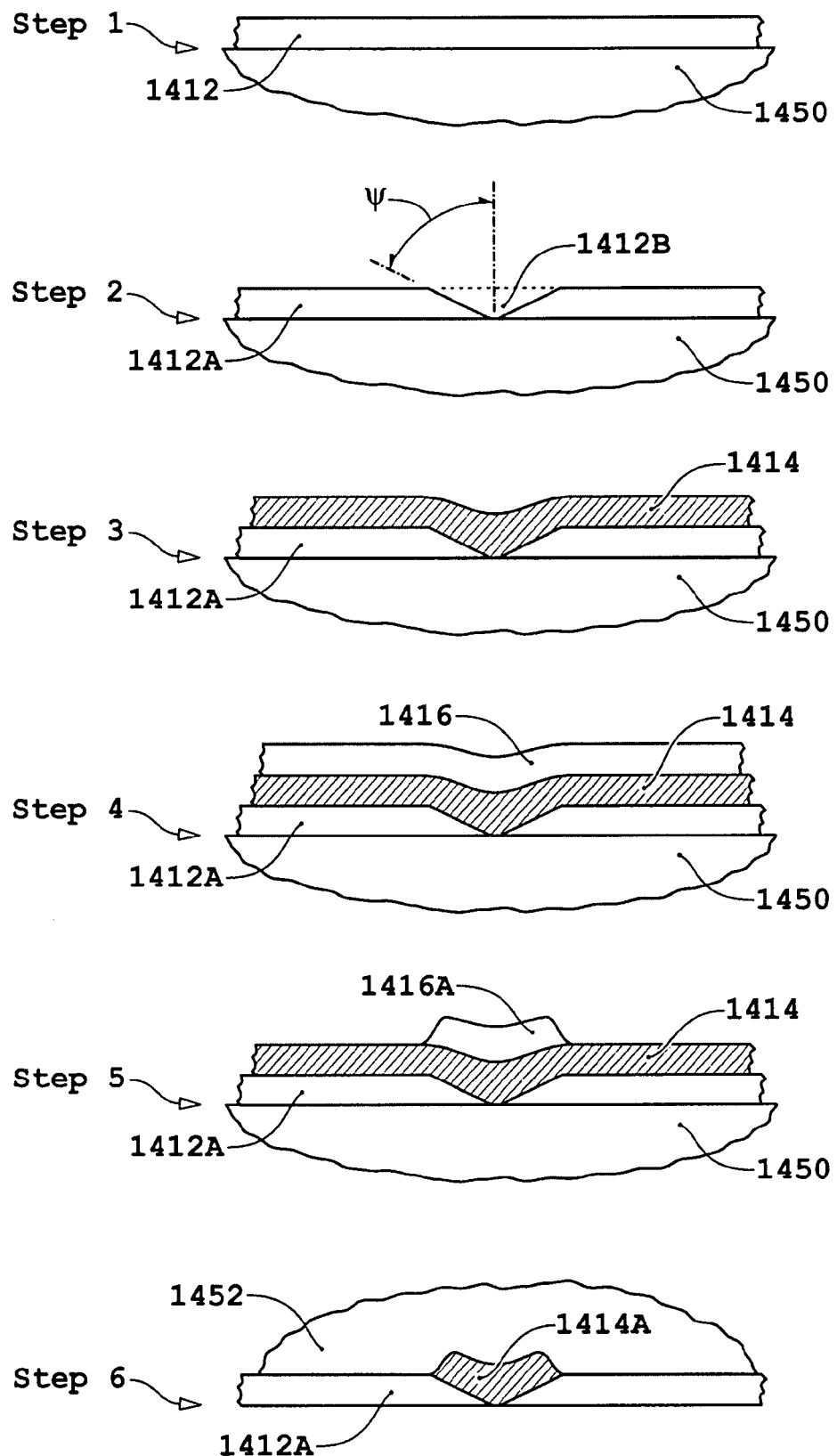
FIG. 4g is a schematic diagram of the lithography steps used in the manufacture of an array of thin fluorescent spots comprising a filled cone or vee groove structure.
Figure 4H:
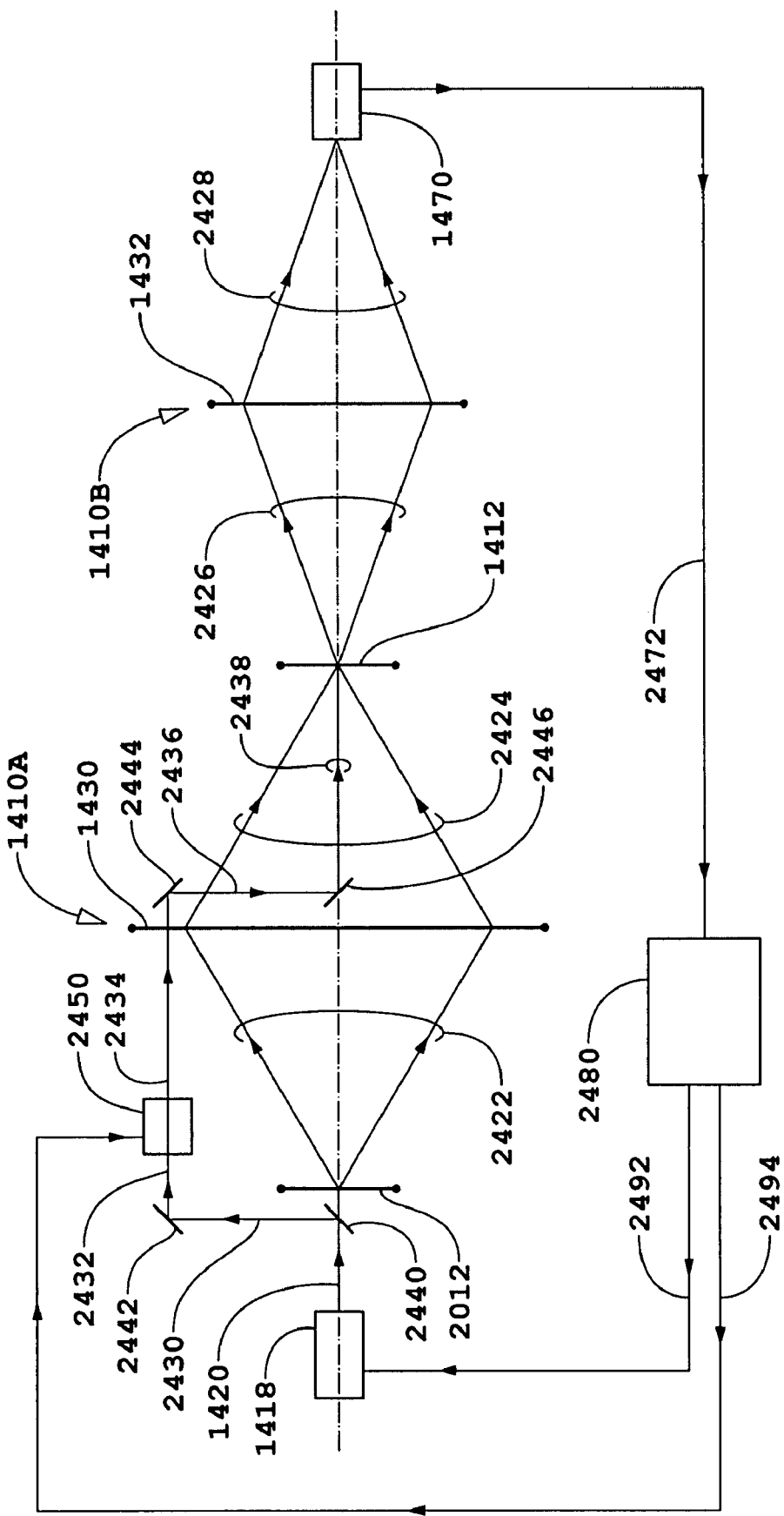
FIG. 4h is a diagram of a metrology system for measuring the topographic interference signal with a detector comprising a photon detector.

The steps used in the manufacture of the array of thin fluorescent spots in the third variant of the one embodiment are set out in FIG. 4g wherein the image plane array 1412 is formed of an array of thin fluorescent spots comprising filled cone or vee groove structures. In step 1, the plane surface of a substrate 1450 is first coated with a release agent and then coated with a thin absorbing layer 1412, e.g., aluminum or platinum. The absorber medium is selected based on consideration of the reflectivity and absorption coefficient of the absorber medium at the wavelength radiated by the fluorescent medium and at the wavelengths used in imaging system 1410A, respectively. The thickness of thin absorbing layer 1412 is of the order of 10 or more thicknesses of the absorber that attenuates a beam by a factor of 1/e at the wavelength used in imaging system 1410A. In step 2, thin absorbing layer 1412 is etched to form absorbing layer 1412A with a focused ion beam (FIB) to generate the cone or vee groove shaped aperture 1412B. A typical half angle $\psi$ of the cone or vee groove structure (see Step 2 of FIG. 4g) is 60 or 70 degrees that corresponds to numerical apertures of 0.866 and 0.940, respectively.

The half angle $\psi$ is selected such that a portion of the fluorescent light radiated by the fluorescent spot 1414A outside of the numerical aperture of the second imaging system 1410B is reflected/scattered into the numerical aperture of the second imaging system 1410B so as to effectively increase the detection efficiency for short wavelength light incident on the fluorescent spot 1414A without degrading significantly the resolution of the second imaging system 1410B. The choice of thickness of thin absorbing layer 1412 is also based on consideration of the thickness that will contribute to generation of an increased detection efficiency. The thickness may be for example 0.5 or 1 micron. The detection efficiency can be increased by a factor of $\lesssim 4$ over that obtained in the one embodiment of the certain other embodiments of the present invention. A typical magnitude of the degrading of the resolution of the second imaging system 1410B is of the order of 20%.

Continuing with the description of the Steps of FIG. 4g, absorbing layer 1412A and the array of filled cone or vee groove shaped apertures 1412B are coated in Step 3 with a thin fluorescent layer 1414, e.g., lumogen. In Step 4 of FIG. 4g, thin fluorescent layer 1414 is coated with a thin layer of a negative photoresist 1416. In Step 5, photoresist layer 1416 is patterned by either contact printing or by a lithography tool, developed, and the unexposed portion of layer 1416 dissolved leaving photoresist spots 1416A. In Step 6, the substrate comprising photoresist spots 1416A and thin fluorescent layer 1414 are etched so as to remove the thin fluorescent media not covered by the photoresist spots 1416A leaving thin fluorescent spots 1414A caped with photoresist spots. The photoresist caps may be removed as shown in Step 6 of FIG. 4g. The substrate comprising the array of thin fluorescent spots 1414A with or without the photoresist spots (the photoresist spots are removed if not transparent at the wavelength of the radiation emitted by the fluorescent spots 1414A) is bonded to convex lens 1452 and lifted off of or separated from substrate 1450. In lieu of using a release agent, substrate 1450 may alternatively be removed by etching.

The advantage of thin fluorescent spots configured as filled cones or vee grooves shaped structures is that the fluorescent medium itself is used to help define the boundary of a region to be used in generating the optical interference signal, used to improve detection efficiency, and to reduce background contributions, i.e., only short wavelength light that is incident on the fluorescent spot can contribute to the generation of the optical interference signal. When an opaque screen with apertures is used to define the light to be subsequently detected, a portion of the light that is transmitted by the opaque region of the screen outside of the apertures will also be detected. This particular source of background contributions is not present when using thin fluorescent spots configured as cones or vee grooves.

The system shown in FIG. 4h comprises source 1418, an optical system 1410A for which information about the respective spatial impulse response function is to be determined and optical system 1410B which images image plane aperture array 2012 onto detector 1470. Test object 2012 comprises that portion of a test object such as test object 1012 of FIG. 3a that generates the first beam therein. Source 1418 may be the same source used by optical system 1410A in an application, e.g., a lithography tool, or a different source such as source 18 in FIGS. 1a and 1b. Source 1418 is controlled by signal 2492 from electronic processor and controller 2480.

Source 1418 generates beam 1420 which is incident on beam-splitter 2440 wherein a first portion is transmitted as a first beam and a second portion reflected as a second beam 2430. The first beam is incident on test object 2012 to form beam 2422. Test object 2012 comprises the portions of test object 1012 of FIG. 3a that generates the corresponding first beam generated by test object 1012. Accordingly, beam 2422 comprises the measurement beam and beam 2430 is the reference beam. Optical system 1410A is represented by a single lens 1430 in FIG. 4h which focuses beam 2422 as beam 2424 to a spot in a conjugate image plane at image plane aperture array 1412.

A portion of reference beam 2430 is reflected by reflector 2442 as beam 2432 and a portion thereof transmitted by phase-shifter 2450 as phase shifted reference beam 2430. Phase-shifter 2450 introduces phase shifts such as by electro-optic modulation which are subsequently used in homodyne detection methods. A portion of beam 2434 is reflected by reflector 2444 and a portion thereof reflected by reflector 2446 as phase-shifted reference beam 2438. The phase shifts are controlled by signal 2494 from electronic processor and controller 2480. Phase-shifted reference beam 2438 is incident on the conjugate image plane at image plane aperture array 1412.

Figure 1B:
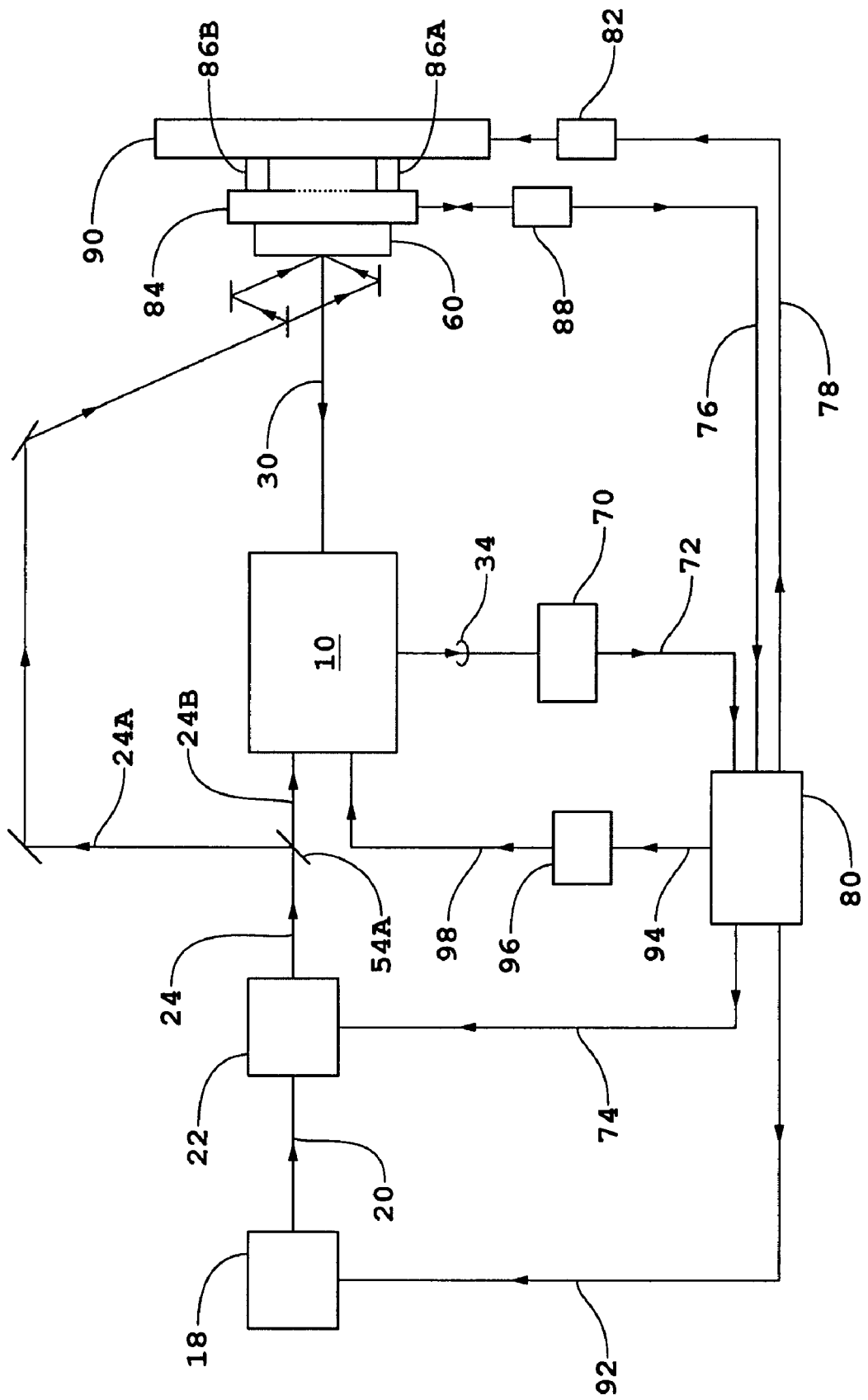
FIG. 1b is a diagram of a non-confocal interferometric system.

The phase-shifted reference beam corresponding to beam 2438 may be incident on image plane aperture array 1412 in yet other configurations such as such as shown in FIG. 1b.

Portions of beams 2424 and 2438 either transmitted or converted to beam having a wavelength different from that of beam 1424 as beam 2426 by image plane aperture array 1412. Beam 2426 is incident on the second optical system 1410B and focused as beam 2428 to a spot on detector 1470.

The remaining description for the system shown in FIG. 4h is that same as the descriptions given for corresponding portions of the system shown in FIG. 4g.

In a variant of the system shown in FIG. 4h, the detector starting with image plane aperture array 1412 may use a recording medium.

Topographic Interference Signal Generation and Detection: Exposure Induced Changes in a Recording Medium The exposure induced changes in the recording medium with or without post exposure treatment may be subsequently measured interferometrically in situ either during or following the exposure cycle of a recording medium wafer or upon removal from the lithographic tool for example by an optical interferometric microscopy system. Other techniques may also be used such as an AFM to measure ex situ the latent image. In addition, techniques such as optical interferometry, AFM or SEM may be used to measure properties of the topographic interference signal in developed images upon removal from the lithography tool.

Recorded Exposure Induced Changes in a Recording Medium

The recorded exposure induced change E in the recording medium can be expressed within a scale factor as $$E = E(J') + \left(\frac{dE}{dJ}\right)_{J'} 2|A_0|^2 |T_{10}|^{1/2} |\tilde{T}_1|^{1/2} |\overline{U}_2||\overline{U}_1| \quad (7)$$

$$\cos[\phi + (\tilde{\varphi}_1 - \varphi_2)] + \frac{1}{2!}\left(\frac{d^2E}{dJ^2}\right)_{J'}$$

$$\left[2|A_0|^2|T_{10}|^{1/2}|\tilde{T}_1|^{1/2}|\overline{U}_2||\overline{U}_1|\right]^2 \cos^2[\phi + (\tilde{\varphi}_1 - \varphi_2)] +$$

$$\frac{1}{3!}\left(\frac{d^3E}{dJ^3}\right)_{J'} \left[2|A_0|^2|T_{10}|^{1/2}|\tilde{T}_1|^{1/2}|\overline{U}_2||\overline{U}_1|\right]^3$$

$$\cos^3[\phi + (\tilde{\varphi}_1 - \varphi_2)] + \ldots,$$

$$J' = |A_0|^2(\tilde{T}_1|\overline{U}_1|^2 + T_{10}|\overline{U}_2|^2), \quad (8)$$

where $\overline{U}_1$ and $\overline{U}_2$ are the spatial response functions of the first and second beams, respectively, at a location in the recording medium wherein spatial response functions $\overline{U}_1$ and $\overline{U}_2$ correspond to the integrals of the spatial impulse response functions of the optical system [see Eq. (16) and related description] over the complex amplitudes of the first and second beams in the object space, $\Phi$ is the relative phase of the measurement and reference beams generated by the optical system at the location in the recording medium, and E(J) is the exposure induced change in the recording medium at the location generated by an integrated flux J. For a linear recording medium, the second and higher order derivative terms of E(J) with respect to J in Eq. (7) are zero.

Attention is paid to the magnitude and functional dependence of E(J) on the integrated flux J in the selection of a particular recording medium and in the optimum value of the integrated flux J used in generation of a topographic interference signal S.

Topographic interference signal S generated by exposure induced changes in the recording medium is given within a scale factor [see Eq. (7)] as $$S = \left(\frac{dE}{dJ}\right)_{J'} \left[2|A_0|^2|\tilde{T}_1|^{1/2}|T_{10}|^{1/2}|\overline{U}_2||\overline{U}_1|\right] \quad (9)$$

-continued $$\cos[\phi + (\tilde{\varphi}_1 - \varphi_2)] + \frac{1}{2!}\left(\frac{d^2 E}{dJ^2}\right)_{J'}$$

$$\left[2|A_0|^2|\tilde{T}_1|^{1/2}|T_{10}|^{1/2}|\overline{U}_2||\overline{U}_1|\right]^2 \cos^2[\phi + (\tilde{\varphi}_1 - \varphi_2)] +$$

$$\frac{1}{3!}\left(\frac{d^3 E}{dJ^3}\right)_{J'}\left[2|A_0|^2|\tilde{T}_1|^{1/2}|T_{10}|^{1/2}|\overline{U}_2||\overline{U}_1|\right]^3$$

$$\cos^3[\phi + (\tilde{\varphi}_1 - \varphi_2)] + \ldots$$

Non-linear properties of the recording medium and a dependence of $\tilde{T}_1$ on $(\phi_1-\phi_2)$ generate terms in topographic interference signal S with phases that are harmonics of phase $[\Phi+(\tilde{\phi}_1-\phi_2)]$phase $(\phi_1-\phi_2)$ and/or combinations thereof [see Eq. (9)]. Such harmonic terms are treated herein as cyclic error terms in the topographic interference signal S. The effects of the cyclic error terms are managed in embodiments of the present invention by a series of steps such as described herein in the subsection entitled "Management of Cyclic Errors: Reduction, Elimination, and/or Compensation."

The apodizing at the edges of test object 1012 is introduced in order to reduce the effects of Fresnel diffraction at the site where the topographic interference signal is measured and at an adjacent region of the site if required in transverse differential interferometric measurements of exposure induced changes in the recording medium. In the particular design presented for test object 1012, the apodizing is introduced by absorbing layer 1020 and non-absorbing layer 1022 by selecting the transmission of absorbing layer 1020, the net phase shift of absorbing layers 1020 and non-absorbing layer 1022 mod $2\pi$, and the corresponding radial dimension $r_2-r_1$ (see FIG. 3a). The apodization is used to reduce the effects of diffraction in the image of aperture 1032 formed by the optical system. Other forms of apodizing may be used without departing from the scope and spirit of implementations of the present invention.

Calibration of Test Objects

Test objects such as test object 1012 are calibrated in embodiments of the present invention to determine the respective values of relative phases $\phi_1-\phi_2$ and the respective ratios of the amplitudes of the first and second beams at test object 1012. The measured values of relative phases $\phi_1-\phi_2$ and the ratios of amplitudes $|\tilde{T}_1|^{1/2}/|T_{10}|^{1/2}$ are used instead of an assumed set of relative phases and ratios of amplitudes in homodyne detection methods to obtain conjugated quadratures from topographic interference signals. If for example, an assumed set of relative phases is used in a homodyne detection method, errors are introduced in the derived values of conjugated quadratures such as described in Section 11 entitled "Error Sources And Measured Limitations" of the review article article by J. Schwider entitled "Advanced Evaluation Techniques In Interferometry," *Progress In Optics* XXVII, Ed. E. Wolf (Elsevier Science Publishers 1990)]. The measured values of relative phases $\phi_1-\phi_2$ are of particular value in the determination of the image plane of a PO such as subsequently described herein in the subsection entitled "Location of Image Plane of Optical System."

The metrology system used for calibration of test objects is shown diagrammatically in FIGS. 3d and 3e. With reference to FIG. 3d, envelops of the first and second beams transmitted by test object 1012 are shown. The boundaries indicated by numerals 1040A and 1040B of the first beam diverges at a much faster rate than the boundaries indicated by numerals 1042A and 1042B of the second beam because of different diffraction effects. The metrology system is configured to measure the interference pattern generated by the first and second beams at a distance of h from test object 1012 where the diameters of the first and second beams are approximately the same. The element numbers of elements of test object 1012 shown in FIG. 3d are the same as the element numbers of corresponding elements of test object 1012 shown in FIG. 3a.

A mask 1130 is located at the distance h from test object 1012 where the diameters of the first and second beams are approximately the same. The wavefronts of the first and second beams are shown as 1040 and 1042, respectively, near mask 1130. Mask 1130 comprises an array of apertures 1132 with diameters b that are less than the wavelength of the spatial structure in the interference pattern generated by the detection of the first and second beams in the plane defined by mask 1130. The position of mask 1130 is controlled and scanned by transducer 1170 and signal 1172 from processor 1160. With reference to FIG. 3e, portions of the first and second beams transmitted by the array of apertures 1132 as beam 1140 are focused by lens 1136 as a mixed beam 1142 to form images of apertures 1132 on a multi-pixel detector 1150. Detector 1150 such as a CCD detector generates electrical interference signals which are transmitted to processor 1160 as signal 1152.

Properties of the interference pattern are measured by scanning mask 1130 across the wavefronts 1040 and 1042 to obtain a two-dimensional image of the interference pattern generated by detection of mixed beam 1142. The interference pattern will generally comprise a bull's eye pattern when mask 1130 is aligned perpendicular to the paths of the first and second beams from test object 1012. The measured properties of the interference pattern are processed by processor 1160 for information about the respective value of relative phase $\phi_1-\phi_2$ and the respective ratio of the amplitudes of the first and second beams from test object 1012. In particular, the diameters of the rings of the bull's eye pattern are used to determine the relative phase $\phi_1-\phi_2$ and the contrast of the interference pattern is used to determine the ratio of the amplitudes of the first and second beams from test object 1012.

Management of Cyclic Errors Encountered with Exposure Induced Changes in Recording Medium: Reduction, Elimination, and/or Compensation Effects of the cyclic errors such as represented in Eq. (9) are managed in embodiments of the present invention through a series of procedures. The series of procedures reduce, eliminate, and/or compensate effects of the cyclic errors. The cyclic errors that are generated as a result of certain properties of $\tilde{T}_1$ of the test object are reduced or eliminated in a first procedure through the reduction or elimination of the source the corresponding cyclic errors. The even harmonics cyclic errors generated by non-linear properties of the recording medium are eliminated in a second procedure through the design of the homodyne detection method used to obtain information about conjugated quadratures corresponding to a topographic interference signal S. In a third procedure, third and higher odd harmonic cyclic errors generated by the non-linear properties of the recording medium are reduced by the design of certain scaling factors. In the fourth procedure, properties of the third harmonic cyclic error generated by the non-linear properties of the recording medium are obtained from the properties of the corresponding first harmonic term in topographic interference signal S and used in conjunction with measured non-linear properties of the recording medium to compensate for the effects of the third harmonic cyclic errors.

First Procedure: Reduction or Elimination of a Potential Primary Source of Cyclic Errors Generated with Exposure Induced Changes in Recording Medium A primary source of cyclic errors is a set of test objects that have been constructed such that the respective set of $\tilde{T}_1$, exhibit a dependence on $(\phi_1-\phi_2)$ [see Eq. (4)]. The potential primary source is reduced or eliminated in the first procedure through the design of a set of test objects used to obtain conjugated quadratures information about topographic interference signal S. In particular, the potential primary source is reduced or eliminated in the first procedure by the selection of $|T_1|^{1/2}$ and $|T_{10}|^{1/2}$ for each of the respective test objects of the set of test objects such that $\tilde{T}_1$ and $T_{10}$ are the same for each of the test objects of the set of test objects.

The values of transmission coefficients $\tilde{T}_1$ and $T_{10}$ are designed to be the same for each of the test objects of the set of test objects so as to obtain the condition that $J'/|A_0|^2$ is the same for each test object of the set of test objects [see Eq. (8)]. When the condition of the first step is met, the contribution of the E(J') term in Eq. (7) is easily eliminated in a homodyne detection method subsequently used to obtain conjugated quadratures information about measured values of the topographic signal S in conjunction with the reduction or elimination of the potential primary source.

The information about the conjugated quadratures of topographic interference signal S is obtained in a homodyne detection method from a set of measurements of E corresponding to a set of relative phase shifts $(\tilde{\phi}_1-\phi_2)$, e.g., $\pi/4$, $3\pi/4$, $5\pi/4$, and $7\pi/4$. The set of relative phase shifts $(\tilde{\phi}_1-\phi_2)$ are generated in the set of corresponding test objects by selecting the $(\tilde{\phi}_1-\phi_2)$ of the set of corresponding test objects to be within a phase offset the set of relative phase shifts mod $2\pi$. The set of measurements of E may be either obtained sequentially with test objects of a set of test objects being placed sequentially in an object space, simultaneous with a corresponding set of test objects located simultaneously in an isoplanatic region of an object space and the corresponding beam from a source incident simultaneously on the set of test objects, or some combination thereof, e.g., with subsets of the set of test objects located simultaneously in an isoplanatic region of an object space and the corresponding beam from a source incident simultaneously on the subset of the set of test objects.

A formula for $|T_1|^{1/2}$ in terms of $|\tilde{T}_1|^{1/2}$, $|T_{10}|^{1/2}$, and relative phase $(\phi_1-\phi_2)$ is obtained by solving Eq. (4) for $|T_1|^{1/2}$ which is a quadratic equation in $|T_1|^{1/2}$. That formula is $$|T_1|^{1/2} = |T_{10}|^{1/2}\cos(\varphi_1 - \varphi_2) + \left[\tilde{T}_1 - T_{10}\sin^2(\varphi_1 - \varphi_2)\right]^{1/2}, \quad (10)$$

or a corresponding formula for $|T_1|^{1/2}/|T_{10}|^{1/2}$ is $$\frac{|T_1|^{1/2}}{|T_{10}|^{1/2}} = \cos(\varphi_1 - \varphi_2) + \left[\frac{\tilde{T}_1}{T_{10}} - \sin^2(\varphi_1 - \varphi_2)\right]^{1/2}. \quad (11)$$

The expression for $|T_1|^{1/2}/|T_{10}|^{1/2}$ given by Eq. (11) is substituted into Eq. (6) to obtain an equation for $(\tilde{\phi}_1-\phi_2)$ in terms of $|\tilde{T}_1|^{1/2}$, $|T_{10}|^{1/2}$, and relative phase $(\phi_1-\phi_2)$, i.e., $$\tilde{\varphi}_1 - \varphi_2 = \left(\frac{\varphi_1 - \varphi_2}{2}\right) + \quad (12)$$

$$\operatorname{atan}\left[\left\{\frac{\left(\left[\frac{\tilde{T}}{T_{10}} - \sin^2(\varphi_1 - \varphi_2)\right]^{1/2} + \right)}{\cos(\varphi_1 - \varphi_2) + 1}\right\} \tan\left(\frac{\varphi_1 - \varphi_2}{2}\right)\right].$$

Eq. (12) is a transcendental equation for $(\phi_1-\phi_2)$ in terms of $(\tilde{\phi}_1-\phi_2)$ and $\tilde{T}_1/T_{10}$.

An example of solutions of transcendental Eq. (12) for $(\phi_1-\phi_2)$ with $\tilde{T}_1/T_{10}=25$ and phase shifts $(\tilde{\phi}_1-\phi_2)$ equal to $\pi/4$, $3\pi/4$, $5\pi/4$, and $7\pi/4$ are listed in Table 1. The selection of $\tilde{T}_1/T_{10}=25$ is based in part on considerations made in the third procedure subsequently described. For the set of solutions listed in Table 1, the values of $|\tilde{T}_1|^{1/2}$ and $|T_{10}|^{1/2}$ are parameters to be subsequently selected by other considerations in an end use application with the limitations that $|\tilde{T}_1|^{1/2} \leq 0.8695$ ($0.8695=5/5.7507$) and $|T_{10}|^{1/2} \leq 0.1739$ ($0.8695/\sqrt{25}$).

TABLE 1

Solutions of Transcendental Equation
$\tilde{T}_1/T_{10} = 25$

| $(\tilde{\phi}_1 - \phi_2)$ deg | $(\phi_1 - \phi_2)$ deg | $\frac{|T_1|^{1/2}}{|T_{10}|^{1/2}}$ |
|---|---|---|
| 45 | 37.9371 | 5.7507 |
| 135 | 125.6465 | 4.3507 |
| 225 | 234.3535 | 4.3507 |
| 315 | 322.0629 | 5.7507 |

Second Procedure: Elimination of Even Harmonic Cyclic Errors Generated with Exposure Induced Changes in Recording Medium Application of the first procedure reduces or eliminates the contribution of the E(J') term in Eq. (7) in addition to the elimination of the potential primary source of the cyclic errors that are harmonics of $(\phi_1-\phi_2)$ including the first harmonic of phase $(\phi_1-\phi_2)$ in processing measured values of E(J) for information about the conjugated quadratures of a topographic signal S. The remaining cyclic errors are harmonics of phase $(\Phi+\phi_1-\phi_2)$.

In the second procedure, the cyclic errors that are even harmonics of phase $(\phi+\Phi_1-\Phi_2)$ are reduced or eliminated in the processing of measured values of E(J) for information about the conjugated quadratures of a topographic signal S. The second procedure comprises selecting the product $|\tilde{T}_1|^{1/2}$, $|T_{10}|^{1/2}$ to equal some fixed value for a corresponding set of test objects having a corresponding set of phase shifts $(\tilde{\phi}_1-\phi_2)$ such as $\pi/4$, $3\pi/4$, $5\pi/4$, and $7\pi/4$ and by the selection of a homodyne detection method. For the solution listed in Table 1, the available values for selection are $|\tilde{T}_1|^{1/2}|T_{10}|^{1/2} \leq 0.151$.

The selection of the homodyne detection method is based on consideration of the condition that the cyclic error contributions that are even harmonics of $(\Phi+\phi_1-\phi_2)$ be eliminated when the product $|\tilde{T}_1|^{1/2}|T_{10}|^{1/2}$ is equal to some fixed value for the corresponding set of test objects. An example of a homodyne detection method that meets the condition of the second procedure is based on the measurement of four values of E(J) for information about the conjugated quadratures of a topographic signal S with the corresponding set of phase shifts that are mod $\pi/2$. The set of phase shifts $0$, $\pi/2$, $\pi$, and $3\pi/2$ and the set of phase shifts $\pi/4$, $3\pi/4$, $5\pi/4$, and $7\pi/4$ are two examples of sets of phase shifts that meet the condition of the second procedure [see Eq. (9)].

The topographic interference signal with the even harmonic cyclic errors eliminated by the second procedure is referenced hereinafter as $S_O$.

Third Procedure: Amplitude Reduction of Odd Harmonic Cyclic Errors Generated with Exposure Induced Changes in Recording Medium The magnitudes of the third and higher odd harmonic cyclic errors that are harmonics of phase $(\Phi + \phi_1 - \phi_2)$ are reduced in the third procedure through the selection of a scaling factor. That scaling factor is $|\tilde{T}_1||T_{10}|$ which appears in the ratio of the amplitudes of two contiguous cyclic error terms that are odd harmonics of phase $(\Phi + \phi_1 - \phi_2)$ [see Eq. (9)]. For the solution listed in Table 1, the scale factor $|\tilde{T}_1||T_{10}|$ was designed with the third procedure in mind where $\tilde{T}_1 T_{10} \leq 0.0229$ ($\tilde{T}_1 T_{10} \leq 1/43.7$). Thus the effects of the higher odd harmonics of phase $(\Phi + \phi_1 - \phi_2)$ decrease rapidly with harmonic order.

Fourth Procedure: Compensation of Odd Harmonic Cyclic Errors Generated with Exposure Induced Changes in Recording Medium In the fourth procedure, properties of the third harmonic cyclic error generated by non-linear properties of the recording medium are obtained from the corresponding first harmonic term in topographic interference signal S and used in conjunction with measured non-linear properties of the recording medium to compensate for effects of the third harmonic cyclic error.

The cube of topographic interference signal S given by Eq. (9) with the even harmonic cyclic errors eliminated by the second procedure, i.e., $S_O$, is $$S_o^3 = \left[\left(\frac{dE}{dJ}\right)_{J'}\right]^3 (2|A_0|^2|\tilde{T}_1|^{1/2}|T_{10}|^{1/2}|\overline{U}_2||\overline{U}_1|)^3 \quad (13)$$

$$\cos^3[\phi + (\tilde{\varphi}_1 - \varphi_2)] + \frac{3}{3!}\left[\left(\frac{dE}{dJ}\right)_{J'}\right]^2 \left(\frac{d^3E}{dJ^3}\right)_{J'}$$

$$(2|A_0|^2|\tilde{T}_1|^{1/2}|T_{10}|^{1/2}|\overline{U}_2||\overline{U}_1|)^5 \times \cos^5[\phi + (\tilde{\varphi}_1 - \varphi_2)] + \ldots$$

The non-linear properties of the recording medium represented by $d^n E(J)/dJ^n$ are measured independently of the measurement of the set of measurements of E(J) used to obtain values of topographic interference signal $S_O$. The measured non-linear properties are next used with Eq. (13) to obtain the following compensating signal $$\frac{1}{3!}S_o^3\left[\left(\frac{dE}{dJ}\right)_{J'}\right]^{-3}\left(\frac{d^3E}{dJ^3}\right)_{J'} = +\frac{1}{3!}\left(\frac{d^3E}{dJ^3}\right)_{J'} \quad (14)$$

$$[2|A_0|^2|\tilde{T}_1|^{1/2}|T_{10}|^{1/2}|\overline{U}_2||\overline{U}_1|]^3 \cos^3[\phi + (\tilde{\varphi}_1 - \varphi_2)] +$$

$$\frac{1}{3!}\frac{3}{3!}\left[\left(\frac{dE}{dJ}\right)_{J'}\right]^{-1}\left[\left(\frac{d^3E}{dJ^3}\right)_{J'}\right]^2 \times$$

-continued $$[2|A_0|^2|\tilde{T}_1|^{1/2}|T_{10}|^{1/2}|\overline{U}_2||\overline{U}_1|]^5 \cos^5[\phi + (\tilde{\varphi}_1 - \varphi_2)] + \ldots$$

The third order compensating term given by Eq. (14) is subtracted from topographic signal $S_O$ given by Eq. (9) with the even harmonic cyclic error terms eliminated by the second procedure to obtain compensated topographic signal $S_C$ with the result $$S_c = S_o - \frac{1}{3!}S_o^3\left[\left(\frac{dE}{dJ}\right)_{J'}\right]^{-3}\left(\frac{d^3E}{dJ^3}\right)_{J'} \quad (15)$$

$$= \left(\frac{dE}{dJ}\right)_{J'}[2|A_0|^2|\tilde{T}_1|^{1/2}|T_{10}|^{1/2}|\overline{U}_2||\overline{U}_1|]\cos[\phi + (\tilde{\varphi}_1 - \varphi_2)] +$$

$$\left\{\frac{1}{5!}\left(\frac{d^5E}{dJ^5}\right)_{J'} - \frac{1}{3!}\frac{3}{3!}\left[\left(\frac{dE}{dJ}\right)_{J'}\right]^{-1}\left[\left(\frac{d^3E}{dJ^3}\right)_{J'}\right]^2\right\} \times$$

$$[2|A_0|^2|\tilde{T}_1|^{1/2}|T_{10}|^{1/2}|\overline{U}_2||\overline{U}_1|]^5 \cos^5[\phi + (\tilde{\varphi}_1 - \varphi_2)] + \ldots$$

With scaling factor $|\tilde{T}_1||T_{10}|$ such as the example used in the third procedure, i.e., $\tilde{T}_1 T_{10} \leq 1/43.7$, and other factors in Eq. (15), the magnitude of the remaining fifth harmonic cyclic error in $S_c$ has an amplitude $<1/2000$ of the amplitude of the first harmonic signal term in $\tilde{S}_c$. A cyclic error with a relative amplitude of $<1/2000$ will generate an error in the relative phase of the respective conjugated quadratures of $\tilde{S}_c$ that is $<0.5$ mrad which corresponds to subnanometer metrology.

It will be evident to one skilled in the art that the technique of the fourth procedure can also be used to generate compensating signals for fifth and higher odd harmonic cyclic errors as well as even harmonic cyclic errors without departing from the scope or spirit of the fourth procedure used in embodiments of the present invention.

It will also be evident to one skilled in the art that a subset of the four procedures may be used in the management of cyclic errors without departing from the scope or spirit of the management of cyclic errors described herein for embodiments of the present invention.

Further description of homodyne methods that may be used to obtain the measured conjugated quadratures of compensated topographic interference signal $S_c$ is given in commonly owned U.S. Pat. No. 5,760,901 (ZI-05) entitled "Method and Apparatus for Confocal Interference Microscopy with Background Amplitude Reduction and Compensation" and U.S. Pat. No. 6,445,453 B1 (ZI-14) entitled "Scanning Interferometric Near-Field Confocal Microscopy;" U.S. patent applications Ser. No. 10/765,368 (ZI-47) entitled "Apparatus and Method for Joint Measurements of Conjugated Quadratures of Fields of Reflected/Scattered Beams by an Object in Interferometry" and Ser. No. 10/816,180 (ZI-50) entitled "Apparatus and Method for Joint Measurement of Fields of Scattered/Reflected Orthogonally Polarized Beams by an Object in Interferometry;" U.S. Provisional Application No. 60/602,046 (ZI-57) and U.S. patent application Ser. No. 11/204,758 (ZI-57) wherein both are entitled "Apparatus and Method for Joint And Time Delayed Measurements of Components of Conjugated Quadratures of Fields of Reflected/Scattered and Transmitted/Scattered Beams by an Object in Interferometry," and U.S. Provisional Application No. 60/611,564 (ZI-58) and U.S. patent application Ser. No. 11/229,314 (ZI-58) wherein both are entitled "Catoptric Imaging Systems Comprising Pellicle and/or Aperture-Array Beam-Splitters and Non-Adaptive and/or Adaptive Catoptric Surfaces." The two patents, the first of the two provisional patent applications, and the first three of the four patent applications are all by Henry A. Hill and the contents thereof are incorporated herein in their entirety by reference.

Spatial Impulse Response Function: Integral Transform of Pupil Function

The basic scalar diffraction integral for the spatial impulse response function U(X,Y) in image space is [see Section 9.1 of M. Born and E. Wolf, *Principles of Optics*, Pergamon, N.Y., 1970)]

$$U(P) = -\frac{i}{\lambda} \frac{e^{-ikR}}{R} \int\int \frac{Ae^{ik(\Phi+s)}}{s} dS \qquad (16)$$

where with reference to FIG. 3*f*, the integration extends over the portion of a Gaussian reference sphere 30 that approximately fills the exit pupil 32, A is the amplitude of the wave on Gaussian surface 30, Φ is the deformation of the wavefront 28 in the region of exit pupil 32 which is the difference in optical path length between points Q and Q̄, R is the radius of Gaussian reference surface 30, is the distance between point Q on Gaussian reference sphere 30 and an arbitrary point P, and k is the wavenumber 2π/λ. Radius R is measured between point C and P$_1$* where P$_1$* is the Gaussian image of an object point and the X and Y directions define a plane that is orthogonal to the optic axis of a corresponding imaging system. Note that a simplification is obtained with α=0 when the spatial impulse response function is measured in a plane that is perpendicular to the line between point C and point P$_1$*.

Cartesian coordinate systems are used for the exit pupil and the image space with centers located at points C and P$_1$*, respectively. The coordinates of Q and P are (ξ,η,ζ) and (X,Y,Z), respectively, with the ξ and X directions located in the meridional plane (the plane containing the object point and the axis of the system), the ζ direction parallel to the line from point C to point P$_1$*, and the Z direction parallel to the optic axis 34. The path difference (s−R) is expressed using the Pythagorean theorem as $$(s-R) = \left[\left[\{[R^2 - (\xi^2 + \eta^2)]^{1/2} + (X\sin\alpha + Z\cos\alpha)\}^2 + [\xi - (X\cos\alpha - Z\sin\alpha)]^2 + (\eta - Y)^2\right]\right]^{1/2} - R \qquad (17)$$

where sin α=X$_1$*/R and X$_1$* corresponds to the X coordinate of P$_1$*. The right hand side of Eq. (17) is simplified with the combination of certain terms to obtain $$(s-R) = \left\{\frac{R^2 + 2[R^2 - (\xi^2 + \eta^2)]^{1/2}(X\sin\alpha + Z\cos\alpha) - }{2\xi(X\cos\alpha - Z\sin\alpha) - 2\eta Y + X^2 + Y^2 + Z^2}\right\}^{1/2} - R. \qquad (18)$$

The integral transform of the generalized pupil function given by Eq. (16) is related to a two dimensional Fast Fourier Transform (FFT) for the case when second and higher order effects can be neglected, i.e., the two-dimensional FFT is with respect to X and Y of the generalized pupil function when linear terms in an expansion of the right hand side of Eq. (18) represent [(s−R)+(X²+Y²)/2R] with sufficient accuracy.

A description of properties of the spatial impulse response function is given herein based on a set of orthogonal polynomials and the Nijboer-Zernike theory for treatment of optical aberrations. The measurement beam with amplitude A$_1$ at the test object is used as a beam to probe the properties of the optical system. The description of this procedure is done in terms of the spatial impulse response function U of the optical system.

The spatial impulse response function U of an imaging system at wavelength λ is the image of a mathematical delta function, but in practice an object having a diameter <λ̃/4NA is a fair approximation. By using an object with a larger diameter or dimension apertures, the properties of the imaging system can be examined as a function of effective numeral aperture NA used. The spatial impulse response function is denoted as U(x,y,z). The relationship between normalized image coordinates (x,y,z) and the real space image coordinates (X,Y,Z) in the lateral and axial directions is given by $$x = X\left(\frac{NA}{\lambda}\right), \quad y = Y\left(\frac{NA}{\lambda}\right), \qquad (19)$$
$$r = (x^2 + y^2)^{1/2}, \quad (x, y) = (r\cos\vartheta, r\sin\vartheta),$$
$$z = kZ$$

where k is the wavenumber 2π/λ. Without loss of generality, the aberration phase Φ is represented as a series of orthonormal Zernike polynomials:

$$\Phi = \sum_{n=0}^{\infty} \sum_{m=0}^{n} [a_{nm}R_n^m(\rho)\cos(m\vartheta) + a'_{nm}R_n^m(\rho)\sin(m\vartheta)], \qquad (20)$$
$$0 \le \rho \le 1, \; a_{nm} \text{ and } a'_{nm} \text{ real}, (n-m) \text{ even}.$$

The orthonormal Zernike polynomials and the notation for the respective fringe coefficients defined in "Zernike Polynomials And Atmospheric Turbulence" by R. J. Noll, *JOSA* 66(3), p 207 (1976) are used herein to represent the lens aberrations. Selected Zernike polynomials are listed in Table 2.

We have for U in the first-order approximation $$U \approx 2e^{ik(z+f)} \int_0^1 \rho e(if\rho^2) J_0(2\pi\rho r) d\rho + \qquad (21)$$
$$2i\sum_{n,m} [a_{nm}i^m\cos m\vartheta + a'_{nm}i^m\sin m\vartheta] \times$$
$$\int_0^1 \rho e(if\rho^2) R_n^m(\rho) J_m(2\pi\rho r) d\rho$$

where f is a defocus factor. Defocus factor f will in general be some function of λ, NA, and the real space image coordinate Z (a change in f=π/2 corresponds to one focal depth). An example of a functional relationship between f and Z applicable for values of NA<0.7 is given by the expression $$f = \frac{2\pi}{\lambda}Z[1 - (1 - NA^2)^{1/2}] \qquad (22)$$

[see discussion in Section 3 and Appendix A of the article by J. Braat, P. Dirksen, and A. J. E. M. Janssen supra].

The factors in Eq. (21) comprising integration with respect to ρ are $$\int_0^1 \rho e(iz\rho^2) R_n^m(\rho) J_m(2\pi\rho r) d\rho = \tag{23}$$

$$e^{ikz} \sum_{l=1}^{\infty} (-2iz)^{l-1} \sum_{j=0}^{p} \upsilon_{lj} \frac{J_{m+l+2j}(\upsilon)}{l\upsilon^l},$$

where $$\upsilon_{lj} = (-1)^p (m+l+2j) \binom{m+j+l-1}{l-1} \times \tag{24}$$

$$\binom{j+l-1}{l-1}\binom{l-1}{p-j}\binom{q+j+l}{l}^{-1},$$

$$j = 0, 1, \ldots, l = 1, 2, \ldots,$$

and $$\upsilon(r) = 2\pi r, \ p = \frac{1}{2}(n-m), \ q = \frac{1}{2}(n+m). \tag{25}$$

TABLE 2

Zernike Polynomials

| (n, m) | Name | $R_n^m(\rho)\cos(m\theta)$ | Term |
|---|---|---|---|
| (0, 0) | Piston | 1 | $Z_1$ |
| (1, 1) | Tilt | $2\rho\cos\theta$ | $Z_2$ |
| (2, 0) | Defocus | $\sqrt{3}(2\rho^2 - 1)$ | $Z_4$ |
| (2, 2) | Astigmatism | $\sqrt{6}\rho^2\cos 2\theta$ | $Z_6$ |
| (3, 1) | X-Coma | $\sqrt{8}(3\rho^3 - 2\rho)\cos\theta$ | $Z_8$ |
| (3, 3) | X-Three Point | $\sqrt{8}\rho^3\cos 3\theta$ | $Z_{10}$ |
| (4, 0) | 3$^{rd}$ order Spherical | $\sqrt{5}(6\rho^4 - 6\rho^2 + 1)$ | $Z_{11}$ |
| (4, 2) | | $\sqrt{10}(4\rho^4 - 3\rho^2)\cos 2\theta$ | $Z_{12}$ |

For l=1, 2, 3, and 4, the respective series over j on the right hand side of Eq. 23 reduces to only the terms with j=p; j=p, p−1 j=p, p−1, p−2; and j=p, p−1, p−2, p−3; respectively; as a result of the binomial coefficient $$\binom{l-1}{p-j}$$

on the right-hand side of Eq. 24. Accordingly the non-zero values for $\nu_{1,j}$ for l=1, 2, 3, and 4 are easily evaluated with the following results:

$$\nu_{1,j} = (-1)^p, \ j = p; \tag{26}$$

$$\upsilon_{2,j} = \begin{cases} (-1)^p \dfrac{(n+m+2)(n-m+2)}{2(n+1)}, & j = p, \\ (-1)^p \dfrac{(n+m)(n-m)}{2(n+1)}, & j = p-1, j \geq 0; \end{cases} \tag{27}$$

$$\upsilon_{3,j} = \begin{cases} (-1)^p \dfrac{3}{32} \dfrac{(n+m+4)(n+m+2)(n-m+4)(n-m+2)}{(n+2)(n+1)}, & j = p, \\ (-1)^p \dfrac{6}{32} \dfrac{(n+m+2)(n+m)(n-m+2)(n-m)}{(n+2)n}, & j = p-1, j \geq 0, \\ (-1)^p \dfrac{3}{32} \dfrac{(n+m)(n+m-2)(n-m)(n-m-2)}{(n+1)n}, & j = p-2, j \geq 0, \end{cases} \tag{28}$$

$$\upsilon_{4,j} = \begin{cases} (-1)^p \dfrac{1}{3\cdot 32} \dfrac{\begin{bmatrix}(n+m+6)(n+m+4)(n+m+2)\times\\(n-m+6)(n-m+4)(n-m+2)\end{bmatrix}}{(n+3)(n+2)(n+1)}, & j = p, \\ (-1)^p \dfrac{3}{3\cdot 32} \dfrac{\begin{bmatrix}(n+m+4)(n+m+2)(n+m)\times\\(n-m+4)(n-m+2)(n-m)\end{bmatrix}}{(n+3)(n+2)n}, & j = p-1, j \geq 0, \\ (-1)^p \dfrac{3}{3\cdot 32} \dfrac{\begin{bmatrix}(n+m+2)(n+m)(n+m-2)\times\\(n-m+2)(n-m)(n-m-2)\end{bmatrix}}{(n+2)(n+1)(n-1)}, & j = p-2, j \geq 0, \\ (-1)^p \dfrac{1}{3\cdot 32} \dfrac{\begin{bmatrix}(n+m)(n+m-2)(n+m-4)\times\\(n-m)(n-m-2)(n-m-4)\end{bmatrix}}{(n+1)n(n-1)}, & j = p-3, j \geq 0. \end{cases} \tag{29}$$

The degree (m+l+2j) of the Bessel function in the right-hand side of Eq. 23 also reduces to simple values for l=1, 2, 3, and 4, i.e.

$$(m+l+2j) = \begin{cases} n+1, & l=1, \quad j=p, \\ n+2, & l=2, \quad j=p, \\ n, & l=2, \quad j=p-1, \quad j \geq 0, \\ n+3, & l=3, \quad j=p, \\ n+1, & l=3, \quad j=p-1, \quad j \geq 0, \\ n-1, & l=3, \quad j=p-2, \quad j \geq 0 \\ n+4, & l=4, \quad j=p, \\ n+2, & l=4, \quad j=p-1, \quad j \geq 0, \\ n, & l=4, \quad j=p-2, \quad j \geq 0, \\ n-2, & l=4, \quad j=p-3, \quad j \geq 0. \end{cases} \quad (30)$$

The properties of the representation of the effects of aberrations and changes in optic axis location are used to invert measured topographic interferometric signals such as subsequently described for information about the aberrations, image plane location, and optic axis location. It is useful in the following descriptions to examine the spatial impulse response function U as the sum of the first few terms of the expansion given by 23 instead of individual expansion terms. Using Eq. (21) and Eqs. 26 through (29), the complex spatial impulse response function U is expressed as $$U(r, \vartheta, z) = \quad (31)$$
$$2e^{i(z+f)}\{g_{0,0}(1+i\alpha_{0,0}) - g_{1,1}(\alpha_{1,1}\cos\vartheta + \alpha'_{1,1}\sin\vartheta) - ig_{2,0}\alpha_{2,0} -$$
$$ig_{2,2}(\alpha_{2,2}\cos 2\vartheta + \alpha'_{2,2}\sin 2\vartheta) +$$
$$g_{3,1}(\alpha_{3,1}\cos\vartheta + \alpha'_{3,1}\sin\vartheta) + g_{3,3}(\alpha_{3,3}\cos 3\vartheta + \alpha'_{3,3}\sin 3\vartheta) +$$
$$ig_{4,0}\alpha_{4,0} + ig_{4,2}(\alpha_{4,2}\cos 2\vartheta + \alpha'_{4,2}\sin 2\vartheta) +$$
$$ig_{4,4}(\alpha_{4,4}\cos 4\vartheta + \alpha'_{4,4}\sin 4\vartheta) -$$
$$g_{5,1}(\alpha_{5,1}\cos\vartheta + \alpha'_{5,1}\sin\vartheta) - g_{5,3}(\alpha_{5,3}\cos 3\vartheta + \alpha'_{5,3}\sin 3\vartheta) -$$
$$g_{5,5}(\alpha_{5,5}\cos 5\vartheta + \alpha'_{5,5}\sin 5\vartheta) - ig_{6,0}\alpha_{6,0} -$$
$$ig_{6,2}(\alpha_{6,2}\cos 2\vartheta + \alpha'_{6,2}\sin 2\vartheta) -$$
$$ig_{6,4}(\alpha_{6,4}\cos 4\vartheta + \alpha'_{6,4}\sin 4\vartheta) -$$
$$ig_{6,6}(\alpha_{6,6}\cos 6\vartheta + \alpha'_{6,6}\sin 6\vartheta) + \ldots \}.$$

where the $g_{n,m}$ are a functions of v and z which are given by the following equations:

$$g_{0,0}(v, z) = \begin{bmatrix} \frac{J_1(v)}{v} + (-2if)\frac{J_2(v)}{v^2} + \\ (-2if)^2 \frac{J_3(v)}{v^3} + (-2if)^3 \frac{J_4(v)}{v^4} + \ldots \end{bmatrix}, \quad (32)$$

$$g_{1,1}(v, z) = \begin{bmatrix} \frac{J_2(v)}{v} + (-2if)\frac{J_3(v)}{v^2} + \\ (-2if)^2 \frac{J_4(v)}{v^3} + (-2if)^3 \frac{J_5(v)}{v^4} + \ldots \end{bmatrix}, \quad (33)$$

$$g_{2,0}(v, z) = \begin{bmatrix} \frac{J_3(v)}{(v)} + (-2if)\left(\frac{1}{3}\frac{J_2(v)}{v^2} + \frac{4}{3}\frac{J_4(v)}{v^2}\right) + \\ (-2if)^2\left(\frac{1}{2}\frac{J_3(v)}{v^3} + \frac{3}{2}\frac{J_5(v)}{v^3}\right) + \\ (-2if)^3\left(\frac{2}{5}\frac{J_4(v)}{v^4} + \frac{8}{5}\frac{J_6(v)}{v^4}\right) + \ldots \end{bmatrix}, \quad (34)$$

$$g_{2,2}(v, z) = \begin{bmatrix} \frac{J_3(v)}{v} + (-2if)\frac{J_4(v)}{v^2} + \\ (-2if)^2 \frac{J_5(v)}{v^3} + (-2if)^3 \frac{J_6(v)}{v^4} + \ldots \end{bmatrix}, \quad (35)$$

$$g_{3,1}(v, z) = \begin{bmatrix} \frac{J_4(v)}{v} + (-2if)\left(\frac{1}{2}\frac{J_3(v)}{v^2} + \frac{3}{2}\frac{J_5(v)}{v^2}\right) + \\ (-2if)^2\left(\frac{4}{5}\frac{J_4(v)}{v^3} + \frac{9}{5}\frac{J_6(v)}{v^3}\right) + \\ (-2if)^3\left(\frac{J_5(v)}{v^4} + 2\frac{J_7(v)}{v^4}\right) + \ldots \end{bmatrix}, \quad (36)$$

$$g_{3,3}(v, z) = \begin{bmatrix} \frac{J_4(v)}{v} + (-2if)\frac{J_5(v)}{v^2} + \\ (-2if)^2 \frac{J_6(v)}{v^3} + (-2if)^3 \frac{J_7(v)}{v^4} + \ldots \end{bmatrix}, \quad (37)$$

$$g_{4,0}(v, z) = \begin{bmatrix} \frac{J_5(v)}{v} + (-2if)\left(\frac{4}{5}\frac{J_4(v)}{v^2} + \frac{9}{5}\frac{J_6(v)}{v^2}\right) + \\ (-2if)^2\left(\frac{1}{10}\frac{J_3(v)}{v^3} + \frac{3}{2}\frac{J_5(v)}{v^3} + \frac{12}{5}\frac{J_7(v)}{v^3}\right) + \\ (-2if)^3\left(\frac{1}{5}\frac{J_4(v)}{v^4} + \frac{72}{35}\frac{J_6(v)}{v^4} + \frac{20}{7}\frac{J_8(v)}{v^4}\right) + \ldots \end{bmatrix}, \quad (38)$$

$$g_{4,2}(v, z) = \begin{bmatrix} \frac{J_5(v)}{v} + (-2if)\left(\frac{3}{5}\frac{J_4(v)}{v^2} + \frac{8}{5}\frac{J_6(v)}{v^2}\right) + \\ (-2if)^2\left(\frac{J_5(v)}{v^3} + 2\frac{J_7(v)}{v^3}\right) + \\ (-2if)^3\left(\frac{9}{7}\frac{J_6(v)}{v^4} + \frac{16}{7}\frac{J_8(v)}{v^4}\right) + \ldots \end{bmatrix}, \quad (39)$$

$$g_{4,4}(v, z) = \begin{bmatrix} \frac{J_5(v)}{v} + (-2if)\frac{J_6(v)}{v^2} + \\ (-2if)^2 \frac{J_7(v)}{v^3} + (-2if)^3 \frac{J_8(v)}{v^4} + \ldots \end{bmatrix}, \quad (40)$$

$$g_{5,1}(v, z) = \begin{bmatrix} \frac{J_6(v)}{v} + (-2if)\left(\frac{J_5(v)}{v^2} + 2\frac{J_7(v)}{v^2}\right) + \\ (-2if)^2\left(\frac{1}{5}\frac{J_4(v)}{v^3} + \frac{72}{35}\frac{J_6(v)}{v^3} + \frac{20}{7}\frac{J_8(v)}{v^3}\right) + \\ (-2if)^3\left(\frac{3}{7}\frac{J_5(v)}{v^4} + 3\frac{J_7(v)}{v^4} + \frac{25}{7}\frac{J_9(v)}{v^4}\right) + \ldots \end{bmatrix}, \quad (41)$$

$$g_{5,3}(v, z) = \begin{bmatrix} \frac{J_6(v)}{v} + (-2if)\left(\frac{4}{3}\frac{J_5(v)}{v^2} + \frac{5}{3}\frac{J_7(v)}{v^2}\right) + \\ (-2if)^2\left(\frac{8}{7}\frac{J_6(v)}{v^3} + \frac{15}{7}\frac{J_8(v)}{v^3}\right) + \\ (-2if)^3\left(\frac{3}{2}\frac{J_7(v)}{v^4} + \frac{5}{2}\frac{J_9(v)}{v^4}\right) + \ldots \end{bmatrix}, \quad (42)$$

$$g_{5,5}(v, z) = \begin{bmatrix} \frac{J_6(v)}{v} + (-2if)\frac{J_7(v)}{v^2} + \\ (-2if)^2 \frac{J_8(v)}{v^3} + (-2if)^3 \frac{J_9(v)}{v^4} + \ldots \end{bmatrix}, \quad (43)$$

-continued $$g_{6,0}(v, z) = \begin{bmatrix} \frac{J_7(v)}{v} + (-2if)\left(\frac{9}{7}\frac{J_6(v)}{v^2} + \frac{16}{7}\frac{J_8(v)}{v^2}\right) + \\ (-2if)^2\left(\frac{3}{7}\frac{J_5(v)}{v^3} + 3\frac{J_7(v)}{v^3} + \frac{25}{7}\frac{J_9(v)}{v^3}\right) + \\ (-2if)^3\begin{pmatrix} \frac{1}{35}\frac{J_4(v)}{v^4} + \frac{35}{36}\frac{J_6(v)}{v^4} + \\ \frac{100}{21}\frac{J_8(v)}{v^4} + \frac{100}{21}\frac{J_{10}(v)}{v^4} \end{pmatrix} + \dots \end{bmatrix}, \quad (44)$$

$$g_{6,2}(v, z) = \begin{bmatrix} \frac{J_7(v)}{v} + (-2if)\left(\frac{8}{7}\frac{J_6(v)}{v^2} + \frac{15}{7}\frac{J_8(v)}{v^2}\right) + \\ (-2if)^2\left(\frac{2}{7}\frac{J_5(v)}{v^3} + \frac{5}{2}\frac{J_7(v)}{v^3} + \frac{45}{14}\frac{J_9(v)}{v^3}\right) + \\ (-2if)^3\begin{pmatrix} \frac{9}{14}\frac{J_7(v)}{v^4} + \frac{80}{21}\frac{J_9(v)}{v^4} + \\ \frac{25}{6}\frac{J_{10}(v)}{v^4} \end{pmatrix} + \dots \end{bmatrix}, \quad (45)$$

$$g_{6,4}(v, z) = \begin{bmatrix} \frac{J_7(v)}{v} + (-2if)\left(\frac{5}{7}\frac{J_6(v)}{v^2} + \frac{12}{7}\frac{J_8(v)}{v^2}\right) + \\ (-2if)^2\left(\frac{5}{4}\frac{J_7(v)}{v^3} + \frac{9}{4}\frac{J_9(v)}{v^3}\right) + \\ (-2if)^3\left(\frac{5}{6}\frac{J_7(v)}{v^4} + \frac{8}{3}\frac{J_9(v)}{v^4}\right) + \dots \end{bmatrix}, \quad (46)$$

$$g_{6,6}(v, z) = \begin{bmatrix} \frac{J_7(v)}{v} + (-2if)\frac{J_8(v)}{v^2} + \\ (-2if)^2\frac{J_9(v)}{v^3} + (-2if)^3\frac{J_{10}(v)}{v^4} + \dots \end{bmatrix}. \quad (47)$$

Properties of the leading term $J_n(v)/v$ of $g_{nm}$ are shown graphically in FIGS. 5a and 5b for even and odd values of n, respectively.

For a number of special cases the point spread function is well known. The in-focus (z=0), aberration free ($\alpha_{nm}=0$, except $\alpha_{0,0}$) spatial impulse response function corresponding to the first term $g_{0,0}$ on the right hand side of Eq. (31) is the Airy pattern $$U(r, \vartheta, z = 0) = (1 + i\alpha_{00})2\frac{J_1(v)}{v}, \alpha_{nm} = 0 \text{ except for } \alpha_{00}. \quad (48)$$

The out-of-focus on axis (v=0), aberration free ($\alpha_{nm}=0$ for $(n+m) \geq 1$) spatial impulse response function corresponding to first term $g_{0,0}$ on the right hand side of Eq. (31) comprising a series of terms is easily summed to obtain the well known depth response $$U(r = 0, \vartheta, z) = (1 + i\alpha_{0,0})\text{sinc}\left(\frac{f}{2}\right)e^{i(z+f/2)}, \quad (49)$$

$$v = 0, \alpha_{nm} = 0 \text{ for } (n+m) \geq 1.$$

The out-of-focus, aberration free ($\alpha_{nm}=0$ for $(n+m) \geq 1$) spatial impulse response function for $v \ll 1$ corresponding to first term goo on the right hand side of Eq. (31) comprising a series of terms is easily summed to obtain the depth response $$U(r, \vartheta, z) = (1 + i\alpha_{0,0})e^{iz} \times \quad (50)$$

$$\left\{\text{sinc}\left(\frac{f}{2}\right)e^{if/2} + i\left(\frac{v}{2}\right)^2\frac{1}{f}\left[1 - \text{sinc}\left(\frac{f}{2}\right)e^{-if/2}\right]e^{if} + \dots\right\},$$

$$v \ll 1, \alpha_{nm} = 0 \text{ for } (n+m) \geq 1.$$

The complex spatial impulse response function $\overline{U}_1$ of the first beam at an image plane where the complex amplitude $A_1$ is uniform in the object plane and the aberrations are zero except for $\alpha_{0,0}$ is evaluated by the integration of the spatial impulse response function $U(r,\theta,z)$ given by Eq. (31) over an aperture of radius $a_o$ with a corresponding normalized radius a in the object plane (see FIG. 3a). The result for $v_a \ll 1$ is $$\overline{U}_1(z) = \frac{1}{\pi}\left(\frac{\lambda}{NA}\right)^2 e^{i(z+f)} \times \quad (51)$$

$$\begin{bmatrix} (1 + i\alpha_{0,0})\sum_{s=1}^{\infty}(-1)^{s+1}\left(\frac{1}{s!}\right)^2\left(\frac{v_a}{2}\right)^{2s}M(1, s+1, -if) - \\ i\alpha_{2,0}(-if)\left(\frac{v_a}{2}\right)^2\left\{(-if)\left(\frac{1}{12}\right)\left[1 - \frac{1}{20}\left(\frac{v_a}{2}\right)^2\right] + \\ (-if)^2\left(\frac{2}{5!}\right)\right\} + \\ i\alpha_{4,0}(-if)\left(\frac{v_a}{2}\right)^2\left\{\frac{\frac{2}{5!}\left(\frac{v_a}{2}\right)^2}{(-if)\frac{2}{5!}\left[1 + \frac{1}{2}\left(\frac{v_a}{2}\right)^2\right] + (-if)^2\frac{1}{5!}}\right\} - \\ i\alpha_{6,0}(-if)^3\left(\frac{v_a}{2}\right)^2\left(\frac{6}{7!}\right) + \dots \end{bmatrix}$$

where $$a = \left(\frac{NA}{\lambda}\right)a_0, \quad (52)$$

$$v_a = v(r=a), \quad (53)$$

and M(a, c, x) is the confluent hypergeometric function given by the formula $$M(a, c, x) = \sum_{n=0}^{\infty}\frac{(a+n)!}{a!}\frac{c!}{(c+n)!}\frac{x^n}{n!}. \quad (54)$$

The special case of M(1,2,−if) can be expressed in terms of other functions as $$M(1, 2, -if) = e^{-if/2}\text{sinc}\left(\frac{f}{2}\right). \quad (55)$$

The complex spatial impulse response function $\overline{U}_2$ of the second beam at an image plane where the complex amplitude $A_2$ is uniform in the object plane and the aberrations are zero except for $\alpha_{0,0}$ is evaluated by the integration of the spatial impulse response function $U(r,\Phi,z)$ given by Eq. (31) over the object plane. The result is $$(1 + i\alpha_{0,0}) \int_{r=0}^{r=\infty} g_{0,0}(v, z) 2\pi \left(\frac{\lambda}{NA}\right) r\left(\frac{\lambda}{NA}\right) dr = \qquad (56)$$

$$\frac{1}{2\pi}\left(\frac{\lambda}{NA}\right)^2 (1 + i\alpha_{0,0})e^{-if}$$

or $$\overline{U}_2(z) = \frac{1}{\pi}\left(\frac{\lambda}{NA}\right)^2 (1 + i\alpha_{0,0})e^{iz}. \qquad (57)$$

Processing Measured Topographic Interference Signals: Determination of Changes in Optic Axis Location The determination of the optic axis location is based on the two-dimensional profile of a compensated topographic interference signal $S_c$. The determination of changes in the optic axis location may also be based on interferometric phase measurements of a measurement beam backscattered by exposure induced patterns in the recording medium such as described in cited U.S. Provisional Patent Application No. 60/624,707 (ZI-68) and in U.S. patent application Ser. No. 11/208,424 (ZI-68).

The center of the primary peak in the compensated topographic interference signal $S_c$ is determined from analysis of the properties of compensated topographic interference signal $S_c$. In the case where effects of aberrations of the PO are sufficiently large to generate an error in the location of the optic axis based on the analysis of properties of $S_c$, the effects of aberrations are compensated using measured properties of the aberrations determined by procedures subsequently described and the formalism presented herein in the subsection entitled "The Complex Amplitude U of a Point Spread Function."

Processing Topographic Interference Signals: Determination of Conjugate Image Plane Location$_z$ An important step in the inversion of a topographic interferometric signal for information about the optical system aberrations or pupil function is the determination of the conjugate image plane location z at which compensated topographic interference signal $S_c$ is recorded in the recording medium. For applications where the recording medium thickness is less than or of the order of the depth of focus of the optical system, the value of z may be determined from measured properties of a single compensated topographic interference signal $S_c$. For applications where the recording medium thickness is greater than the depth of focus of the optical system, the value of z is determined from an array of compensated topographic interference signals obtained from scans of the recording medium at different depths in the recording medium. The array of compensated topographic interference signals contains three-dimensional information about the imaging properties of the optical system in addition to the effects of scattering of the exposure beam in the recording medium.

The phase of the measured conjugated quadratures of compensated topographic interference signal $S_c$ at the determined optic axis location (see subsection herein entitled "Processing Measured Topographic Interference Signals: Determination of Optic Axis Location" is given by the difference of the phases of the complex spatial impulse response functions for $\tilde{U}_1(z)$ given be Eq. (50) and for $\tilde{U}_2$ (z) given by Eq. (57). The difference in phase $\phi_z$ is given in the lowest three orders by the formulae $$\tan(\varphi_z - f) = \qquad (58)$$

$$-\frac{f}{2}\left\{ 1 - \frac{1}{3!}\left[\left(\frac{v_a}{2}\right)^2 + 2\left(\frac{f}{2}\right)^2\right] - \alpha_{2,0}\left(\frac{f}{2}\right)\frac{1}{3}\left[1 - \frac{1}{20}\left(\frac{v_a}{2}\right)^2\right] + \alpha_{4,0}\left(\frac{f}{2}\right)\frac{1}{15}\left[1 - \frac{1}{2}\left(\frac{v_a}{2}\right)^2\right] + \ldots \right\} \times$$

$$\left\{ 1 - \left[\frac{1}{4}\left(\frac{v_a}{2}\right)^2 + \frac{2}{3}\left(\frac{f}{2}\right)^2\right] - \alpha_{2,0}\left(\frac{f}{2}\right)\frac{1}{3}\left[1 - \frac{2}{5}\left(\frac{f}{2}\right)^2\right] - \right.$$
$$\left. \alpha_{4,0}\left(\frac{f}{2}\right)\frac{1}{30}\left[\left(\frac{v_a}{2}\right)^2 + 2\left(\frac{f}{2}\right)^2\right] + \alpha_{6,0}\left(\frac{f}{2}\right)^3 \frac{1}{105} + \ldots \right\}^{-1},$$

$$\varphi_z = \left(\frac{f}{2}\right)\left\{ \begin{array}{l} 1 - \frac{1}{12}\left(\frac{v_a}{2}\right)^2 + \alpha_{2,0}\left(\frac{f}{2}\right)\frac{1}{45} \\ \left[\frac{7}{4}\left(\frac{v_a}{2}\right)^2 + 11\left(\frac{f}{2}\right)^2\right] - \alpha_{4,0} \\ \left(\frac{f}{2}\right)\frac{1}{15}\left[1 + \left(\frac{f}{2}\right)^2\right] + \alpha_{6,0}\left(\frac{f}{2}\right)^3 \frac{1}{105} + \ldots \end{array} \right\}, \qquad (59)$$

where second and higher order cross terms between aberration coefficients have been omitted.

For the case of an aberration free imaging system with NA=0.8 and using the relation given be Eq. (22), the value of $\phi_z$ in first, second, and third order based on the expansion of Eq. (59) is given by the formula $$\varphi_z = 1.26 \frac{Z}{\lambda}\left[1 - \frac{1}{12}\left(\frac{v_a}{2}\right)^2\right]. \qquad (60)$$

The $f^3$ term in the expansion of Eq. (58) cancels out. Another important property displayed by Eq. (60) is that the finite values of $v_a$ do not introduce a phase shift at the level of first order and at the level of third order, finite values of $v_a$ only alters the scale factor between $\phi_z$ and Z. Also note that the sensitivity of changes in $\phi_z$ corresponding to changes in Z increases as the value of NA is increased.

It is evident from inspection of Eq. (60) that embodiments of the present invention have a high sensitivity to displacements of the recording medium from the PO image plane, e.g., a displacement of $\lambda/10$ or 19 nm at the actinic wavelength of 193 nm will generate a phase shift of $$\phi_z = 0.13 \text{ rad}. \qquad (61)$$

A phase shift of this magnitude is a relatively large phase shift compared to the accuracy that can be achieved with interferometric techniques.

Certain aberrations of the imaging system may have amplitudes sufficiently large to introduce an error in the conversion of a measured $\phi_z$ to a change in Z that is larger than acceptable in an end use application.

Procedure to Enhance Detection Efficiency of Topographic Interferometric Signal

The detection efficiency of the effects of impulse response function, changes in optic axis location, and conjugate image plane location of an optical system may be increased in embodiments of the present invention by using an anti-reflecting (AR) layer 420 at the top surface of recording layer 410 such as shown diagrammatically in FIG. 4*a*. Layer 430 may also be an AR layer to reduce the effects of an exposing beam making multiple passes through the recording layer 410 and thus in conjunction with AR layer 420 improves the resolution that can be achieved in recording information in recording layer 410. AR layers 420 and 430 also eliminate the portion of the amplitude of measurement beam components of interferometer 10 that would otherwise be generated as reflected measurement beam components by AR layers 420 and 430. The elimination of the portion of the amplitude of the measurement beam components effectively converts interferometer 10 to an interferometer operating in a dark field mode at the wavelength of the exposure beam or actinic wavelength.

The description of and advantages of an interferometer operating in a dark field mode are the same as corresponding portions of the description given for differential interferometer systems given in cited commonly owned U.S. Pat. No. 5,760,901 (ZI-05); in commonly owned U.S. Provisional Patent Applications No. 60/447,254 (ZI-40) entitled "Transverse Differential Interferometric Confocal Microscopy" and No. 60/448,360 (ZI-41) entitled "Longitudinal Differential Interferometric Confocal Microscopy for Surface Profiling" and for dark field interferometer systems given in commonly owned U.S. Provisional Patent Application No. 60/448,250 (ZI-42) entitled "Thin Film Metrology Using Interferometric Confocal Microscopy;" and in commonly owned U.S. patent applications Ser. No. 10/778,371 (ZI-40) entitled "Transverse Differential Interferometric Confocal Microscopy," Ser. No. 10/782,057 (ZI-41) entitled "Longitudinal Differential Interferometric Confocal Microscopy for Surface Profiling," and Ser. No. 10/782,058 (ZI-42) entitled "Method And Apparatus For Dark Field Interferometric Confocal Microscopy" wherein each is by Henry A. Hill. The contents of the six applications are herein incorporated in their entirety by reference.

AR layers 420 and 430 can also be configured with different optical thicknesses of a non-absorbing type medium to enable enhancement of the detection efficiency of the topographic interferometric signal and still serve the purpose of AR layers to reduce the effects of an exposing beam making multiple passes through the recording layer 410. The optical thicknesses of AR layers 420 and 430 are designed to be >1, e.g., ~4 and ~2, respectively, so that there are two arrays of wavelengths at which the reflectivity of the respective interfaces are at low extremum values. The array of wavelengths for each of AR layers 420 and 430 include the actinic wavelength, i.e., the wavelength of the exposure beam. The optical thickness of AR layer 420 is also designed to be larger than the optical thickness of AR layer 430 such that the array of wavelengths for AR layer 430 is a subset of the array of wavelengths of AR layer 420, e.g., the elements of the array of wavelengths for AR layer 430 correspond to every second element of the array of wavelengths for AR layer 420. At the wavelengths of the remaining elements of the array of wavelengths for AR layer 420, the reflectivity of AR layer 430 is a relative large non-zero extremum.

The enhancement is enabled by selecting the wavelength of interferometer 10 of FIGS. 1a and 1b to coincide with one of the wavelengths of the remaining elements of the array of wavelengths for AR layer 420. Operating at one of the wavelengths of the remaining elements, the measurement beam of interferometer 10 is transmitted by AR layer 420 and makes a first pass through recording layer 410, a portion thereof is reflected with a relative large amplitude by AR layer 430 and the reflected portion thereof makes a second pass through recording layer 410, and the second pass beam is transmitted by AR layer 420. Thus the effect of exposure induced changes on the index of refraction of recording layer 410 can be measured with interferometer 10 effectively operating in a transmission mode with respect to recording layer 410 and with a reduced background signal generated by AR layer 420.

The detection efficiency of effects of the impulse response function, changes in optic axis location, and conjugate image plane location may also be increased in embodiments of the present invention by using a reflecting layer 432 at the interface between substrate 60 and recording layer 410 such as shown diagrammatically in FIG. 4b. Reflecting layer 432 increases the optical path in recording layer 410 of portions of a beam incident on recording layer 410 resulting increased exposure of recording layer 410. There is a reduced spatial resolution with respect to information recorded in recording layer 410 that accompanies the increase in detection efficiency.

The apparatus described in embodiments of the present invention comprise examples of either a pinhole confocal interference microscopy system or a slit confocal interference microscopy system. The background reduction capacity of a confocal microscopy system is one of its most important attributes and results from the strong optical sectioning property of confocal microscopy. This is of a completely different nature from the restricted depth of field in conventional microscopy, the difference being that in a conventional microscope out-of-focus information is merely blurred, whilst in the confocal system it is actually detected much less strongly: light scattered at some place axially separated from the focal plane is defocused at the detector plane and hence fails to pass efficiently through a mask placed there [cf. C. J. R. Sheppard and C. J. Cogswell, "Three-dimensional Imaging In Confocal Microscopy", *Confocal Microscopy*, edited by T. Wilson, (Academic Press, London), pp. 143-169 (1990)].

There are two useful modes of the non-fluorescent confocal scanning microscope [C. J. R. Sheppard, "Scanning Optical Microscopy", in: *Advances in Optical and Electron Microscopy*, 10, (Academic, London, 1987); C. J. R. Sheppard and A. Choudhury, *Optica Acta*, 24(10), pp. 1051-1073 (1977)]: the reflection-mode and the transmission-mode. In practice, it is easy to achieve with the confocal microscope the optical sectioning by scanning the object along the axial direction [such as described in cited U.S. Pat. No. 5,760,901 (ZI-05); C. J. R. Sheppard and C. J. Cogswell, *J. Microscopy*, 159(Pt 2), pp. 179-194 (1990); C. J. R. Sheppard and T. Wilson, *Optics Lett.*, 3, pp. 115-117 (1978); C. J. R. Sheppard, D. K. Hamilton, and I. J. Cox, *Proc. R. Soc. Lond.*, A 387, pp. 171-186 (1983)] and thus form three-dimensional images.

The information represented by the three-dimensional images of the exposure induced changes in the recording medium 410 obtained in embodiments of the present invention is derived from arrays of measured conjugated quadratures of scattered/reflected measurement beams. The phases of the arrays of measured conjugated quadratures contains information about the locations of changes in the exposure induced changes in the recording medium in the axial direction of interferometer 10 such as described in cited U.S. Pat. No. 5,760,901 (ZI-05). The axial direction may be normal to the surface of substrate 60 (see FIG. 2a herein) or at some oblique angle [see FIG. 1b of cited U.S. Provisional Patent Application No. 60/624,707 (ZI-68) and U.S. patent application Ser. No. 11/208,424 (ZI-68)].

The information about the profile of the exposure induced changes in the recording medium in the axial direction of interferometer 10 is obtained directly from the phases of the measured arrays of conjugated quadratures. The spatial wavelength of structure in the exposure induced changes in the axial direction that can be measured is greater than or of the order of $\lambda/2$ depending on the numerical aperture of interferometer 10.

The background may also be reduced in embodiments of the present invention by the use of phase shift arrays located in the pupil of the interferometer such as described in cited U.S. Pat. No. 5,760,901 (ZI-05).

Procedure to Enhance Detection Efficiency of Topographic Interference Signal: Spatial Heterodyne Technique The detection efficiency of the topographic interference signal in exposure induced changes in a recording medium may be increased in embodiments of the present invention by several orders of magnitude, e.g. 100, by the use of a spatial heterodyne technique wherein a spatially patterned recording medium is used for recording elements. The spatial heterodyne technique may be particularly valuable when using a metrology tool to detect the effects of impulse response function on the interference term in exposure induced changes in a recording medium when the resolution of the metrology tool is comparable to or less than the spatial wavelength of the high frequency spatial components of the exposure induced chances. Instead of using a first imaging system of a confocal imaging system to project a pattern on a substrate, the spatial heterodyne technique is used to translate high spatial frequency information in the recording medium to a lower spatial frequency that can be detected efficiently by an otherwise diffraction imaging system.

Interferometric Metrology Systems

The changes in properties of the recording medium that are exposure induced can be measured for example by measuring the changes in reflective of the changes in the top surface profile or topographic profile of the recording medium. FIG. 1a is a schematic diagram of an interferometric metrology system used to make measurements of conjugated quadratures of fields of beams scattered/reflected by a substrate.

The description of the interferometric metrology system shown in FIG. 1a is the same as the corresponding portion of the description given for the interferometer system shown in FIG. 1a of cited U.S. patent application Ser. No. 10/778,371 (ZI-40), incorporated herein by reference. The interferometer system is shown diagrammatically comprising an interferometer generally shown as numeral 10, a source 18, a beam-conditioner 22, detector 70, an electronic processor and controller 80, and a measurement object or substrate 60. Source 18 and beam-conditioner 22 generate input beam 24 comprising one or more frequency components. Source 18 is a pulsed source. Two or more of the frequency components of input beam 24 may be coextensive in space and may have the same temporal window function.

Reference and measurement beams are generated in interferometer 10 for each of the frequency components of beam 24. The measurement beam generated in interferometer 10 is one component of beam 28 and imaged in or on substrate 60 to form an array of pairs of spots. Beam 28 further comprises a return reflected/scattered measurement beam that is generated by the reflection/scattering or transmission of the measurement beam component of beam 28 by the array of pairs of spots in or on substrate 60. Interferometer 10 superimposes the two arrays of components of the return measurement beam corresponding to the two arrays components of beam 28 reflected/scattered or transmitted by the arrays of the pairs of spots to form a single array of superimposed images of return measurement beam components of beam 28. The return measurement beam components of beam 28 are subsequently combined with the reference beam in interferometer 10 to form output beam 32.

Output beam 32 is detected by detector 70 to generate an electrical interference signal 72. Detector 70 may comprise an analyzer to select common polarization states of the reference and return measurement beam components of beam 32 to form a mixed beam. Alternatively, interferometer 10 may comprise an analyzer to select common polarization states of the reference and return measurement beam components such that beam 32 is a mixed beam.

FIG. 1b is a schematic diagram of an interferometric non-confocal metrology system used to make measurements of conjugated quadratures of fields of beams scattered/reflected by a substrate. The description of the interferometric metrology system shown in FIG. 1b is the same as the corresponding portion of the description given for the non-confocal interferometer system shown in FIG. 1a of commonly owned U.S. patent application Ser. No. 10/954,625 (ZI-55) entitled "Method And Apparatus For Enhanced Resolution of High Spatial Frequency Components of Images using Standing Wave Beams in Non-Interferometric and Interferometric Microscopy" by Henry A. Hill of which the contents are herein incorporated in their entirety by reference. With reference to FIG. 1b, source 18 generates beam 20. Beam 20 is incident on and exits beam-conditioner 22 as input beam 24 that has two different frequency components for each polarization state or polarization component represented. Portions of the different frequency components of input beam 24 are spatially separated into two input beam components wherein each of the two spatially separated input beam components comprises a portion of each of the two different frequency components of each of the polarization states or polarization components represented. One of the two input beam components is split off by mirror 54A as measurement beam 24A and the other of the two input beam components is not incident on mirror 54A as reference beam 24B. The first and second portions corresponding to the two input beam components of input beam 24 have the same temporal window function. A standing wave measurement beam is generated at substrate 60 from measurement beam 24A by a combination of a beam-splitter and two mirrors as shown diagrammatically in FIG. 1b. The reference beam is incident on a beam combining element in interferometer 10 and may be a standing wave beam such as described for the measurement beam or a non-standing wave beam at the beam combining element.

Figure 2A:
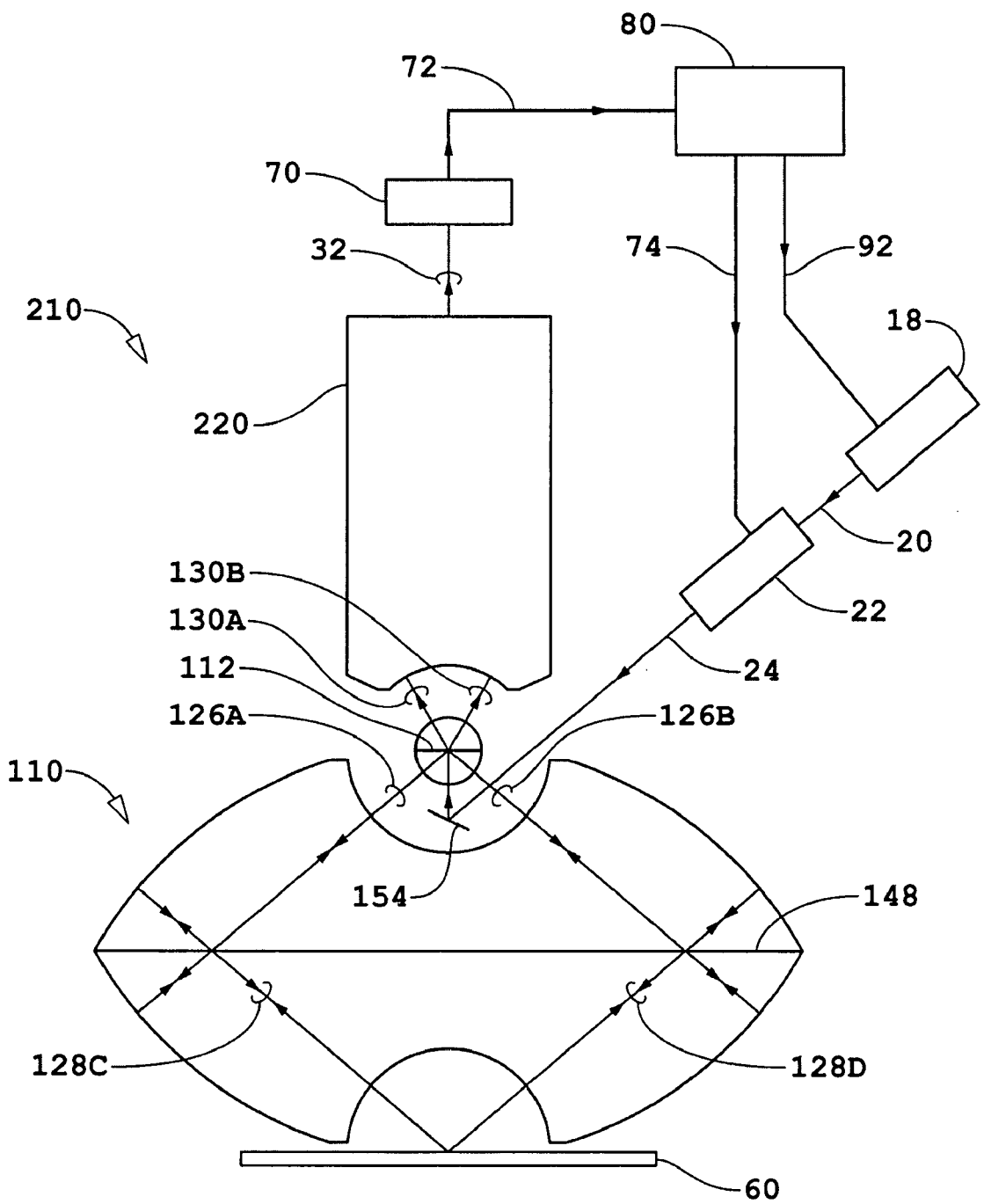
FIG. 2a is a schematic diagram of a confocal interferometric metrology system.

FIG. 2a is a schematic diagram of a confocal microscope system used in embodiments of the present invention for measuring properties of recording media that have exposure induced changes in properties. The description of the confocal microscope system shown in FIG. 2a is the same as the corresponding portion of the description given for the interferometer system shown in FIG. 2a of cited U.S. patent application Ser. No. 10/778,371 (ZI-40). Interferometer 10 comprises a catadioptric imaging system with catoptric imaging surfaces (generally indicated as numeral 110), pinhole array beam-splitter 112, detector 70, and a second imaging system generally indicated as numeral 210. The second imaging system 210 is low power microscope having a large working distance, e.g. Nikon ELWD and SLWD objectives and Olympus LWD, ULWD, and ELWD objectives. The first imaging system 110 comprises an interferometric confocal microscopy system described in part in commonly owned U.S. Provisional Patent Application No. 60/442,982 (ZI-45) entitled "Interferometric Confocal Microscopy Incorporating Pinhole Array Beam-Splitter" and U.S. patent application Ser. No. 10/765,229, filed Jan. 27, 2004 (ZI-45) and also entitled "Interferometric Confocal Microscopy Incorporating Pinhole Array Beam-Splitter" both of which are by Henry A. Hill. The contents of both of the U.S. Provisional Patent Application and the U.S. Patent Application are herein incorporated in their entirety by reference. Input beam 24 is reflected by mirror 154 to pinhole beam-splitter 112 where a first portion thereof is transmitted as reference beam components of output beam components 130A and 130B and a second portion thereof scattered as measurement beam components 126A and 126B. The measurement beam components of beam components 126A and 126B are imaged as measurement beam components of beam components 128A and 128B to an array of image spots in an image plane close to substrate 60.

Figure 2B:
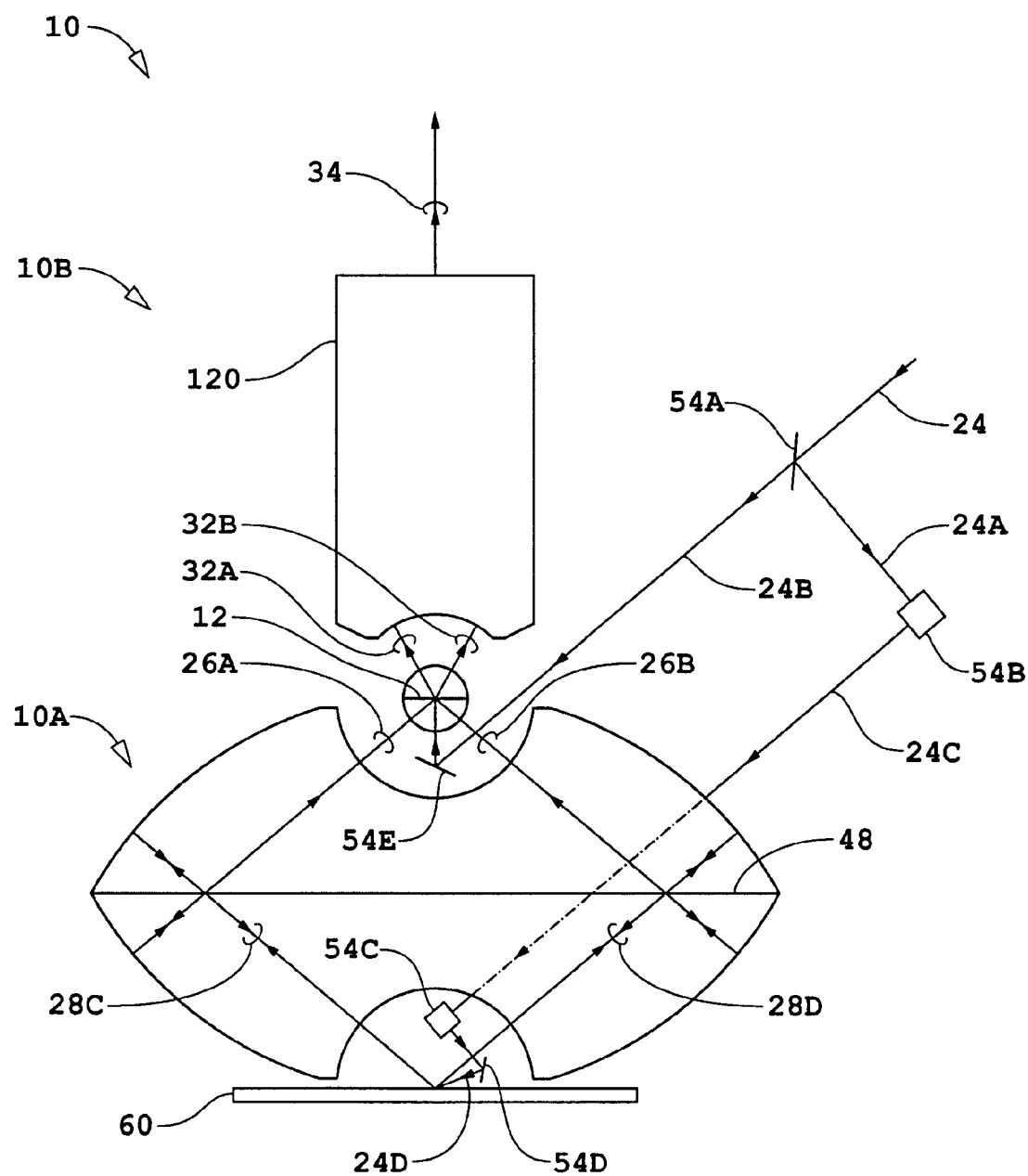
FIG. 2b is a schematic diagram of a non-confocal interferometric metrology system.

FIG. 2b a schematic diagram of a non-confocal microscope system used in embodiments of the present invention for measuring properties of recording media that have exposure induced changes in properties. The description of the confocal microscope system shown in FIG. 2b is the same as the corresponding portion of the description given for the interferometer system shown in FIG. 1b of cited commonly owned U.S. patent application Ser. No. 10/948,959 (ZI-56). Input beam 24 is incident on a non-polarizing beam-splitter 54A wherein a first portion thereof is reflected as a measurement beam 24A and a second portion of input beam 24 is incident on non-polarizing beam-splitter 54A is transmitted as reference beam 24B. Measurement beam 24A is incident on optical element 54B and exits as measurement beam 24C. Optical element 54B comprises two mirrors such beam 24C is displaced out of the plane of FIG. 1b and directed toward optical element 54C. Beam 24C exits optical element 54C as measurement beam 24D after reflection by mirror 54D. Optical element 54C comprises two mirrors such that the measurement beam that exits optical element 54D is in the plane of FIG. 2b and directed toward mirror 54D. Reference beam 24B is incident on thin fluorescent layer 12 after reflection by mirror 54E. When input beam 24 comprises non-coextensive reference and measurement beams, element 54A functions as mirror to reflect the measurement beam component of beam 24 as beam 24A and the reference beam component beam 24B of beam 24 is not incident on element 54A.

Other interferometric metrology systems such as described in commonly owned U.S. patent applications Ser. No. 10/886,157 (ZI-53) entitled "Apparatus and Method for Ellipsometric Measurements with High Spatial Resolution" and No. 10/938,408 (ZI-54) entitled "Method And Apparatus For Enhanced Resolution of High Spatial Frequency Components of Images using Standing Wave Beams in Non-Interferometric and Interferometric Microscopy;" in cited U.S. Provisional Patent Applications No. 60/568,774 (ZI-60), No. 60/569,807 (ZI-61), No. 60/573,196 (ZI-62), No. 60/571,967 (ZI-63), No. 60/602,999 (ZI-64), No. 60/618,483 (ZI-65), No. 60/624,707 (ZI-68), and No. 60/670,218 (ZI-66) and in U.S. patent applications Ser. No. 10/886,010 (ZI-52), Ser. No. 10/886,157 (ZI-53), Ser. No. 10/938,408 (ZI-54), Ser. No. 10/954,625 (ZI-55), Ser. No. 10/948,959 (ZI-56), Ser. No. 11/135,605 (ZI-62) Ser. No. 11/124,603 (ZI-63), and Ser. No. 11/208,424 (ZI-68) may be used in embodiments of the present invention without departing from the scope and spirit of implementations of embodiments of the present invention. The cited U.S. patent applications Ser. No. 10/886,157 (ZI-53) and Ser. No. 10/938,408 (ZI-54) are by Henry A. Hill the contents of which are herein incorporated in their entirety by reference.

Figure 5:
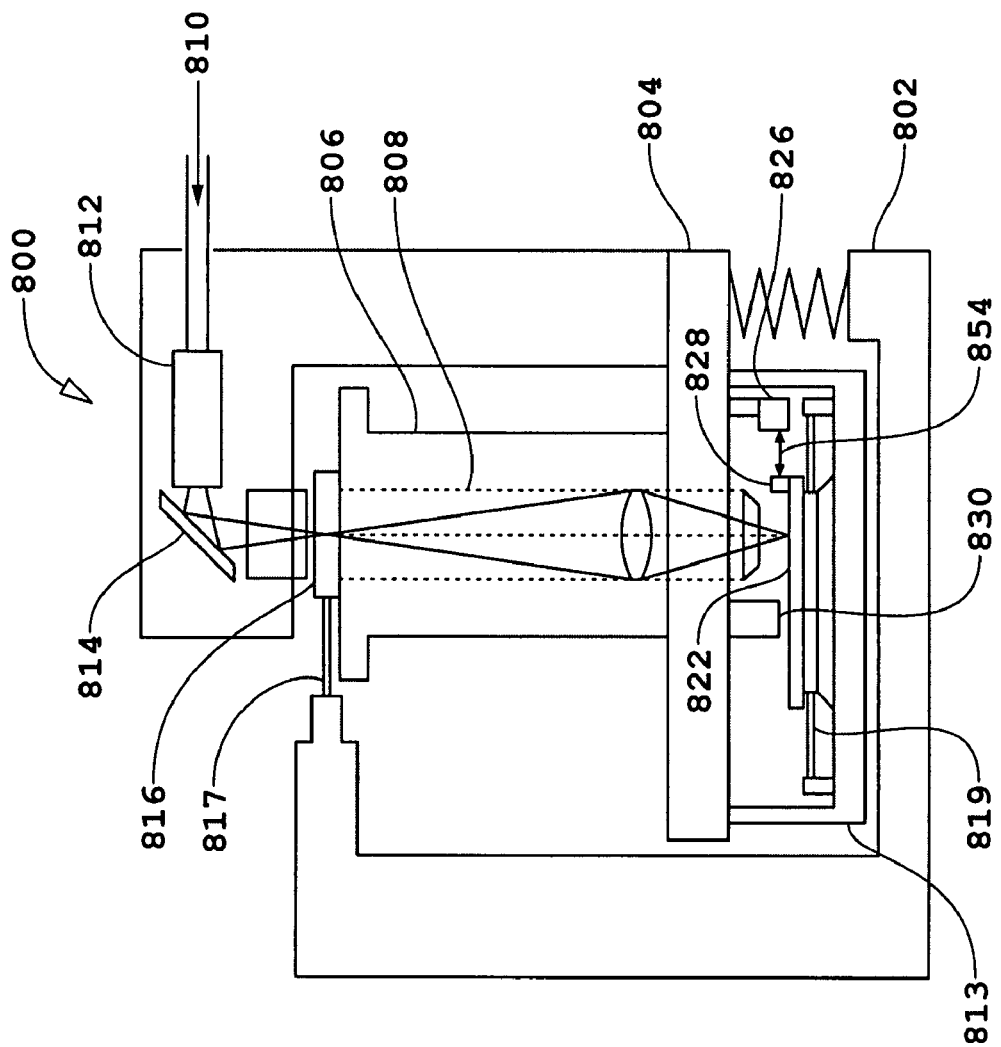
FIG. 5 is a diagram of lithography tool using a metrology system for measuring a spatial impulse response function, changes in optic axis, and conjugate image plane location.

An example of a lithography tool 800 using an optical system optic axis and/or optical system aberration metrology system 830 is shown in FIG. 5. The metrology system is used to precisely locate the optical system optic axis and/or measure the optical system aberrations within an exposure system. The description of the lithography tool 800 shown in FIG. 5 is the same as the corresponding portion of the description given for the lithography tool 800 shown in FIG. 7a of cited U.S. patent application Ser. No. 11/135,605 (ZI-62).

Figure 6:
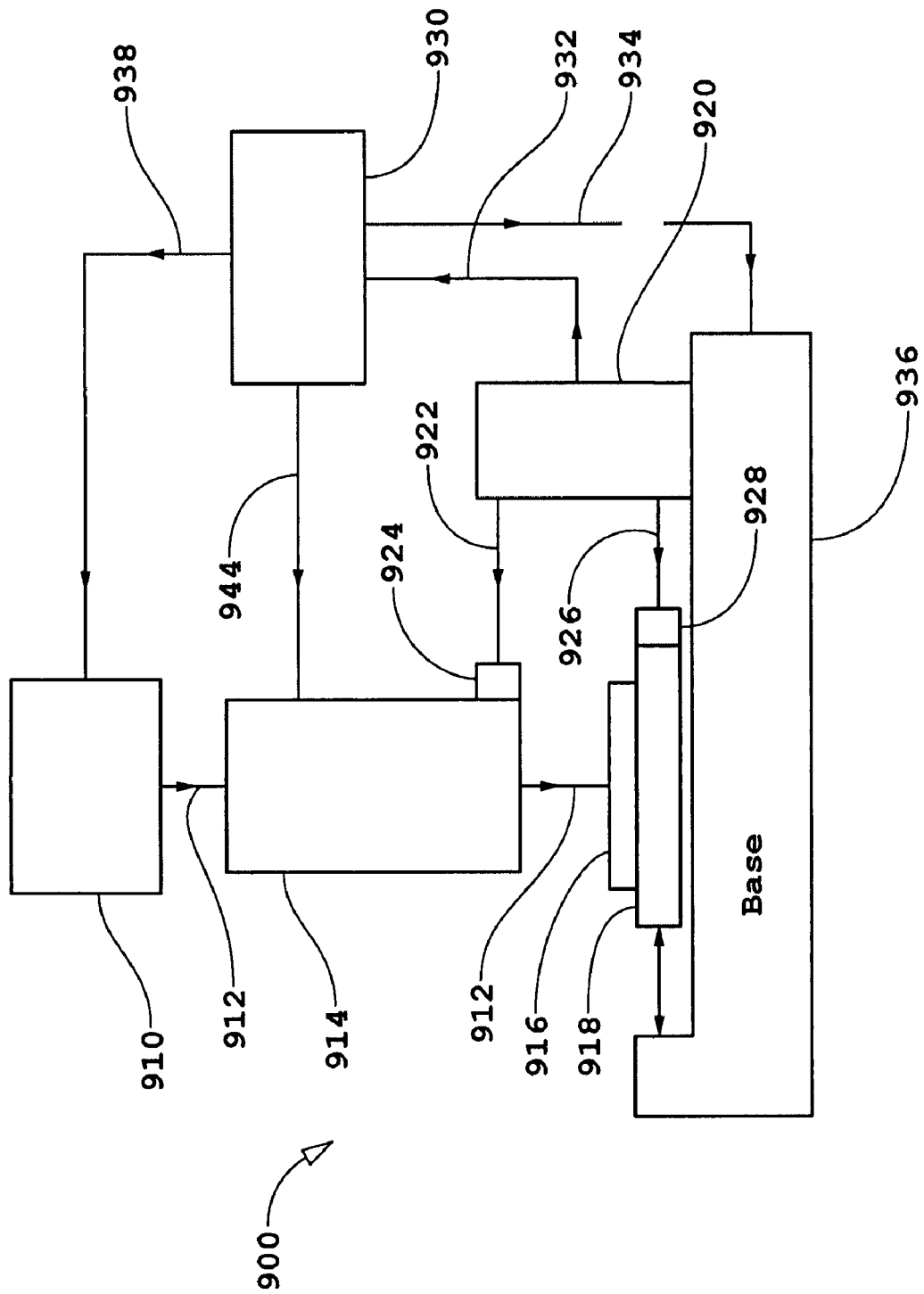
FIG. 6 is a schematic diagram of a wafer inspection system using a metrology system for measuring a spatial impulse response function, changes in optic axis, and conjugate image plane location.

A schematic of a wafer inspection system 900 using an optical system optic axis and/or optical system aberration metrology system (not shown) is shown in FIG. 6. The wafer inspection system is used to precisely locate the optical system optic axis and/or measure the optical system aberrations as recorded in exposure induced changes in a recording medium ex situ with or without post exposure treatment. The description of wafer inspection system 900 shown in FIG. 6 is the same as the corresponding portion of the description given for the wafer inspection system 900 shown in FIG. 8 of cited U.S. patent application Ser. No. 11/135,605 (ZI-62).

Other embodiments are within the following claims.

What is claimed is:

1. A test object comprising:
   an arrangement of optical elements defining a first partially reflecting surface and a second partially reflecting surface, at least one of said first and second partially reflecting surfaces being curved,
   wherein the first partially reflecting surface is arranged to receive a substantially collimated input beam and produce therefrom a first transmitted beam that passes on to the second partially reflecting surface,
   wherein the second partially reflecting surface is arranged to receive the first transmitted beam from the first partially reflecting surface and produce a collimated second transmitted beam and a first reflected beam therefrom,
   wherein the first partially reflecting surface is arranged to receive the first reflected beam and produce a second reflected beam therefrom, and
   wherein the first and second reflecting surfaces are configured to cause the second reflecting beam to converge onto a spot on a back surface to produce a diverging beam traveling in the same direction as the collimated output beam.

2. The test object of claim 1, wherein the arrangement of optical elements includes a first optical element and a second optical element, wherein the first optical element defines the first partially reflecting surface and the second optical element defines the second partially reflecting surface.

3. The test object of claim 1, wherein the first and second optical elements are aligned along an optical axis.

4. The test object of claim 2, wherein the back surface is a back surface of the second optical element.

5. The test object of claim 4, wherein the back surface includes a coating that defines a pinhole aperture and the spot onto which the second reflecting beam converges is located at the pinhole aperture.

6. The test object of claim 2, wherein the second optical element is a lens, one surface of which defines said back surface and another surface of which defines the second partially reflecting surface.

7. The test object of claim 6, wherein the second partially reflecting surface is curved.

8. The test object of claim 2, wherein the first optical element is a lens and wherein the first partially reflecting surface is a curved surface.

9. The test object of claim 2, wherein the first optical element is a plate and the first partially reflecting surface is flat.

10. The test object of claim 2, further comprising transducers controlling a separation between the first and second optical elements.

11. The test object of claim 5, wherein the pinhole aperture generates the diverging beam from the second beam that converges onto the spot.

12. The test object of claim 2, further comprising a negative lens next to the first optical element, wherein the negative lens produces the substantially collimated beam during use.

13. A source assembly comprising:
- a plate defining an aperture formed in a high reflectivity surface region;
- a curved lens aligned with the aperture to form a resonant cavity on one side of the plate;
- a collimating lens on a side of the plate that is opposite from the curved lens, the collimating lens for generating a collimated beam from a diverging beam emanating from the resonant cavity through the aperture during use; and
- a test object arranged to receive during use the collimated beam from the collimating lens and generate therefrom a collimated reference beam and a diverging measurement beam.

14. The source assembly of claim 13, wherein during use the aperture receives a non-collimated beam of a preselected wavelength and wherein the aperture has dimensions that are less than the preselected wavelength.

15. The source assembly of claim 13, wherein the plate defines an array of apertures formed in high reflectivity surface regions, wherein the first-mentioned aperture is a member of the array, said assembly further comprising:
- an array of curved lenses, each one aligned with a corresponding different aperture of the aperture array to form a corresponding resonant cavity on one side of the plate, wherein the first-mentioned curved lens is a member of the array of curved lenses;
- an array of collimating lenses on the side of the plate that is opposite from the array of curved lenses, each collimating lens of the array of collimating lenses aligned with a different corresponding aperture of the array of apertures and for generating a corresponding collimated beam from light emanating from the resonant cavity through the corresponding aperture, wherein the first-mentioned collimating lens is a member of the array of collimating lenses;
- an array of test objects, each of which is aligned with a different corresponding one of the collimating lenses of the array of collimating lenses and is arranged to receive the collimated beam from the corresponding collimating lens and generate therefrom a collimated reference beam and a diverging measurement beam, wherein the first-mentioned test object is a member of the array of test objects.

16. An interferometer comprising:
- a source for generating a source beam;
- an optical system;
- an optical element including a test object located in an object plane of the optical system, said test object including a diffraction point for generating from the source beam a measurement beam that passes through the optical system, wherein the optical element also generates from the source beam a reference beam that is combined with the measurement beam to generate an interference pattern in an image plane of the optical system, wherein the test object comprises:
  - an arrangement of optical elements defining a first partially reflecting surface and a second partially reflecting surface, at least one of said first and second partially reflecting surfaces being curved,
  - wherein the first partially reflecting surface is arranged to receive a substantially collimated input beam and produce therefrom a first transmitted beam that passes on to the second partially reflecting surface,
  - wherein the second partially reflecting surface is arranged to receive the first transmitted beam from the first partially reflecting surface and produce a collimated second transmitted beam and a first reflected beam therefrom,
  - wherein the first partially reflecting surface is arranged to receive the first reflected beam and produce a second reflected beam therefrom, and
  - wherein the first and second reflecting surfaces are configured to cause the second reflecting beam to converge onto a pinhole aperture on a back surface of the arrangement of optical elements to produce a diverging beam traveling in the same direction as the collimated output beam.

17. The interferometer of claim 16, wherein the arrangement of optical elements includes a first optical element and a second optical element, wherein the first optical element defines the first partially reflecting surface and the second optical element defines the second partially reflecting surface.

18. The interferometer of claim 16, wherein the first and second optical elements are aligned along an optical axis.

19. The interferometer of claim 17, wherein the back surface is a back surface of the second optical element.

20. The interferometer of claim 19, wherein the back surface includes a coating that defines the pinhole aperture and the spot onto which the second reflecting beam converges is located at the pinhole aperture.

21. The interferometer of claim 17, wherein the second optical element is a lens, one surface of which defines said back surface and another surface of which defines the second partially reflecting surface.

22. The interferometer of claim 21, wherein the second partially reflecting surface is curved.

23. The interferometer of claim 17, wherein the first optical element is a lens and wherein the first partially reflecting surface is a curved surface.

24. The interferometer of claim 17, wherein the first optical element is a plate and the first partially reflecting surface is flat.

25. The interferometer of claim 17, further comprising transducers controlling a separation between the first and second optical elements.

26. The interferometer of claim 17, wherein the pinhole aperture generates the diverging beam from the second beam that converges onto the spot.

27. The interferometer of claim 17, further comprising a negative lens next to the first optical element, wherein the negative lens produces the substantially collimated beam during use.

* * * * *